United States Patent
Tanaka et al.

(10) Patent No.: US 9,497,460 B2
(45) Date of Patent: Nov. 15, 2016

(54) IMAGE CODING METHOD AND IMAGE DECODING METHOD

(71) Applicant: Panasonic Corporation, Osaka (JP)

(72) Inventors: Takeshi Tanaka, Osaka (JP); Hisao Sasai, Osaka (JP)

(73) Assignee: SUN PATENT TRUST, New York, NY (US)

( * ) Notice: Subject to any disclaimer, the term of this patent is extended or adjusted under 35 U.S.C. 154(b) by 285 days.

(21) Appl. No.: 14/162,871

(22) Filed: Jan. 24, 2014

(65) Prior Publication Data

US 2014/0140413 A1 May 22, 2014

Related U.S. Application Data

(62) Division of application No. 13/148,957, filed as application No. PCT/JP2010/006077 on Oct. 13, 2010, now Pat. No. 8,718,149.

(30) Foreign Application Priority Data

Oct. 29, 2009 (JP) ................................. 2009-249538

(51) Int. Cl.
*H04N 19/91* (2014.01)
*H04N 19/46* (2014.01)
(Continued)

(52) U.S. Cl.
CPC ..... *H04N 19/00951* (2013.01); *H03M 7/4006* (2013.01); *H03M 7/4018* (2013.01);
(Continued)

(58) Field of Classification Search
None
See application file for complete search history.

(56) References Cited

U.S. PATENT DOCUMENTS 6,954,156 B2 10/2005 Kadono et al.
7,095,344 B2 8/2006 Sekiguchi et al.
(Continued)

FOREIGN PATENT DOCUMENTS

JP 01-192273 8/1989
JP 2004-007382 1/2004
(Continued)

OTHER PUBLICATIONS

International Search Report issued Dec. 7, 2010 in International (PCT) Application No. PCT/JP2010/006077.
(Continued)

*Primary Examiner* — Christopher S Kelley
*Assistant Examiner* — Kaitlin A Retallick
(74) *Attorney, Agent, or Firm* — Wenderoth, Lind & Ponack, L.L.P.

(57) ABSTRACT

An image coding method for improving coding efficiency by using more appropriate probability information is provided. The image coding method includes: a first coding step of coding a first set of blocks included in a first region sequentially based on first probability information; and a second coding step of coding a second set of blocks included in a second region sequentially based on second probability information. In the first coding step, the first probability information is updated depending on data of a target block to be coded, after coding the target block and before coding a next target block. In the second coding step, the second probability information is updated depending on the first probability information updated in the first coding step, before coding the first target block.

11 Claims, 54 Drawing Sheets

(51) Int. Cl.
  *H03M 7/40* (2006.01)
  *H04N 19/13* (2014.01)
  *H04N 19/61* (2014.01)
  *H04N 19/194* (2014.01)

(52) U.S. Cl.
  CPC ............ *H04N 19/13* (2014.11); *H04N 19/194* (2014.11); *H04N 19/46* (2014.11); *H04N 19/61* (2014.11); *H04N 19/91* (2014.11)

(56) References Cited

U.S. PATENT DOCUMENTS

| | | |
|---|---|---|
| 7,190,289 B2 | 3/2007 | Kobayashi et al. |
| 7,228,001 B2 | 6/2007 | Kobayashi et al. |
| 7,251,371 B2 | 7/2007 | Kobayashi et al. |
| 7,321,323 B2 | 1/2008 | Sekiguchi et al. |
| 7,388,526 B2 | 6/2008 | Sekiguchi et al. |
| 7,408,488 B2 | 8/2008 | Sekiguchi et al. |
| 7,518,537 B2 | 4/2009 | Sekiguchi et al. |
| 7,630,440 B2 | 12/2009 | Prakasam |
| 7,742,528 B2 | 6/2010 | Kondo et al. |
| 7,859,438 B2 | 12/2010 | Sekiguchi et al. |
| 7,928,869 B2 | 4/2011 | Sekiguchi et al. |
| 7,970,059 B2 | 6/2011 | Kondo et al. |
| 8,005,146 B2 | 8/2011 | Kondo et al. |
| 8,098,736 B2 | 1/2012 | Kondo et al. |
| 8,284,841 B2 | 10/2012 | Kondo et al. |
| 2004/0131269 A1 | 7/2004 | Kobayashi et al. |
| 2004/0131272 A1 | 7/2004 | Kobayashi et al. |
| 2004/0151252 A1 | 8/2004 | Sekiguchi et al. |
| 2004/0184544 A1 | 9/2004 | Kondo et al. |
| 2004/0268329 A1 | 12/2004 | Prakasam |
| 2005/0012647 A1 | 1/2005 | Kadono et al. |
| 2005/0146451 A1 | 7/2005 | Kobayashi et al. |
| 2005/0243920 A1* | 11/2005 | Murakami ............ H04N 19/44 375/240.12 |
| 2006/0109149 A1 | 5/2006 | Sekiguchi et al. |
| 2006/0232454 A1* | 10/2006 | Cha ........................ H04N 19/13 341/51 |
| 2007/0205927 A1 | 9/2007 | Sekiguchi et al. |
| 2007/0263723 A1 | 11/2007 | Sekiguchi et al. |
| 2008/0001796 A1 | 1/2008 | Oshikiri et al. |
| 2008/0056375 A1 | 3/2008 | Kondo et al. |
| 2008/0158027 A1 | 7/2008 | Sekiguchi et al. |
| 2008/0232476 A1 | 9/2008 | Jeon et al. |
| 2009/0153378 A1 | 6/2009 | Sekiguchi et al. |
| 2009/0245349 A1* | 10/2009 | Zhao ...................... H04N 19/70 375/240.03 |
| 2010/0020876 A1 | 1/2010 | Jeon et al. |
| 2010/0150464 A1 | 6/2010 | Kondo et al. |
| 2010/0158485 A1 | 6/2010 | Kondo et al. |
| 2010/0315270 A1 | 12/2010 | Sekiguchi et al. |
| 2011/0095922 A1 | 4/2011 | Sekiguchi et al. |
| 2011/0102210 A1 | 5/2011 | Sekiguchi et al. |
| 2011/0102213 A1 | 5/2011 | Sekiguchi et al. |
| 2011/0115656 A1 | 5/2011 | Sekiguchi et al. |
| 2011/0243245 A1 | 10/2011 | Kondo et al. |
| 2011/0317769 A1 | 12/2011 | Tanaka et al. |
| 2012/0177129 A1 | 7/2012 | Sole et al. |
| 2012/0328027 A1 | 12/2012 | Kondo et al. |
| 2014/0140412 A1 | 5/2014 | Tanaka et al. |

FOREIGN PATENT DOCUMENTS

| | | |
|---|---|---|
| JP | 2005-347780 | 12/2005 |
| JP | 2008-011204 | 1/2008 |
| JP | 2009-510807 | 3/2009 |
| JP | 5805281 | 9/2015 |
| WO | 03/043345 | 5/2003 |
| WO | 03/043346 | 5/2003 |
| WO | 2007/129433 | 11/2007 |
| WO | 2009/119888 | 10/2009 |

OTHER PUBLICATIONS

Xun Guo et al., Ordered Entropy Slices for Parallel CABAC, ITU-Telecommunications Standardization Sector Study Group 16 Question 6 Video Coding Experts Group (VCEG), 37th Meeting: Yokohama, Japan, Apr. 2009, VCEG-AK25_r1, pp. 1-8.

ITU—T H. 264 Standard, Advanced video coding for generic audiovisual services 9. Parsing Process, published Mar. 2005.

Thomas Wiegand et al., "Overview of the H.264/AVC Video Coding Standard", IEEE Transactions on Circuits and Systems for Video Technology, Jul. 2003, pp. 1-19.

Xun Guo et al., "Ordered Entropy Slices for Parallel CABAC", [online], ITU-T Video Coding Experts Group, Apr. 15, 2009, [searched on Oct. 28, 2009], Internet <wftp3.itu.int/av-arch/video-site/0904#Yok/VCEG-AK25.zip (VCEG-AK25.doc)>.

New Results using Entropy Slices for Parallel Entropy Decoding, Sharp, Andrew Segall et al., VCEG-A132 VCEG 35th Meeting, Berlin, Germany, Jul. 2008.

Massively Parallel CABAC, Texas Instruments/Massachusetts Institute of Technology, Vivienne Sze et al., VCEG-AL21 VCEG 38th Meeting London, UK/Geneva, CH, Jul. 2009.

Ma et al., "High-definition Video Coding with Super-macroblocks," Visual Communications and Image Processing, SPIE, Jan. 29, 2007, Conference vol. 6508, pp. 1-12.

* cited by examiner

FIG. 4

| Index ctxIdx | Occurrence Probability pStateIdx | Symbol valMPS |
|---|---|---|
| 0 | 12 | 1 |
| 1 | 7 | 0 |
| 2 | 41 | 0 |
| 3 | 22 | 1 |
| 4 | 10 | 1 |
| 5 | 8 | 0 |
| 6 | 50 | 1 |
| ⋮ | ⋮ | ⋮ |

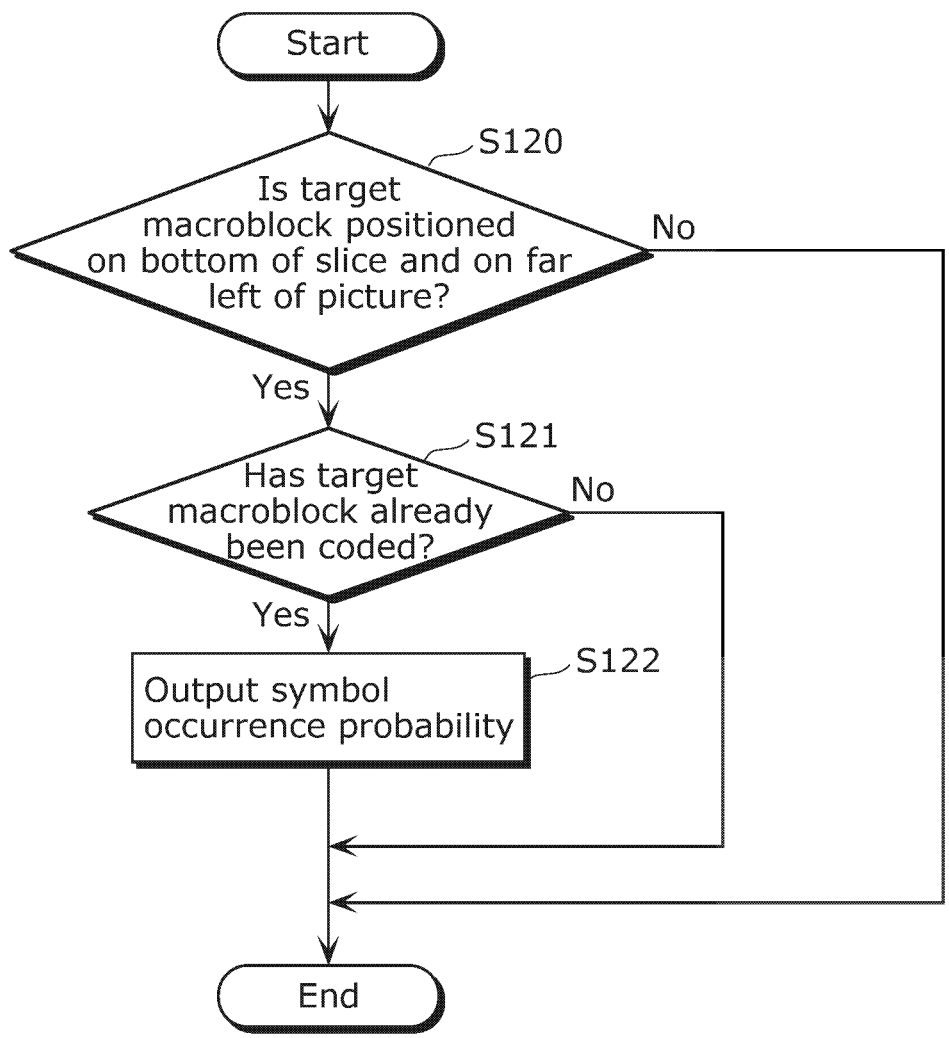

A: Initialization of Symbol Occurrence Probability Table
B: Outputting of Symbol Occurrence Probability Table
C: Inputting of Symbol Occurrence Probability Table Slice

| 0 | 1 | 3 | 6 | 9 | | | | | | | | |
|---|---|---|---|---|---|---|---|---|---|---|---|---|
| 2 | 4 | 7 | | | | | | | | | | |
| 5 | 8 | | | | | | | | | | | |

Far Left of Picture

B : Outputting of Symbol Occurrence Probability Table
C : Inputting of Symbol Occurrence Probability Table Far Left of Picture B : Outputting of Symbol Occurrence Probability Table
C : Inputting of Symbol Occurrence Probability Table

FIG. 15A
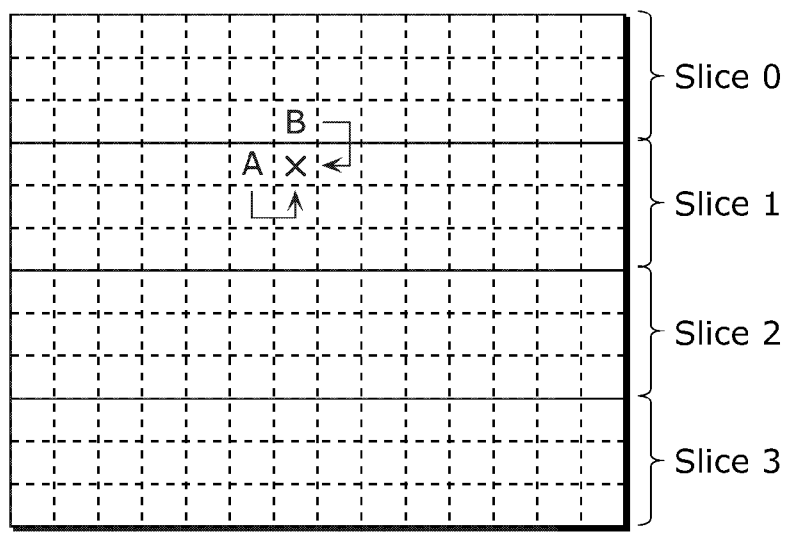
FIG. 15B
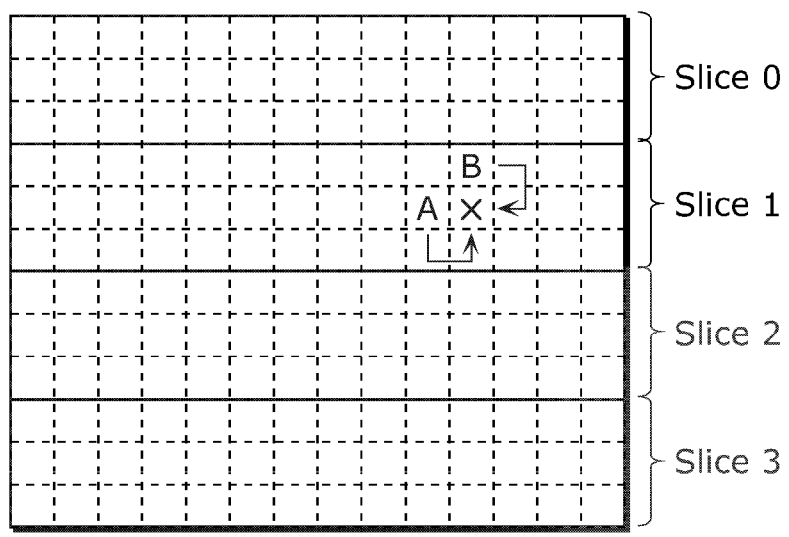
FIG. 15C

A、B : Outputting of Symbol Occurrence Probability Table
X : Inputting of Symbol Occurrence Probability Table FIG. 17A
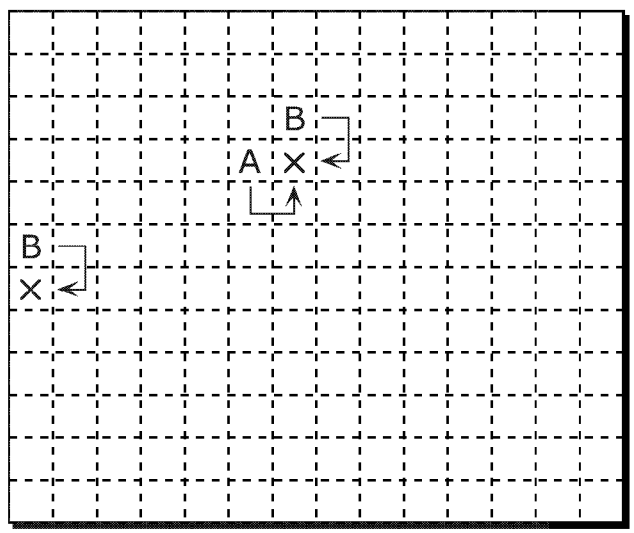
FIG. 17B
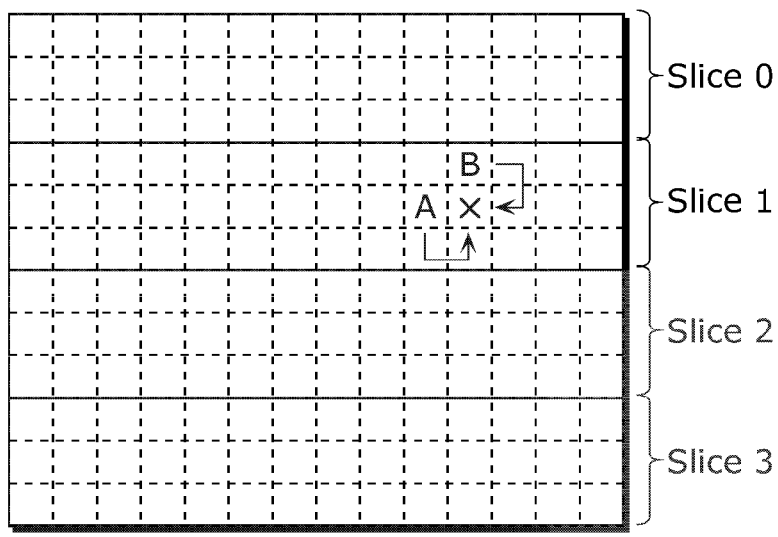
FIG. 17C A、B :Outputting of Symbol Occurrence Probability Table
X :Calculation of Symbol Occurrence Probability Table A、B :Outputting of Symbol Occurrence Probability Table
X :Calculation of Symbol Occurrence Probability Table A、B :Outputting of Symbol Occurrence Probability Table
X :Calculation of Symbol Occurrence Probability Table A、B :Outputting of Symbol Occurrence Probability Table
X :Calculation of Symbol Occurrence Probability Table Picture ▨ macroblocks each of which is to be coded based on symbol occurrence probability table of immediately-above macroblock mvp = median(mvA , mvB, mvC)
mv = mvp + mvd mvp : prediction motion vector value
mvd : differential motion vector in stream FIG. 53A - PRIOR ART
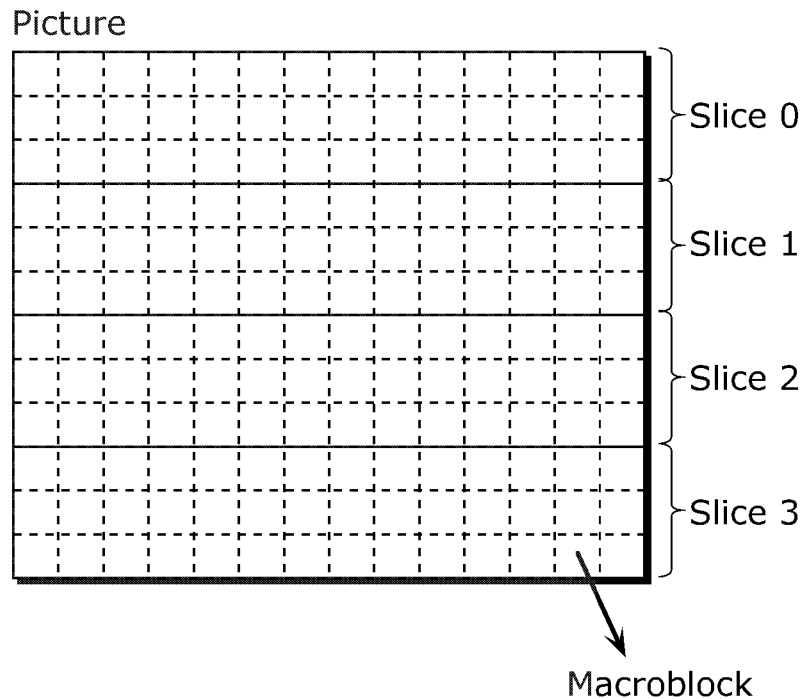
FIG. 53B - PRIOR ART
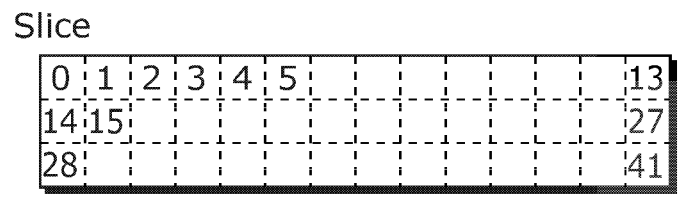
FIG. 53C - PRIOR ART
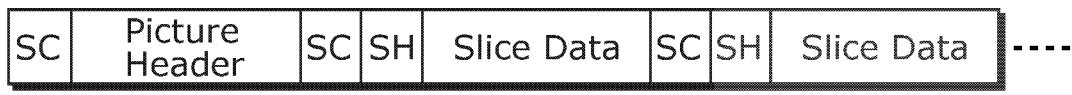
SC: Start Code
SH: Slice Header

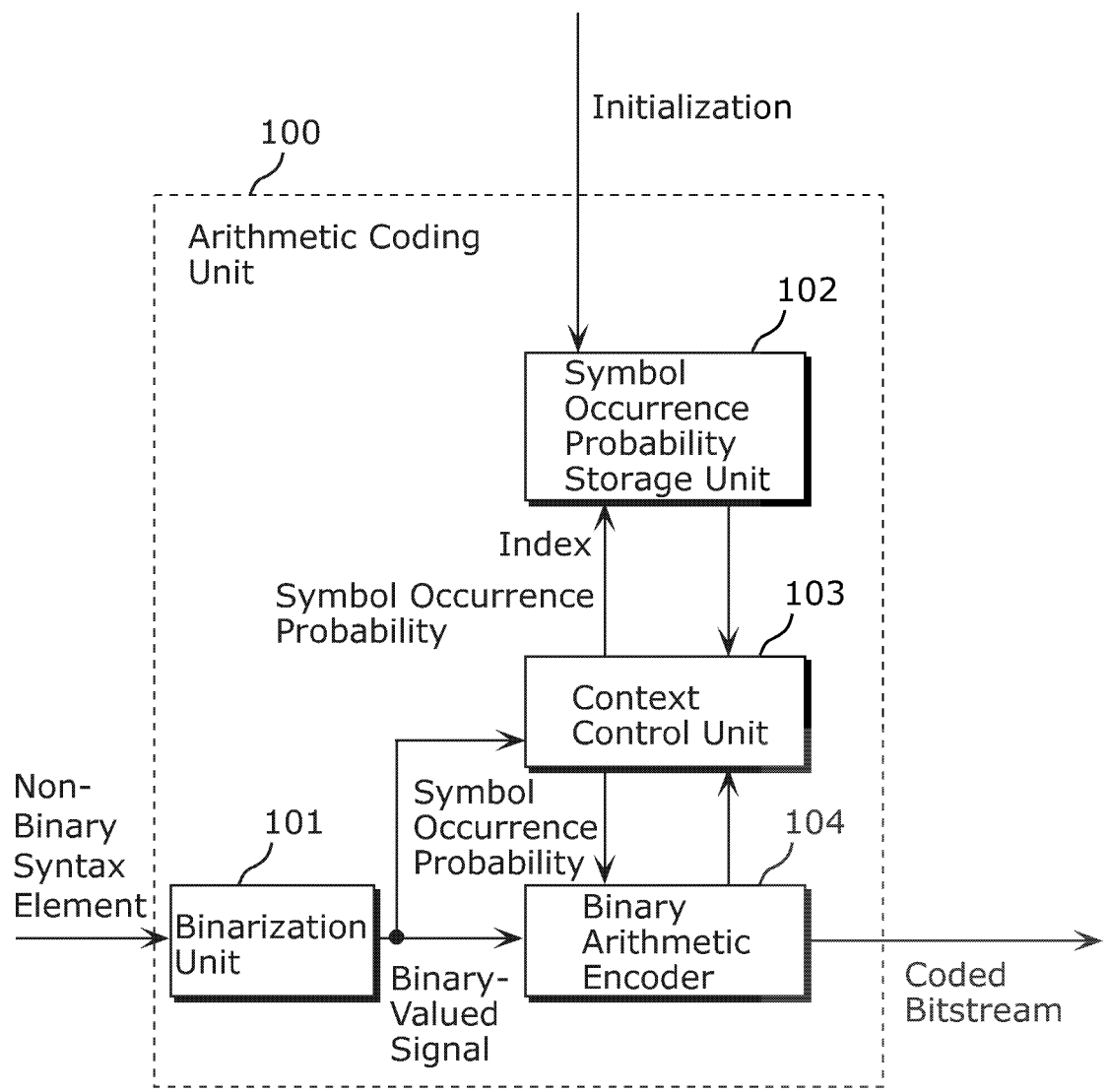
FIG. 54 - PRIOR ART

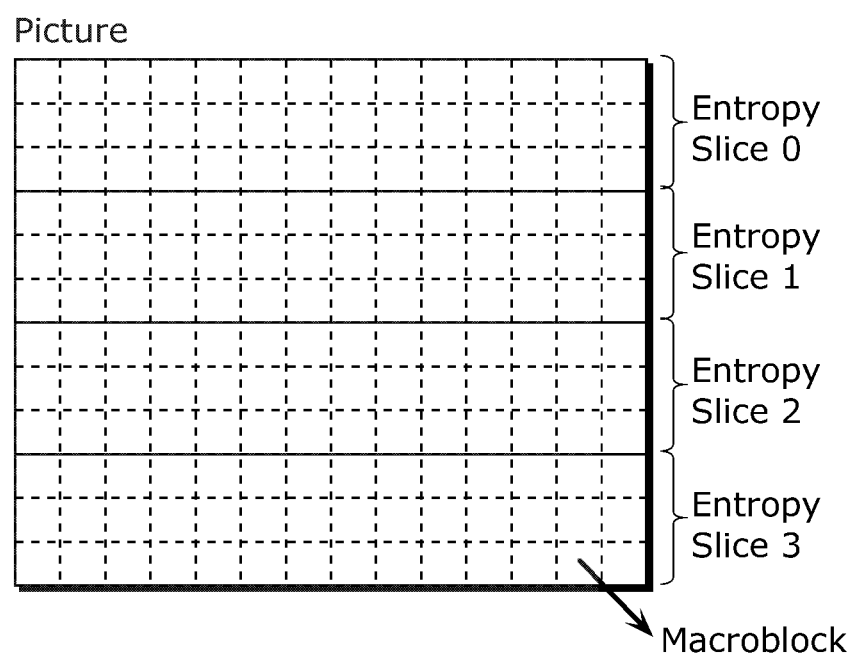
FIG. 55A - PRIOR ART
FIG. 55B - PRIOR ART

IMAGE CODING METHOD AND IMAGE DECODING METHOD

This application is a Divisional application of U.S. application Ser. No. 13/148,957, which is the U.S. National Stage of International Application PCT/JP2010/006077, filed Oct. 13, 2010, which claims priority to Japanese application JP 2009-249538, filed Oct. 29, 2009, the disclosures of which are all hereby incorporated by reference in their entirety.

TECHNICAL FIELD

The present invention relates to image coding methods of coding image including a plurality of blocks.

BACKGROUND ART

Conventional image coding devices for coding video divide each picture in video into macroblocks each having 16 pixels×16 pixels, and code the macroblocks. The image coding devices eventually generate a coded scream that is compressed by the video coding. Conventional image decoding devices decode the coded stream on a macroblock-by-macroblock basis to reproduce each picture in the video.

One of such conventional image coding methods is International Telecommunication Union Telecommunication Standardization Sector (ITU-T) H.264 standard (hereinafter, referred to as "H.264 standard") (for example, see Non-Patent Reference 1 and Non-Patent Reference 2). As shown in FIG. 53A, an image coding device according to H.264 standard divides a picture into slices, then further divides a slice into macroblocks having 16 pixels×16 pixels, and eventually codes the macroblocks. As shown in FIG. 53B, macroblocks in each slice are coded in raster order from left to right. In addition, as shown in FIG. 53C, each slice is assigned with a start code.

An image decoding device finds such start codes from a coded stream. Thereby, the image decoding device can easily detect the beginning of each slice and start decoding it. It is noted that there is no information reference relationship between the slices. The image decoding device can therefore decode the slices independently from one another.

One of variable length coding methods defined in H.264 standard is context adaptive binary arithmetic coding (CABAC: hereinafter, referred to simply as "arithmetic coding"). FIG. 54 shows a block diagram of an arithmetic coding unit that codes image using the arithmetic coding defined by H.264.

The arithmetic coding unit 100 shown in FIG. 54 initializes, at the beginning of a target slice, a symbol occurrence probability stored in a symbol occurrence probability storage unit 102 in the arithmetic coding unit 100, by using one of predetermined three values. Updating a table of the symbol occurrence probability (probability table), the arithmetic coding unit 100 arithmetic-codes each slice according to an occurrence probability of a code in each syntax of the slice. The arithmetic coding unit 100 updates the probability table to be appropriate for target image. As a result, it is possible to improve coding efficiency.

Non-binary syntax elements are firstly binarized by a binarization unit 101 in the arithmetic coding unit 100. Next, according to information of neighboring macroblock(s) (neighbor information) and binary-valued signal data of a target macroblock, a context control unit 103 in the arithmetic coding unit 100 generates an index to be used to select a symbol occurrence probability from the symbol occurrence probability storage unit 102. Then, based on the index, the context control unit 103 reads an occurrence probability of binary-valued signal from the symbol occurrence probability storage unit 102.

A binary arithmetic encoder 104 in the arithmetic coding unit 100 arithmetic-codes the binary-valued signal using the obtained occurrence probability. The context control unit 103 overwrites the symbol occurrence probability resulting from the arithmetic coding into the symbol occurrence probability storage unit 102. Thereby, the symbol occurrence probability is updated.

The above-described image coding device using arithmetic coding can offer high coding efficiency. However, the image coding device needs to code macroblocks, which have been divided from image, in raster order by keeping updating the probability table. Therefore, the above-described image coding device used to fail parallel image coding. As a result, the conventional image coding device has a difficulty in improving performance, besides a difficulty in improving operation frequency.

In order to address the drawbacks, some conventional image coding devices divide image into slices to perform parallel image coding. In this case, such image coding devices cannot use spatial correlation between the slices. Therefore, coding efficiency is deteriorated. It is also noted in FIG. 53B that a macroblock 13 is spatially far from a macroblock 14. Therefore, a symbol occurrence probability of the macroblock 13 would be significantly different from a symbol occurrence probability of the macroblock 14. Even under the situation, the image coding device codes the macroblocks in raster order. In raster order, the image coding device should code the macroblock 14 based on the symbol occurrence probability of the macroblock 13. As a result, coding efficiency is deteriorated.

Among techniques conceived as image coding methods for the next generation, there is a technique addressing the above problems (see Non-Patent Reference 3). As shown in FIG. 55A, Non-Patent Reference 3 discloses a technique where a picture is divided into slices called "entropy slices". The entropy slices can be referred to by one another. More specifically, a macroblock in such a slice can refer to a macroblock in another slice beyond a border between the slices.

The use of the entropy slices allows an image coding device to refer to information of a neighboring macroblock beyond a slice border when motion vector coding or intra-picture prediction is performed. Thereby, the image coding device can improve coding efficiency using spatial correlation.

Moreover, if the slices are coded in the order shown in FIG. 55B, processing efficiency is improved. For example, the order in FIG. 55B allows the lowest macroblock 5 in a slice 0 adjacent to a slice 1 to be coded earlier than the situation of using the raster order in FIG. 53B. In other words, the order in FIG. 55B enables the image coding device to refer to the slice 0 earlier to code the slice 1. As a result, processing efficiency in parallel processing is improved.

PRIOR ART

[Non-Patent References]

Non-Patent Reference 1: "ITU-T H.264 Standard, Advanced video coding for generic audiovisual services 9. Parsing Process, published on March 2005

Non-Patent Reference 2: Thomas Wiegand et al., "Overview of the H.264/AVC Video Coding Standard", IEEE TRANSACTIONS ON CIRCUITS AND SYSTEMS FOR VIDEO TECHNOLOGY, July 2003, pp. 1-19

Non-Patent Reference 3: Xun Guo et al., "Ordered Entropy Slices for Parallel CABAC", [online], ITU-T Video Coding Experts Group, Apr. 15, 2009, [searched on Oct. 28, 2009], Internet <URL: http://wftp3.itu.int/av-arch/video-site/0904#Yok/VCEG-AK25.zip (VCEG-AK25.doc)>

However, Non-Patent Reference 3 discloses in Chapter 2.2 that a probability table used in arithmetic coding is initialized at the beginning of each entropy slice. Therefore, the probability table is not updated appropriately for a target picture. As a result, coding efficiency is deteriorated.

In addition, the coding performed according to H.264 standard described in Non-Patent References 1 and 2 has the problem as described earlier. That is, a target macroblock is coded in raster order by using a symbol occurrence probability of a macroblock that is positioned far from the target macroblock. In the above situation, coding efficiency is deteriorated.

SUMMARY OF THE INVENTION

In order to address the problems of the conventional techniques, an object of the present invention is to provide an image coding method for improving coding efficiency using more appropriate probability information.

In accordance with an aspect of the present invention for achieving the object, there is provided an image coding method of coding an image having a plurality of regions each including a plurality of blocks, the image coding method including: coding a first set of blocks included in a first region of the regions sequentially based on first probability information indicating a data occurrence probability; and coding a second set of blocks included in a second region of the regions sequentially based on second probability information indicating a data occurrence probability, the second region being different from the first region, wherein, in the coding of the first set of blocks, the first probability information is updated depending on data of a first target block to be coded among the first set of blocks, after coding the first target block and before coding a second target block to be coded next among the first set of blocks, in the coding of the second set of blocks, the second probability information is updated depending on data of a third target block to be coded among the second set of blocks, after coding the third target block and before coding a fourth target block to be coded next among the second set of blocks, and in the coding of the second set of blocks, the second probability information is further updated depending on the first probability information updated in the coding of the first set of blocks, before coding a fifth target block to be coded first among the second set of blocks.

Thereby, at the beginning of each of the regions in the image (in other words, when the first image in each of the regions in the image is to be coded), the probability information to be used in coding is updated depending on characteristics of the image. As a result, coding efficiency is improved.

It is possible that in the coding of the first set of blocks, the first set of blocks are sequentially arithmetic-coded based on the first probability information, and that in the coding of the second set of blocks, the second set of blocks are sequentially arithmetic-coded based on the second probability information.

Thereby, in the arithmetic coding for coding images based on probabilities, coding efficiency is improved.

It is further possible that, in the coding of the first set of blocks, the first set of blocks are sequentially coded based on the first probability information, the first set of blocks being macroblocks included in the first region that is a slice, and that in the coding of the second set of blocks, the second set of blocks are sequentially coded based on the second probability information, the second set of blocks being macroblocks included in the second region that is a slice.

Thereby, at the beginning of each slice in the image (in other words, when the first image in each of the regions in the image is to be coded), the probability information to be used in coding is updated depending on characteristics of the image. In other words, the same probability information is used for a plurality of slices. Then, macroblocks included in a slice are coded based on updated probability information. As a result, coding efficiency is improved.

It is still further possible that, in the coding of the second set of blocks, the second probability information is updated depending on the first probability information before coding the fifth target block, the first probability information having been updated in the coding of the first set of blocks depending on the data of the first target block immediately above the fifth target block.

Thereby, the first block in each of the regions is coded based on probability information updated depending on a block that is immediately above the first block and is spatially close to the first block. As a result, coding efficiency is further improved.

It is still further possible that in the coding of the first set of blocks, sub-blocks included in each of the first set of blocks are sequentially coded based on the first probability information, that in the coding of the second set of blocks, sub-blocks included in each of the second set of blocks are sequentially coded based on the second probability information, that in the coding of the first set of blocks, the first probability information is further updated depending on data of a first target sub-block to be coded among a first set of sub-blocks included in the first target block, after coding the first target sub-block and before coding a second target sub-block to be coded next among the first set of sub-blocks, that in the coding of the second set of blocks, the second probability information is further updated depending on data of a third target sub-block to be coded among a second set of sub-blocks included in the fifth target block, after coding the third target sub-block and before coding a fourth target sub-block to be coded next among the second set of sub-blocks, and that in the coding of the second set of blocks, the second probability information is further updated depending on the first probability information before coding a fifth target sub-block to be coded first among the second set of sub-blocks, the first probability information having being updated in the coding of the first set of blocks depending on the data of the first target sub-block that is spatially closest to the fifth target sub-block among the first set of sub-blocks.

Thereby, the first sub-block in each of the regions is coded based on probability information updated depending on a sub-block that is spatially close to the first sub-block. As a result, coding efficiency is further improved.

In accordance with another aspect of the present invention, there is provided an image coding method of coding an image having a plurality of blocks, the image coding method including coding the blocks sequentially based on probability information indicating a data occurrence probability, wherein, in the coding, the probability information is updated depending on data of a first target block to be coded among the blocks, after coding the first target block and before coding a second target block to be coded next among the blocks, and in the coding, a third target block in the blocks to be coded among the blocks is coded based on the probability information updated depending on the data of the first target block that is a neighboring block above the third target block, the third target block being different from the second target block and being coded after coding the first target block.

Thereby, a target block is coded based on probability information updated depending on a neighboring block that is above the first block and that is spatially close to the target block. As a result, coding efficiency is further improved.

It is possible that, in the coding, the blocks are sequentially arithmetic-coded based on the probability information.

Thereby, in the arithmetic coding for coding images based on probabilities, coding efficiency is improved.

It is further possible that in the coding, the blocks are sequentially coded on a line-by-line basis in a horizontal direction from left to right, wherein, after coding a block on far right of a line, a block on far left of a next line immediately below the line is coded.

As a result, the blocks are coded in raster order. In the above case, a target block is coded based on probability information updated depending on a neighboring block above the target block. As a result, coding efficiency is further improved.

It is still further possible that, in the coding, the third target block is coded based on the probability information, the probability information having been updated depending on the data of the first target block immediately above the third target block.

Thereby, a target block is coded based on probability information updated depending on a block that is immediately above the target block and is spatially close to the target block. As a result, coding efficiency is further improved.

It is still further possible that, in the coding, the third target block is coded based on the probability information, the probability information having been updated depending on the data of the first target block at the immediate upper left of the third target block.

Thereby, a target block is coded based on probability information updated depending on a block that is at the immediate upper left of the target block and is coded prior to the target block. As a result, a processing speed is increased.

It is still further possible that, in the coding, sub-blocks included in each of the blocks are sequentially coded based on the probability information, that in the coding, the probability information is further updated depending on data of a first target sub-block to be coded among a first set of sub-blocks included in the first target block, after coding the first target sub-block and before coding a second target sub-block to be coded next among the first set of sub-blocks, and that in the coding, a third target block is coded based on the probability information, the third target block being to be coded first among a second set of sub-blocks included in the third target block, and the probability information having been updated depending on the data of the first target sub-block that is spatially closest to the third target sub-block among the first set of sub-blocks.

Thereby, a target sub-block is coded based on probability information updated depending on a sub-block that is spatially close to the target sub-block. As a result, coding efficiency is further improved.

It is still further possible that, in the coding, the probability information is further updated depending on data of a fourth target block on the immediate left of the third target block among the blocks, after coding the fourth target block and before coding the third target block, that the image coding method further including calculating, from first probability information and second probability information, the probability information used in the coding of the third target block, the first probability information being the probability information updated depending on the data of the first target block in the coding, and the second probability information being the probability information updated depending on the data of the fourth target block in the coding, and that in the coding, the third target block is coded based on the probability information calculated in the calculating.

Thereby, a target block is coded depending on plural pieces of probability information. As a result, coding efficiency is further improved.

It is still further possible that, in the coding, sub-blocks included in each of the blocks are sequentially coded based on the probability information, that in the coding, the probability information is further updated depending on data of a first target sub-block to be coded among a first set of sub-blocks included in the first target block, after coding the first target sub-block and before coding a second target sub-block to be coded next among the first set of sub-blocks, that in the coding, the probability information is further updated depending on data of a third target sub-block to be coded among a second set of sub-blocks included in the fourth target block, after coding the third target sub-block and before coding a fourth target sub-block to be coded next among the second set of sub-blocks, that in the calculating, the probability information is calculated from the first probability information and the second probability information, the probability information being to be used in coding of a fifth target sub-block to be coded first among a third set of sub-blocks included in the third target block, the first probability information being the probability information updated in the coding depending on the data of the first target sub-block that is spatially closest to the fifth target sub-block among the first set of sub-blocks, and the second probability information being the probability information updated in the coding depending on the data of the third target sub-block that is spatially closest to the fifth target sub-block among the second set of sub-blocks, and that in the coding, the fifth target sub-block is coded based on the probability information calculated in the calculating.

Thereby, a target sub-block is coded based on plural pieces of probability information updated depending on sub-blocks that are spatially close to the target sub-block. As a result, coding efficiency is further improved.

It is still further possible that, in the calculating, the probability information to be used in coding of the fifth target sub-block is calculated by weighting the first probability information and the second probability information according to (a) a spatial distance from the fifth target sub-block to the first target sub-block and (b) a spatial distance from the fifth target sub-block to the third target sub-block.

Thereby, the probability information is calculated by being weighted depending on the distances. A target sub-block is therefore coded based on more-accurate probability information. As a result, coding efficiency is further improved.

It is still further possible that, in the coding, the third target block is coded based on the probability information updated depending on data of the first target block when predetermined condition is satisfied, and the third target block is coded based on the probability information updated depending on data of a target block immediately prior to the third target block when the predetermined condition is not satisfied.

Thereby, a target block is coded based on probability information updated depending on a neighboring block above the target block, only in the restricted case. As a result, the number of pieces of stored probability information is decreased.

In accordance with still another aspect of the present invention, there is provided an image decoding method of decoding an image having a plurality of regions each including a plurality of blocks, the image decoding method including: decoding a first set of blocks included in a first region of the regions sequentially based on first probability information indicating a data occurrence probability; and decoding a second set of blocks included in a second region of the regions sequentially based on second probability information indicating a data occurrence probability, the second region being different from the first region, wherein, in the decoding of the first set of blocks, the first probability information is updated depending on data of a first target block to be decoded among the first set of blocks, after decoding the first target block and before decoding a second target block to be decoded next among the first set of blocks, in the decoding of the second set of blocks, the second probability information is updated depending on data of a third target block to be decoded among the second set of blocks, after decoding the third target block and before decoding a fourth target block to be decoded next among the second set of blocks, and in the decoding of the second set of blocks, the second probability information is further updated depending on the first probability information updated in the decoding of the first set of blocks, before decoding a fifth target block to be decoded first among the second set of blocks.

Thereby, at the beginning of each of the regions in the image (in other words, when the first image in each of the regions in the image is to be decoded), the probability information to be used in decoding is updated depending on characteristics of the image. Therefore, the image coded in the same manner is decoded.

In accordance with still another aspect of the present invention, there is provided an image decoding method of decoding an image having a plurality of blocks, the image decoding method including decoding the blocks sequentially based on probability information indicating a data occurrence probability, wherein, in the decoding, the probability information is updated depending on data of a first target block to be decoded among the blocks, after decoding the first target block and before decoding a second target block to be decoded next among the blocks, and in the decoding, a third target block in the blocks is decoded based on the probability information updated depending on the data of the first target block that is a neighboring block above the third target block, the third target block being different from the second target block and being to be decoded after decoding the first target block.

Thereby, a target block is decoded based on probability information updated depending on a neighboring block that is above the target block and that is spatially close to the target block. Therefore, the image coded in the same manner is decoded.

In accordance with still another aspect of the present invention, there is provided an image coding device that codes an image having a plurality of regions each including a plurality of blocks, the image coding device including: a first coding unit configured to code a first set of blocks included in a first region of the regions sequentially based on first probability information indicating a data occurrence probability; and a second coding unit configured to code a second set of blocks included in a second region of the regions sequentially based on second probability information indicating a data occurrence probability, the second region being different from the first region, wherein the first coding unit is further configured to update the first probability information depending on data of a first target block to be coded among the first set of blocks, after coding the first target block and before coding a second target block to be coded next among the first set of blocks, the second coding unit is further configured to update the second probability information depending on data of a third target block to be coded among the second set of blocks, after coding the third target block and before coding a fourth target block to be coded next among the second set of blocks, and the second coding unit is further configured to update the second probability information depending on the first probability information updated in the coding of the first set of blocks, before coding a fifth target block to be coded first among the second set of blocks.

With the above structure, the image coding device according to the aspect of the present invention can update probability information to be used in coding, at the beginning of each of the regions in the image (in other words, when the first image in each of the regions in the image is to be coded). As a result, coding efficiency is improved.

In accordance with still another aspect of the present invention, there is provided an image coding device that codes an image having a plurality of blocks, the image coding device including a coding unit configured to code the blocks sequentially based on probability information indicating a data occurrence probability, wherein the coding unit is further configured to update the probability information depending on data of a first target block to be coded among the blocks, after coding the first target block and before coding a second target block to be coded next among the blocks, and the coding unit is configured to code a third target block in the blocks to be coded among the blocks, based on the probability information updated depending on the data of the first target block that is a neighboring block above the third target block, the third target block being different from the second target block and being coded after coding the first target block.

With the above structure, the image coding device according to the aspect of the present invention can code a target block based on probability information updated depending on a neighboring block that is above the target block and that is spatially close to the target block. As a result, coding efficiency is further improved.

In accordance with still another aspect of the present invention, there is provided an image decoding device that decodes an image having a plurality of regions each including a plurality of blocks, the image decoding device including: a first decoding unit configured to decode a first set of blocks included in a first region of the regions sequentially based on first probability information indicating a data occurrence probability; and a second decoding unit configured to decode a second set of blocks included in a second region of the regions sequentially based on second probability information indicating a data occurrence probability, the second region being different from the first region, wherein the first decoding unit is further configured to update the first probability information depending on data of a first target block to be decoded among the first set of blocks, after decoding the first target block and before decoding a second target block to be decoded next among the first set of blocks, the second decoding unit is configured to update the second probability information depending on data of a third target block to be decoded among the second set of blocks, after decoding the third target block and before decoding a fourth target block to be decoded next among the second set of blocks, and the second decoding unit is further configured to update the second probability information depending on the first probability information updated in the decoding of the first set of blocks, before decoding a fifth target block to be decoded first among the second set of blocks.

With the above structure, the image decoding device according to the aspect of the present invention can update probability information to be used in decoding depending on characteristics of the image, at the beginning of each of the regions in the image (in other words, when the first image in each of the regions in the image is to be decoded). Therefore, the image coded in the same manner can be decoded.

In accordance with still another aspect of the present invention, there is provided an image decoding device that decodes an image having a plurality of blocks, the image decoding device including a decoding unit configured to decode the blocks sequentially based on probability information indicating a data occurrence probability, wherein the decoding unit is further configured to update the probability information depending on data of a first target block to be decoded among the blocks, after decoding the first target block and before decoding a second target block to be decoded next among the blocks, and the decoding unit is configured to decode a third target block in the blocks based on the probability information updated depending on the data of the first target block that is a neighboring block above the third target block, the third target block being different from the second target block and being to be decoded after decoding the first target block.

With the above structure, the image decoding device according to the aspect of the present invention can decode a target block based on probability information updated depending on a neighboring block that is above the target block and that is spatially close to the target block. Therefore, the image coded in the same manner can be decoded.

In accordance with still another aspect of the present invention, there is provided an integrated circuit that codes an image having a plurality of regions each including a plurality of blocks, the integrated circuit including: a first coding unit configured to code a first set of blocks included in a first region of the regions sequentially based on first probability information indicating a data occurrence probability; and a second coding unit configured to code a second set of blocks included in a second region of the regions sequentially based on second probability information indicating a data occurrence probability, the second region being different from the first region, wherein the first coding unit is further configured to update the first probability information depending on data of a first target block to be coded among the first set of blocks, after coding the first target block and before coding a second target block to be coded next among the first set of blocks, the second coding unit is further configured to update the second probability information depending on data of a third target block to be coded among the second set of blocks, after coding the third target block and before coding a fourth target block to be coded next among the second set of blocks, and the second coding unit is further configured to update the second probability information depending on the first probability information updated in the coding of the first set of blocks, before coding a fifth target block to be coded first among the second set of blocks.

With the above structure, the integrated circuit according to the aspect of the present invention can update probability information to be used in coding depending on characteristics of the image, at the beginning of each of the regions in the image (in other words, when the first image in each of the regions in the image is to be coded). As a result, coding efficiency is improved.

In accordance with still another aspect of the present invention, there is provided an integrated circuit that codes an image having a plurality of blocks, the integrated circuit including a coding unit configured to code the blocks sequentially based on probability information indicating a data occurrence probability, wherein the coding unit is further configured to update the probability information depending on data of a first target block to be coded among the blocks, after coding the first target block and before coding a second target block to be coded next among the blocks, and the coding unit is configured to code a third target block in the blocks to be coded among the blocks, based on the probability information updated depending on the data of the first target block that is a neighboring block above the third target block, the third target block being different from the second target block and being coded after coding the first target block.

With the above structure, the integrated circuit according to the aspect of the present invention can code a target block based on probability information updated depending on a neighboring block that is above the target block and that is spatially close to the target block. As a result, coding efficiency is further improved.

In accordance with still another aspect of the present invention, there is provided an integrated circuit that decodes an image having a plurality of regions each including a plurality of blocks, the integrated circuit including: a first decoding unit configured to decode a first set of blocks included in a first region of the regions sequentially based on first probability information indicating a data occurrence probability; and a second decoding unit configured to decode a second set of blocks included in a second region of the regions sequentially based on second probability information indicating a data occurrence probability, the second region being different from the first region, wherein the first decoding unit is further configured to update the first probability information depending on data of a first target block to be decoded among the first set of blocks, after decoding the first target block and before decoding a second target block to be decoded next among the first set of blocks, the second decoding unit is configured to update the second probability information depending on data of a third target block to be decoded among the second set of blocks, after decoding the third target block and before decoding a fourth target block to be decoded next among the second set of blocks, and the second decoding unit is further configured to update the second probability information depending on the first probability information updated in the decoding of the first set of blocks, before decoding a fifth target block to be decoded first among the second set of blocks.

With the above structure, the integrated circuit according to the aspect of the present invention can update probability information to be used in decoding depending on characteristics of the image, at the beginning of each of the regions in the image (in other words, when the first image in each of the regions in the image is to be decoded). Therefore, the integrated circuit can decode the image coded in the same manner.

In accordance with still another aspect of the present invention, there is provided an integrated circuit that decodes an image having a plurality of blocks, the integrated circuit including a decoding unit configured to decode the blocks sequentially based on probability information indicating a data occurrence probability, wherein the decoding unit is further configured to update the probability information depending on data of a first target block to be decoded among the blocks, after decoding the first target block and before decoding a second target block to be decoded next among the blocks, and the decoding unit is configured to decode a third target block in the blocks based on the probability information updated depending on the data of the first target block that is a neighboring block above the third target block, the third target block being different from the second target block and being to be decoded after decoding the first target block.

With the above structure, the integrated circuit according to the aspect of the present invention can decode a target block based on probability information updated depending on a neighboring block that is above the target block and that is spatially close to the target block. Therefore, the integrated circuit can decode the image coded in the same manner.

According to the present invention, more appropriate probability information is used to improve coding efficiency.

BRIEF DESCRIPTION OF DRAWINGS

FIG. 4 is an explanatory table of a symbol occurrence probability table according to the first embodiment of the present invention.

FIG. 6 is a flowchart of symbol occurrence probability outputting according to the first embodiment of the present invention.

FIG. 15A is a conceptual diagram showing processing performed by an image coding device according to the third embodiment of the present invention.

FIG. 15B is a conceptual diagram showing processing performed by the image coding device according to the third embodiment of the present invention.

FIG. 15C is a conceptual diagram showing processing performed by the image coding device according to the third embodiment of the present invention.

FIG. 17A is a conceptual diagram showing processing performed by the image coding device according to the third embodiment of the present invention.

FIG. 17B is a conceptual diagram showing processing performed by the image coding device according to the third embodiment of the present invention.

FIG. 17C is a conceptual diagram showing processing performed by the image coding device according to the third embodiment of the present invention.

FIG. 53A is a conceptual diagram showing image according to the conventional technique.

FIG. 53B is a conceptual diagram showing slices according to the conventional technique.

FIG. 53C is a conceptual diagram showing a stream according to the conventional technique.

FIG. 54 is a block diagram showing a structure of an arithmetic coding unit according to the conventional technique.

FIG. 55A is a conceptual diagram showing image according to the conventional technique.

FIG. 55B is a conceptual diagram showing slices according to the conventional technique.

DETAILED DESCRIPTION OF THE INVENTION

The following describes image coding devices according to embodiments of the present invention with reference to the drawings.

First Embodiment

First, the description is given for a summary of an image coding device according to the first embodiment of the present invention. The image coding device according to the first embodiment divides a picture into slices and permits the slices to refer to each other. The image coding device according to the first embodiment adopts, at the beginning of each slice, a symbol occurrence probability table of a neighboring macroblock of the first macroblock in the slice. Thereby, the image coding device according to the first embodiment can use the symbol occurrence probability table appropriate for a target image (macroblock). Therefore, it is possible to improve coding efficiency.

This is the summary of the image coding device according to the first embodiment.

Figure 1:
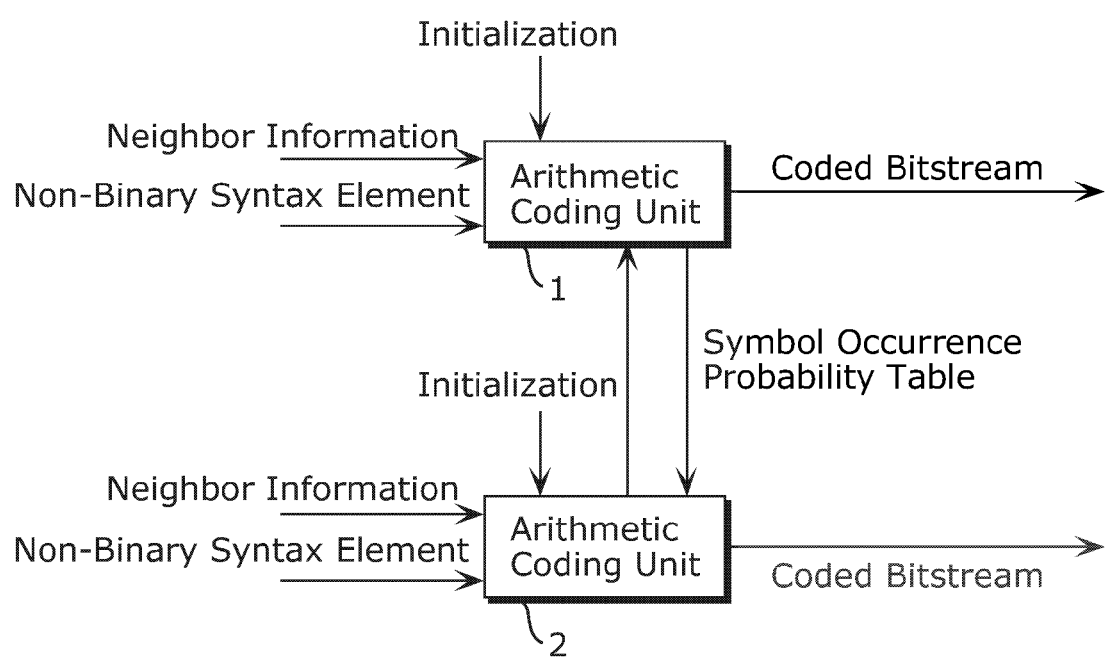
FIG. 1 is a block diagram showing a structure of an image coding device according to a first embodiment of the present invention.

The following describes a structure of the image coding device according to the first embodiment. FIG. 1 is a block diagram showing the structure of the image coding device according to the first embodiment. The image coding device according to the first embodiment includes an arithmetic coding unit 1 and an arithmetic coding unit 2.

Figure 2:
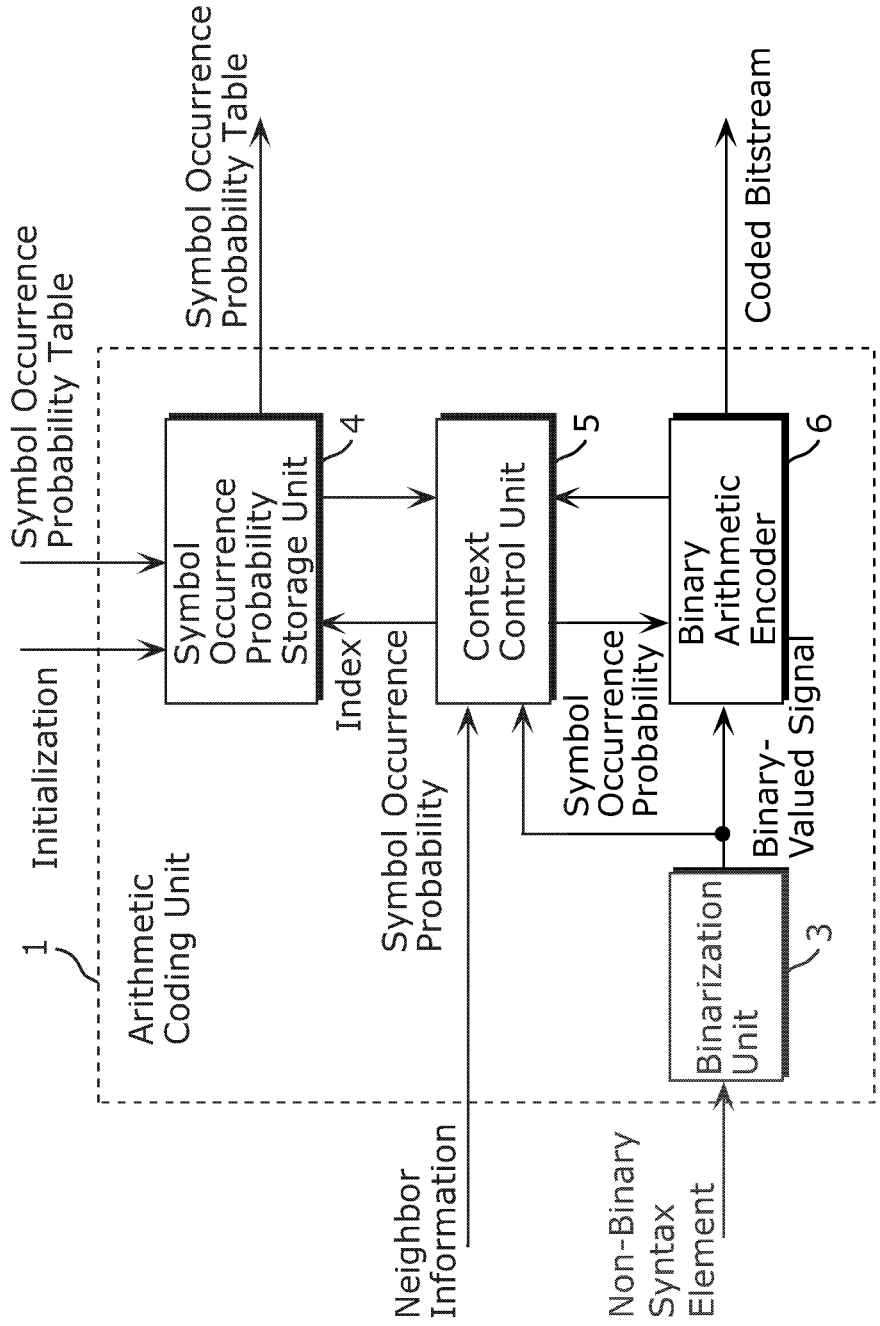
FIG. 2 is a block diagram showing a structure of an arithmetic coding unit according to the first embodiment of the present invention.

FIG. 2 is a block diagram showing a structure of the arithmetic coding unit 1 shown in FIG. 1 The arithmetic coding unit 1 includes a binarization unit 3, a symbol occurrence probability storage unit 4, a context control unit 5, and a binary arithmetic encoder 6.

The binarization unit 3 performs binarization of (binarizes) non-binary syntax elements. The symbol occurrence probability storage unit 4 stores probabilities of occurrence of symbols (symbol occurrence probabilities). The context control unit 5 determines which symbol occurrence probability is to be used among the symbol occurrence probabilities stored in the symbol occurrence probability storage unit 4. Then, the context control unit 5 reads the determined symbol occurrence probability from the symbol occurrence probability storage unit 4. The binary arithmetic encoder 6 performs arithmetic coding based on the symbol occurrence probability provided from the context control unit 5. The arithmetic coding unit 2 has the same structure as that of the arithmetic coding unit 1. Therefore, the structure of the arithmetic coding unit 2 will not be explained.

This is the description of the structure of the image coding device according to the first embodiment.

Figure 3:
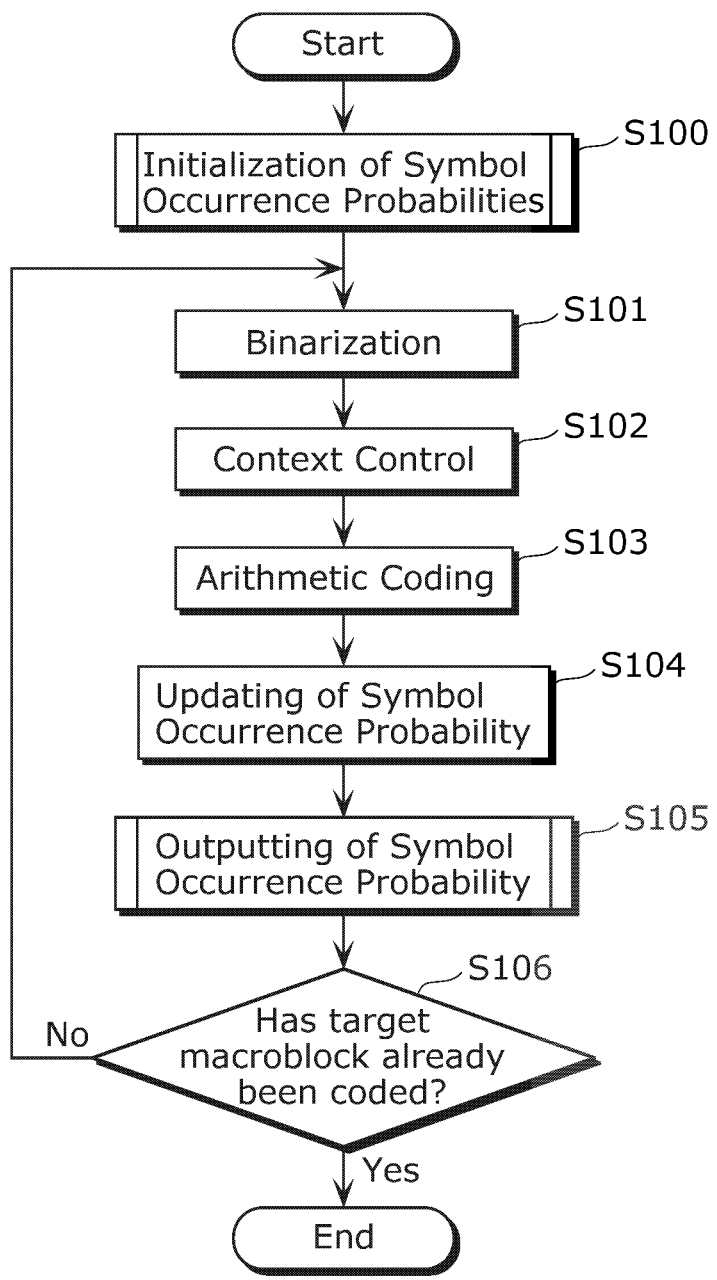
FIG. 3 is a flowchart of processing performed by the arithmetic coding unit according to the first embodiment of the present invention.

The following describes processing performed by the image coding device shown in FIGS. 1 and 2 with reference to a flowchart of FIG. 3. FIG. 3 shows coding of one macroblock. The description will be given mainly for processing performed by the arithmetic coding unit 1. The processing performed by the arithmetic coding unit 2 is the same as that of the arithmetic coding unit 1.

As shown in FIG. 3, in the image coding device according to the first embodiment, at the beginning, the symbol occurrence probability storage unit 4 initializes the stored symbol occurrence probabilities (S100). The initialization of occurrence probabilities will be described in detail later. Next, the binarization unit 3 binarizes non-binary syntax elements using a method defined by H.264 standard (S101).

Then, the context control unit 5 controls a context using a method defined by H.264 standard (S102). The context control refers to processing of reading a symbol occurrence probability corresponding to a target macroblock to be coded from the symbol occurrence probability storage unit 4 based on information of neighboring macroblock(s) of the target macroblock (neighbor information) and a bit position to be coded, and then providing the symbol occurrence probability to the binary arithmetic encoder 6. Then, based on the symbol occurrence probability, the binary arithmetic encoder 6 arithmetic-codes the target macroblock using a method defined by H.264 standard (S103).

The context control unit 5 stores an updated symbol occurrence probability, which results from the arithmetic coding, into the symbol occurrence probability storage unit 4 (S104). As needed, the symbol occurrence probability storage unit 4 outputs the stored symbol occurrence probability (S105). The symbol occurrence probability outputting will be described later.

Next, the arithmetic coding unit 1 determines whether or not the target macroblock has already been coded (S106). If the target macroblock has already been coded (Yes at S106), then the arithmetic coding unit 1 completes the processing.

On the other hand, if the target macroblock has not yet been coded (No at S106), then the arithmetic coding unit 1 repeats the steps from the binarization (S101).

FIG. 4 is an explanatory table of a symbol occurrence probability table held in the symbol occurrence probability storage unit 4. Each index (ctxIdx) in FIG. 4 is determined depending on (a) a context, namely, neighbor information of the target macroblock, and (b) a bit position to be coded. There are entries indicated by each index. The entries are: (a) a symbol occurrence probability (pStateIdx); and (b) a symbol (valMPS) indicating a most probable symbol. The table structure is defined in H.264 standard.

Figure 5:
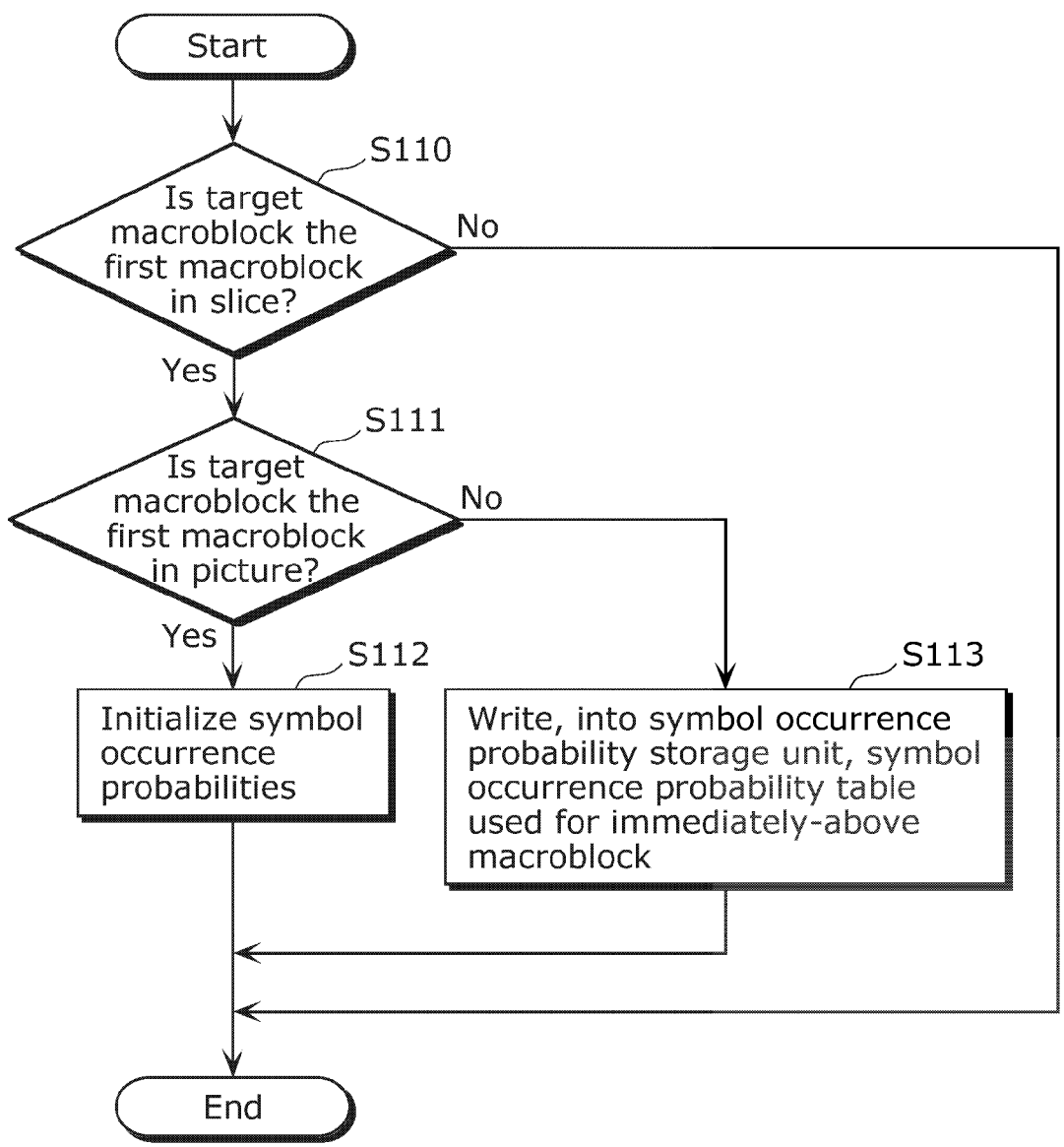
FIG. 5 is a flowchart of symbol occurrence probability initialization according to the first embodiment of the present invention.

The initialization of symbol occurrence probabilities at S100 in FIG. 3 is described with reference to FIG. 5. At the beginning, the arithmetic coding unit 1 determines whether or not a target macroblock to be coded is the first macroblock in a slice (S110). The slice refers to an entropy slice disclosed in Non-Patent Reference 3. In other words, the slice can refer to or being referred to by another slice.

If the target macroblock is not the first macroblock in a slice (No at S110), then the arithmetic coding unit 1 completes the processing without proceeding to any step. On the other hand, if the target macroblock is the first macroblock in a slice (Yes at S110), then the arithmetic coding unit 1 further determines whether or not the target macroblock is the first macroblock in a picture (S111).

If the target macroblock is the first macroblock in a picture (Yes at S111), then the arithmetic coding unit 1 initializes the symbol occurrence probability table stored in the symbol occurrence probability storage unit 4 using a method defined by H.264 standard (S112). On the other hand, if the target macroblock is not the first macroblock in a picture (No at S111), then the arithmetic coding unit 1 writes (inputs), into the symbol occurrence probability storage unit 4, a symbol occurrence probability table that has been outputted in coding a macroblock immediately above the target macroblock (hereinafter, referred to also as an "immediately-above macroblock") (S113).

Next, the symbol occurrence probability outputting at S105 in FIG. 3 is described with reference to FIG. 6. At the beginning, the arithmetic coding unit 1 determines whether or not the target macroblock is positioned on the bottom of a slice (in other words, has a lower border that is a slice border) and on the far left of a picture (S120).

If the target macroblock is not positioned on the bottom of a slice or not positioned on the far left of a picture (No at S120), then the arithmetic coding unit 1 completes the processing without proceeding to any step. On the other hand, if the target macroblock is positioned on the bottom of a slice and on the far left of a picture (Yes at S120), then the arithmetic coding unit 1 further determines whether or not the target macroblock has already been coded (S121).

If the target macroblock has not yet been coded (No at S121), then the arithmetic coding unit 1 completes the processing without proceeding to any step. On the other hand, if the target macroblock has already been coded (Yes at S121), then the arithmetic coding unit 1 causes the symbol occurrence probability storage unit 4 to output a stored symbol occurrence probability table (S122), and then completes the processing.

Figures 7A, 7B:
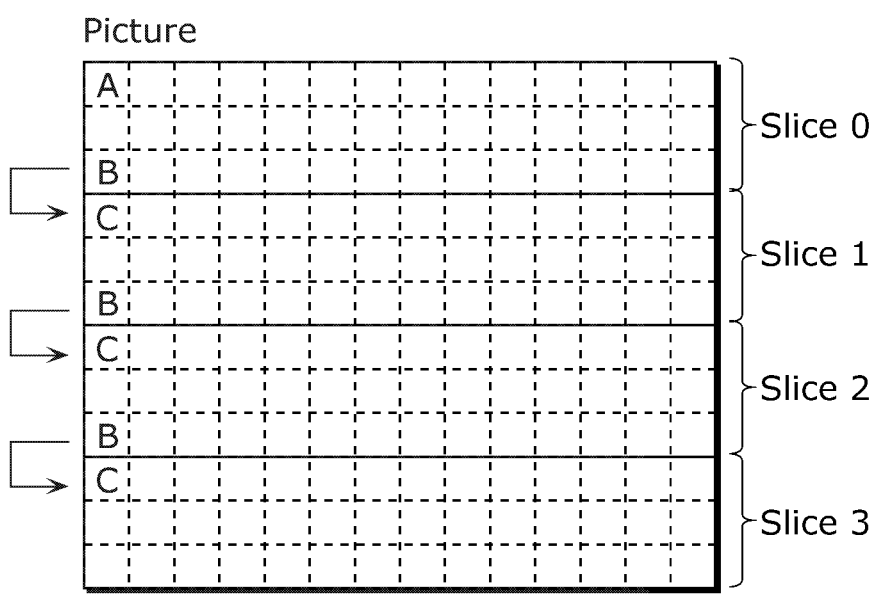
FIG. 7A is a conceptual diagram showing processing performed by the image coding device according to the first embodiment of the present invention.
FIG. 7B is a conceptual diagram showing processing performed by the image coding device according to the first embodiment of the present invention.

The processing for an entire picture is described with reference to FIG. 7A. As shown in FIG. 7A, a picture is divided into four slices. Each of the slices is further divided into macroblocks each having 16 pixels×16 pixels. A position A in FIG. 7A is the first macroblock in the picture. Therefore, the arithmetic coding unit 1 initializes the symbol occurrence probability table stored in the symbol occurrence probability storage unit 4, by using a method defined by H.264 standard (S112 in FIG. 5). A position B in FIG. 7A is a macroblock on the bottom in a slice (in other words, having a lower border that is a slice border) and on the far left of the picture. Therefore, the arithmetic coding unit 1 causes the symbol occurrence probability storage unit 4 to output the stored symbol occurrence probability table (S122 in FIG. 6). A position C shown in FIG. 7A is the first macroblock in another slice, but is not the first macroblock in the picture. Therefore, the arithmetic coding unit 1 writes (inputs), into the symbol occurrence probability storage unit 4, a symbol occurrence probability table outputted for the macroblock at the position B (S113 in FIG. 5).

Figure 8:
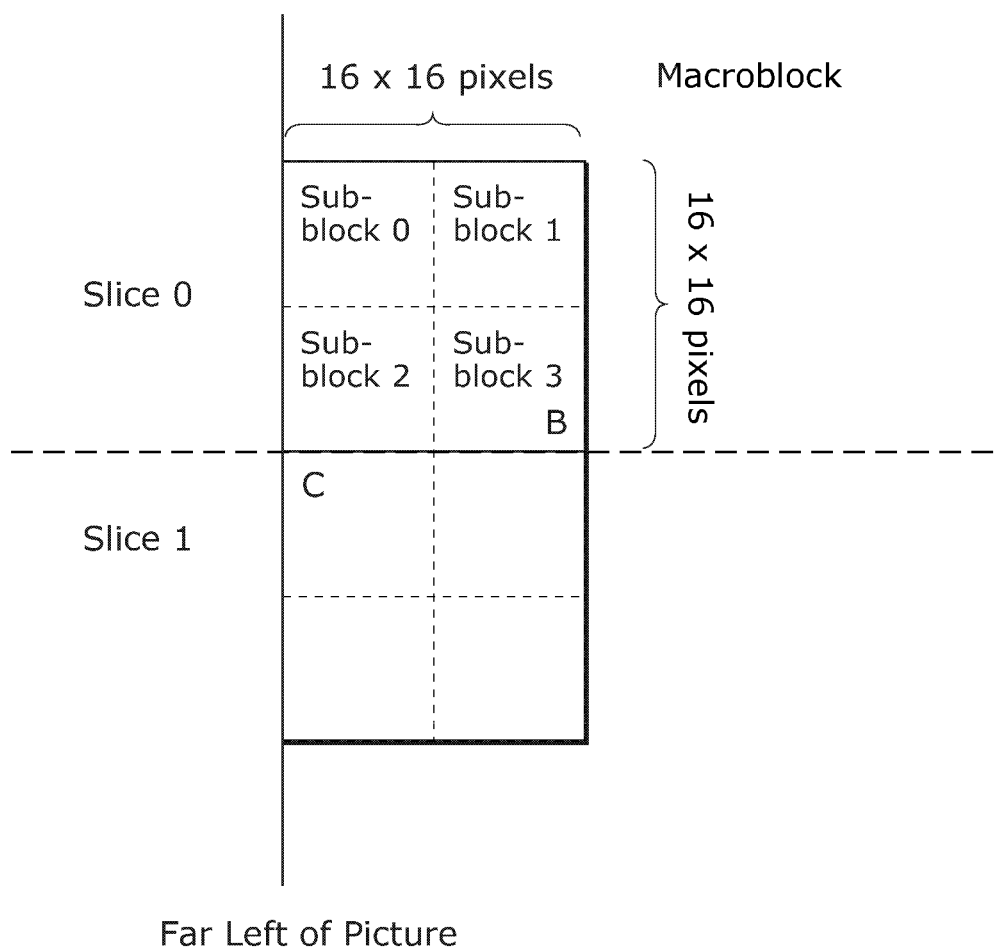
FIG. 8 is a conceptual diagram showing details of the processing performed by the image coding device according to the first embodiment of the present invention.

More specifically, each macroblock having 16 pixels×16 pixels is divided into a plurality of sub-blocks each having 8 pixels×8 pixels to be coded. That is, as shown in FIG. 8, the time of completing coding of a macroblock that is included in a slice 0 and is immediately above a target macroblock is the time of completing coding of a sub-block 3. The image coding device causes the symbol occurrence probability storage unit 4 to output a symbol occurrence probability table at the time of completing coding of the sub-block 3 in the macroblock. Then, at the time of starting coding of a macroblock (namely, the first macroblock in a slice 1) immediately below the macroblock, the image coding device writes (inputs) the outputted symbol occurrence probability table into the symbol occurrence probability storage unit 4.

This is the description for the image coding device according to the first embodiment.

As described above, the image coding device according to the first embodiment initializes the symbol occurrence probability table only for the first macroblock in a picture. Then, before coding of the first macroblock in each slice, the image coding device writes (inputs), into the symbol occurrence probability storage unit 4, a symbol occurrence probability table outputted for a macroblock that is spatially closest to a previous slice. Thereby, the image coding device can code image using a symbol occurrence probability regarding image at a spatially close position. As a result, it is possible to further improve coding efficiency.

It should be noted in the first embodiment that the arithmetic coding method defined by H.264 standard is adopted. However, any other method can be adopted as long as the coding is performed based on the symbol occurrence probability table or data similar to the symbol occurrence probability table which is adaptively updated depending on image.

It should also be noted in the first embodiment that the image coding device codes image in units of macroblocks each having 16 pixels×16 pixels. However, the image coding device may code image in units each having 8 pixels×8 pixels, 32 pixels×32 pixels, or 64 pixels×16 pixels, for example.

It should also be noted in the first embodiment that FIG. 7B or the like shows the example of coding images in a slice in a zigzag order. However, images may be coded in the raster order defined by H.264 standard or in any other orders.

It should also be noted in the first embodiment that the above description has been given for coding, but it is, of course, possible to perform decoding by reversing the steps in the coding.

It should also be noted in the first embodiment that the coding is based on H.264 standard, but the coding may be based on any other similar standards.

Second Embodiment

Here, the description is given for a summary of an image coding device according to the second embodiment of the present invention. The image coding device according to the second embodiment differs from the image coding device according to the first embodiment in that a position of an image for which a symbol occurrence probability table is outputted is spatially closer to a position of an image which is coded based on the outputted symbol occurrence probability table. Thereby, the image coding device according to the second embodiment can further improve coding efficiency.

This is the summary of the image coding device according to the second embodiment.

Since the structure of the image coding device according to the second embodiment is the same as the structure of the image coding device according to the first embodiment, it will be not explained again.

Figure 9:
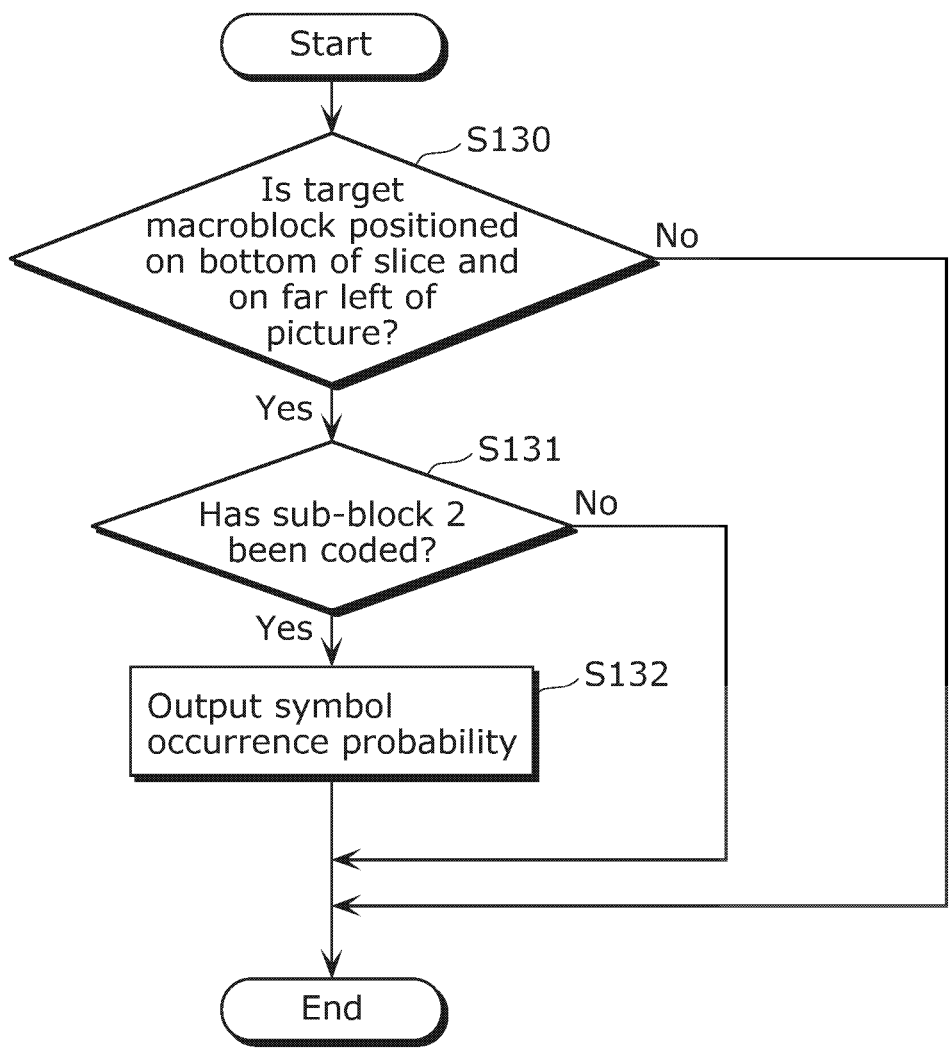
FIG. 9 is a flowchart of symbol occurrence probability outputting according to a second embodiment of the present invention.

The following describes processing performed by the image coding device according to the second embodiment. The processing performed by the image coding device according to the second embodiment differs from the processing performed by the image coding device according to the first embodiment in the symbol occurrence probability outputting at S105 in FIG. 3. Next, symbol occurrence probability outputting (S105) according to the second embodiment is described with reference to FIG. 9.

At the beginning, the arithmetic coding unit 1 determines whether or not the target macroblock is positioned on the bottom of a slice (in other words, has a lower border that is a slice border) and on the far left of a picture (S130).

If the target macroblock is not positioned on the bottom of a slice or not positioned on the far left of a picture (No at S130), then the arithmetic coding unit 1 completes the processing without proceeding to any step. On the other hand, if the target macroblock is positioned on the bottom of a slice and on the far left of a picture (Yes at S130), then the arithmetic coding unit 1 further determines whether or not a sub-block 2 in the target macroblock has already been coded (S131).

If the sub-block 2 has not yet been coded (No at S131), then the arithmetic coding unit 1 completes the processing without proceeding to any step. On the other hand, if the sub-block 2 has already been coded (Yes at S131), then the arithmetic coding unit 1 causes the symbol occurrence probability storage unit 4 to output the stored symbol occurrence probability table (S132), and then completes the processing.

Figure 10:
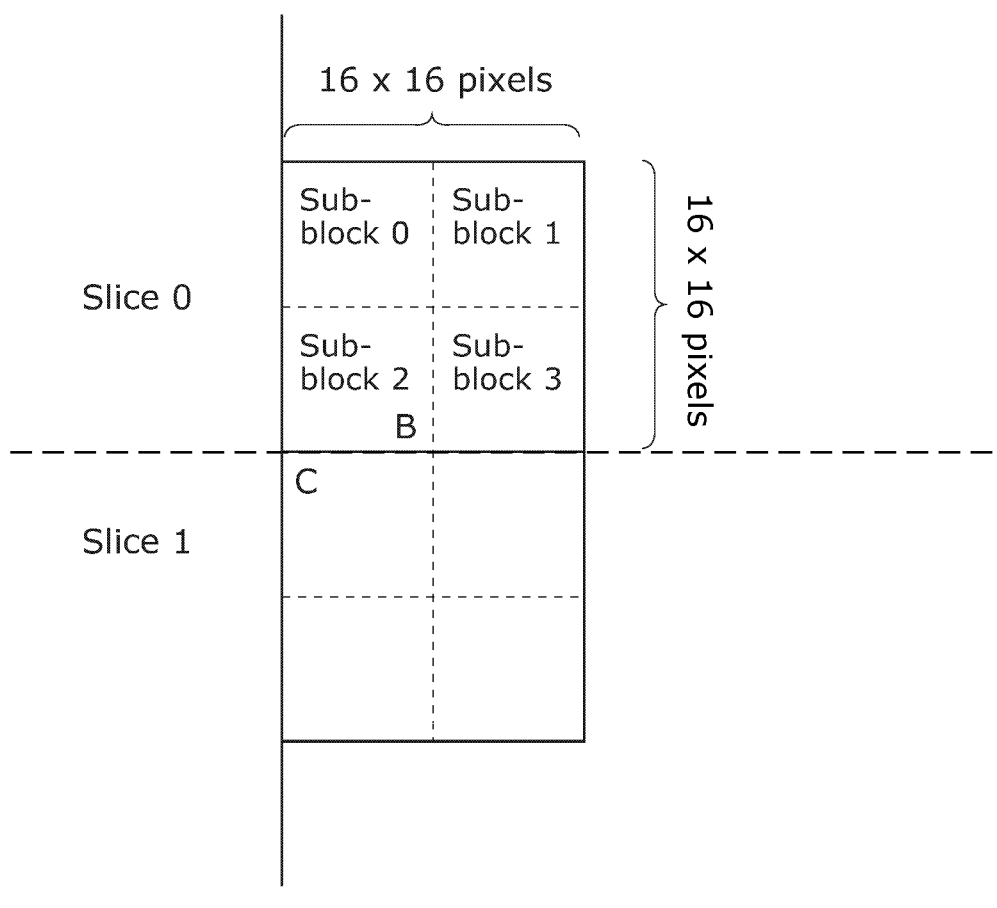
FIG. 10 is a conceptual diagram showing details of processing performed by an image coding device according to the second embodiment of the present invention.

In more detail, as shown in FIG. 10, the arithmetic coding unit 1 causes the symbol occurrence probability storage unit 4 to output the stored symbol occurrence probability table, at the time of completing coding of the sub-block 2 that is included in the slice 0 and will be positioned above a macroblock requiring the symbol occurrence probability table. The arithmetic coding unit 2 writes (inputs), into the symbol occurrence probability storage unit 4, the symbol occurrence probability table that has been outputted at the time of starting coding of an immediately-below macroblock that is the first macroblock in the slice 1 and below the macroblock including the above-described sub-block 2.

This is the description for the image coding device according to the second embodiment.

As described above, the image coding device according to the second embodiment writes (inputs), into the symbol occurrence probability storage unit 4, a symbol occurrence probability table outputted for a macroblock that is the first macroblock in each slice and is spatially closest to a previous slice. Thereby, the image coding device according to the second embodiment can code the first macroblock in each slice by using a symbol occurrence probability of a macroblock that is spatially closest to the first macroblock. Then, the image coding device according to the second embodiment can further improve coding efficiency.

It should be noted in the second embodiment that the arithmetic coding method defined by H.264 standard is adopted. However, any other method can be adopted as long as the coding is performed based on the symbol occurrence probability table or data similar to the symbol occurrence probability table which is adaptively updated depending on image.

It should also be noted in the second embodiment that the image coding device codes image in units of macroblocks each having 16 pixels×16 pixels. However, the image coding device may code image in units each having 8 pixels×8 pixels, 32 pixels×32 pixels, or 64 pixels×16 pixels, for example. Each of the sub-blocks, which are finer than the macroblocks, may have any size, such as 2 pixels×2 pixels or 4 pixels×4 pixels.

It should also be noted that it has been described in the second embodiment that images in a slice are coded in a zigzag order. However, the coding order may be raster order defined by H.264 standard or any other orders.

It should also be noted in the second embodiment that the above description has been given for coding, but it is, of course, possible to perform decoding by reversing the steps in the coding.

It should also be noted in the second embodiment that the coding is based on H.264 standard, but the coding may be based on any other similar standards.

Third Embodiment

Here, the description is given for a summary of an image coding device according to the third embodiment of the present invention. The image coding device according to the third embodiment differs from the image coding devices according to the first and second embodiments in that a symbol occurrence probability table outputted for a macroblock that is spatially closer to a target macroblock is used not only in coding the first macroblock in each slice, but in coding any macroblocks. As a result, it is possible to further improve coding efficiency.

This is the summary of the image coding device according to the third embodiment.

Figure 11:
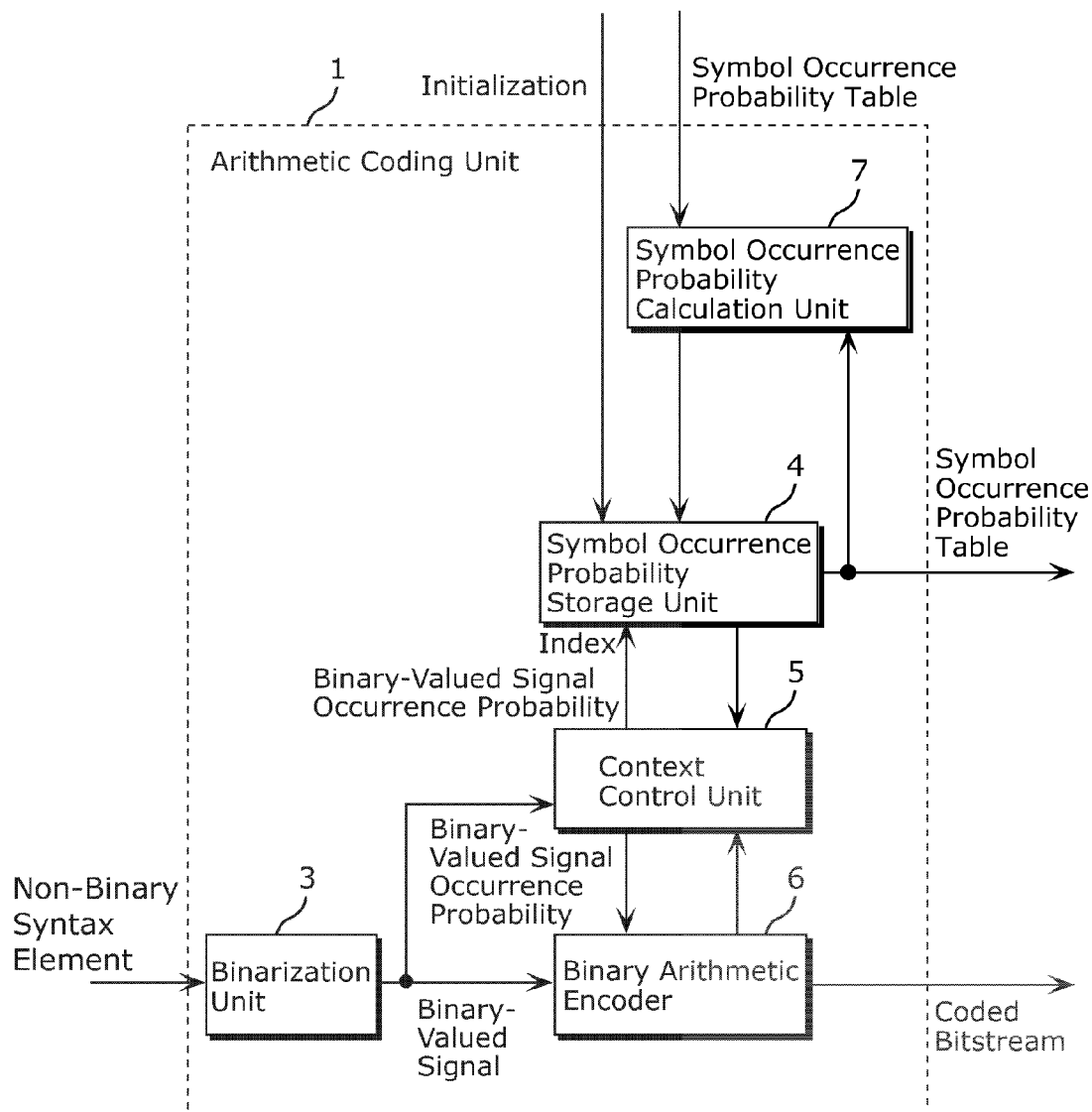
FIG. 11 is a block diagram showing a structure of an arithmetic coding unit according to a third embodiment of the present invention.

The following describes a structure of the image coding device according to the third embodiment. Since the structure of the image coding device according to the third embodiment is the same as the structure of the image coding device according to the first embodiment shown in FIG. 1, it will be not explained again. FIG. 11 is a block diagram showing a structure of a variation of the arithmetic coding unit 1 shown in FIG. 1. An arithmetic coding unit 1 according to the third embodiment differs from the arithmetic coding unit 1 according to the first embodiment in that a symbol occurrence probability calculation unit 7 is added. The symbol occurrence probability calculation unit 7 holds an outputted symbol occurrence probability table and calculates a new symbol occurrence probability. Regarding the other units except the symbol occurrence probability calculation unit 7, the same reference numerals of FIG. 2 are assigned to the identical units of FIG. 11, so that the identical units are not explained again below. Furthermore, an arithmetic coding unit 2 included in the image coding device according to the third embodiment has the same structure as that of the arithmetic coding unit 1 according to the third embodiment. Therefore, the structure of the arithmetic coding unit 2 will not be explained.

This is the description of the structure of the image coding device according to the third embodiment.

Figure 12:
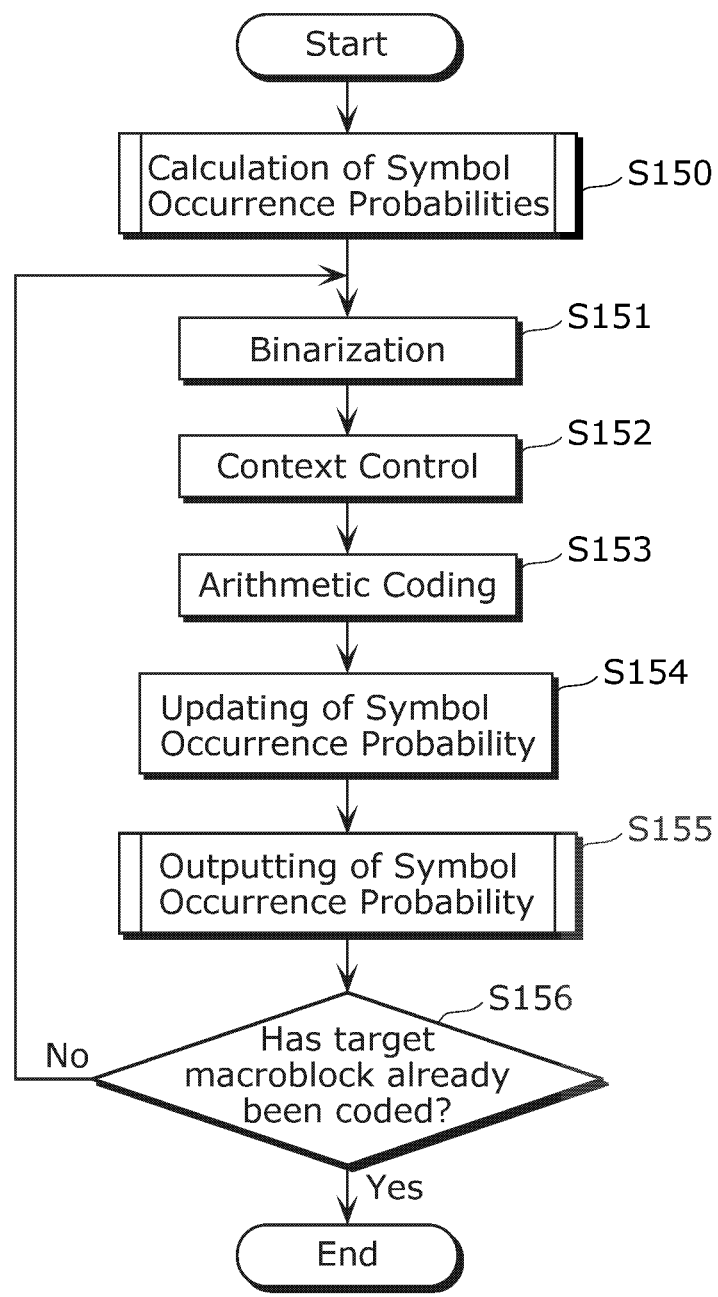
FIG. 12 is a flowchart of processing performed by the arithmetic coding unit according to the third embodiment of the present invention.

The following describes processing performed by the image coding device according to the third embodiment with reference to a flowchart of FIG. 12. FIG. 12 shows coding of one macroblock. As shown in FIG. 12, at the beginning, the symbol occurrence probability calculation unit 7 calculates symbol occurrence probabilities to be held in the symbol occurrence probability storage unit 4 (S150). The calculation of occurrence probabilities will be described in detail later. Next, the binarization unit 3 binarizes non-binary syntax elements using the method defined by H.264 standard (S151).

Then, the context control unit 5 controls a context using the method defined by H.264 standard (S152). The context control refers to processing of reading a symbol occurrence probability corresponding to a target macroblock from the symbol occurrence probability storage unit 4 based on information of neighbor information of the target macroblock and a bit position to be coded, and then providing the symbol occurrence probability to the binary arithmetic encoder 6. Then, the binary arithmetic encoder 6 performs arithmetic coding using the method defined by H.264 standard (S153).

The arithmetic coding unit 1 stores the updated symbol occurrence probability, which results from the arithmetic coding, into the symbol occurrence probability storage unit 4 (S154). As needed, the arithmetic coding unit 1 causes the symbol occurrence probability storage unit 4 to output the stored symbol occurrence probability (S155). The symbol occurrence probability outputting will be described later.

Next, the arithmetic coding unit 1 determines whether or not the target macroblock has already been coded (S156). If the target macroblock has already been coded (Yes at S156), then the arithmetic coding unit 1 completes the processing. On the other hand, if the target macroblock has not yet been coded (No at S156), then the arithmetic coding unit 1 repeats the steps from the binarization (S151).

The symbol occurrence probability table stored in the symbol occurrence probability storage unit 4 is the same as the symbol occurrence probability table described in the first embodiment and shown in FIG. 4. Therefore, the symbol occurrence probability table will not be explained again.

The calculation of a symbol occurrence probability table at S150 in FIG. 12, which is performed by the symbol occurrence probability calculation unit 7, is described with reference to FIG. 13.

Figure 13:
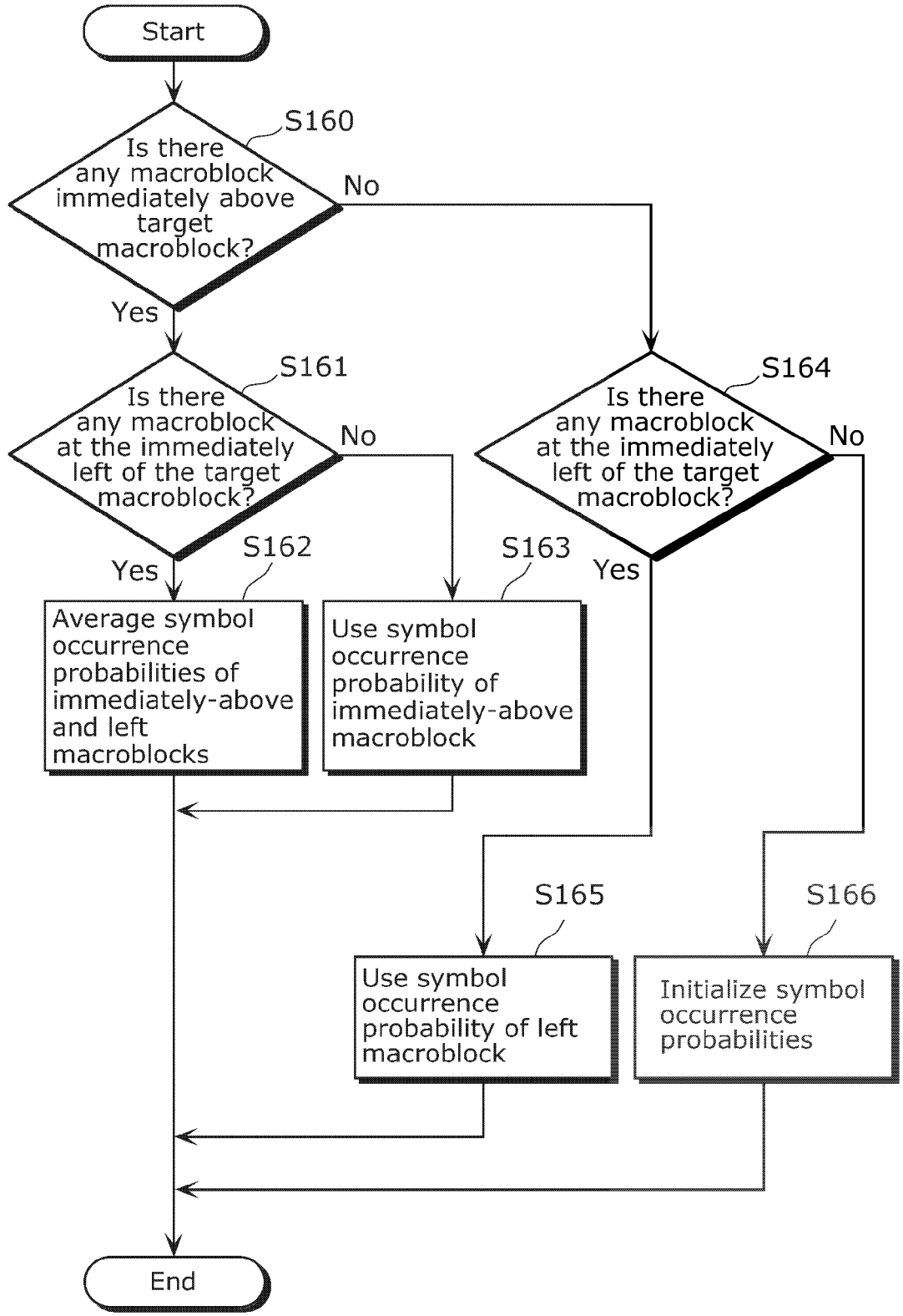
FIG. 13 is a flowchart of symbol occurrence probability initialization according to the third embodiment of the present invention.

At the beginning, as shown in FIG. 13, the symbol occurrence probability calculation unit 7 determines whether or not there is a macroblock immediately above the target macroblock (hereinafter, referred to also as an "immediately-above macroblock") (S160). If there is a macroblock immediately above the target macroblock (Yes at S160), then the symbol occurrence probability calculation unit 7 further determines whether or not there is a macroblock at the immediate left of the target macroblock (hereinafter, referred to also as a "left macroblock") (S161). If there is a macroblock at the immediate left of the target macroblock (Yes at S161), it means that there are both immediately-above macroblock and left macroblock. Therefore, the symbol occurrence probability calculation unit 7 averages symbol occurrence probabilities of the immediately-above macroblock and the left macroblock to calculate a symbol occurrence probability of the target macroblock (S162).

Here, the average calculation method is determined by the following equation 1, where pStateIdxA denotes the symbol occurrence probability of the immediately-above macroblock, valMPSA denotes a symbol of the immediately-above macroblock, pStateIdxB denotes the symbol occurrence probability of the left macroblock, valMPSB denotes a symbol of the left macroblock, pStateIdx denotes a symbol occurrence probability of the target macroblock, and valMPS denotes a symbol of the target macroblock.

```
if (valMPSA = = valMPSB) [
    pStateIdx = ( pStateIdxA + pStateIdxB ) / 2;
    valMPS = valMPSA;
] else [
    pStateIdx = ( - pStateIdxA + pStateIdxB ) / 2;
    valMPS = valMPSB;
    if (pStateIdx < 0) [
        pStateIdx = - pStateIdx;
        valMPS = valMPSA;
    ]
]
... (Equation 1)
```

As determined by the equation 1, if valMPSA is equal to valMPSB, the symbol occurrence probability calculation unit 7 calculate an arithmetic average of pStateIdxA and pStateIdxB. On the other hand, if valMPSA is not equal to valMPSB, the symbol occurrence probability calculation unit 7 performs pseudo sign inversion on pStateIdxA to calculate an arithmetic average.

In the above-described manner, the symbol occurrence probability calculation unit 7 calculates a symbol occurrence probability for each index. The symbol occurrence probability calculation unit 7 thereby generates a symbol occurrence probability table including the calculated symbol occurrence probabilities, and writes the generated symbol occurrence probability table into the symbol occurrence probability storage unit 4.

In referring back to FIG. 13, if there is no macroblock at the immediate left of the target macroblock (No at S161), then the symbol occurrence probability calculation unit 7 writes a symbol occurrence probability table of the immediately-above macroblock directly into the symbol occurrence probability storage unit 4 (S163).

If there is no macroblock immediately above the target macroblock (No at S160), then the symbol occurrence probability calculation unit 7 determines whether or not there is a macroblock at the immediate left of the target macroblock (S164). If there is a macroblock at the immediate left of the target macroblock (Yes at S164), then the symbol occurrence probability calculation unit 7 writes a symbol occurrence probability table of the left macroblock directly into the symbol occurrence probability storage unit 4 (S165).

On the other hand, if there is no macroblock at the immediate left of the target macroblock (No at S164), this means that there is neither immediately-above macroblock nor left macroblock of the target macroblock. Therefore, the arithmetic coding unit 1 initializes the symbol occurrence probability table (S166). The initialization may be the method defined by H.264 standard. It is possible that the symbol occurrence probability storage unit 4 initializes the stored symbol occurrence probability table. For the initialization of a symbol occurrence probability table, it is also possible that the symbol occurrence probability calculation unit 7 generates an initialized symbol occurrence probability table and writes the generated table into the symbol occurrence probability storage unit 4.

Figure 14:
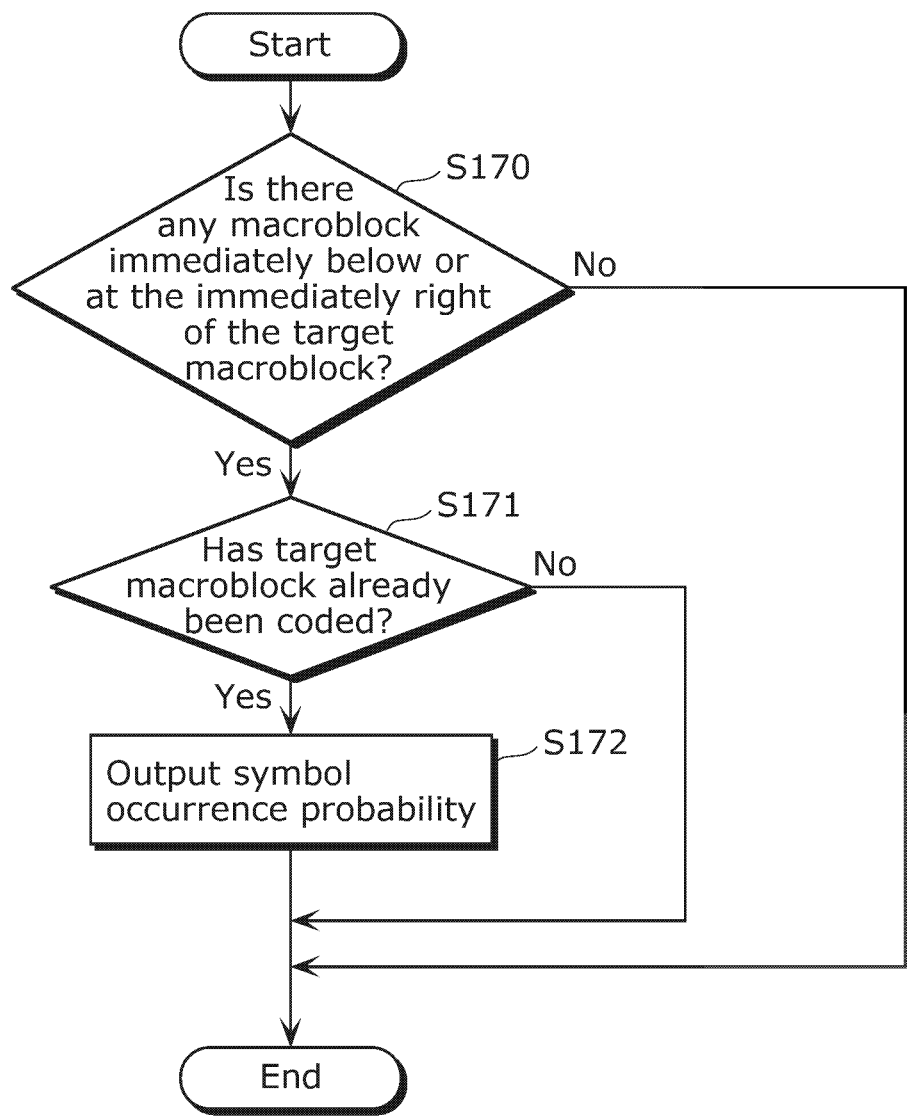
FIG. 14 is a flowchart of symbol occurrence probability outputting according to the third embodiment of the present invention.

Next, the outputting of a symbol occurrence probability table at S155 in FIG. 12, which is performed by the symbol occurrence probability storage unit 4, is described with reference to FIG. 14.

At the beginning, the arithmetic coding unit 1 determines whether or not there is a macroblock at the immediate right of or immediately below the target macroblock (S170). If there is neither macroblock at the immediate right of nor immediately below the target macroblock (No at S170), then the arithmetic coding unit 1 completes the processing. On the other hand, if there is a macroblock at the immediate right of or immediately below the target macroblock (Yes at S170), then the arithmetic coding unit 1 determines whether or not the target macroblock has already been coded (S171).

If the target macroblock has not yet been coded (No at S171), then the arithmetic coding unit 1 completes the processing without proceeding to any step. On the other hand, if the target macroblock has already been coded (Yes at S171), then the arithmetic coding unit 1 causes the symbol occurrence probability storage unit 4 to output the stored symbol occurrence probability table (S172). In the third embodiment, most of the macroblocks need the outputting of a symbol occurrence probability table. Therefore, the arithmetic coding unit 1 may cause the symbol occurrence probability storage unit 4 to output the stored symbol occurrence probability table, for each of the macroblocks.

The processing for an entire picture is described with reference to FIGS. 15A, 15B, and 15C. As shown in FIGS. 15A and 15B, it is assumed that a picture is divided into four slices, and that each of the slices is divided into macroblocks each having 16 pixels×16 pixels. In FIGS. 15A and 15B, X shows a target macroblock to be currently coded, A shows a macroblock at the immediate left of the target macroblock (hereinafter, referred to as a "left macroblock"), and B shows a macroblock immediately above the target macroblock (hereinafter, referred to as an "immediately-above macroblock").

In the third embodiment, slices can refer to each other. Therefore, as shown in FIG. 15A, a symbol occurrence probability table is sometimes calculated by using information beyond a slice border. In addition, as shown in FIG. 15B, a symbol occurrence probability table is sometimes calculated by using information within the same slice. Moreover, FIG. 15C shows order of coding macroblocks in a slice.

Figure 16:
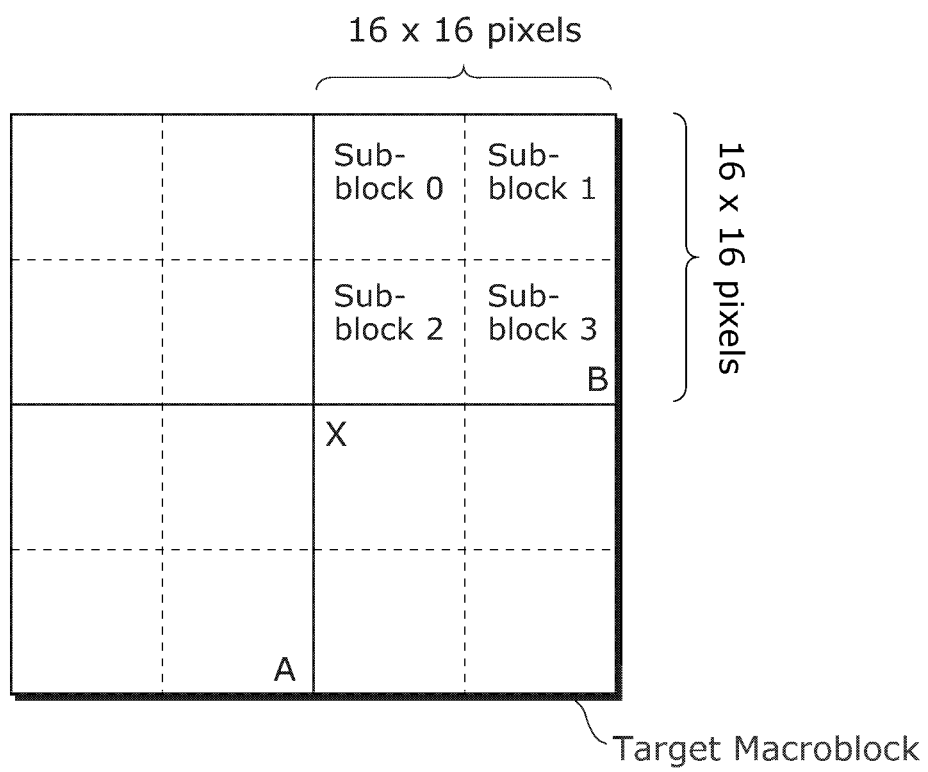
FIG. 16 is a conceptual diagram showing details of the processing performed by the image coding device according to the third embodiment of the present invention.

More specifically, as shown in FIG. 16, the arithmetic coding unit 1 causes the symbol occurrence probability storage unit 4 to output a stored symbol occurrence probability table at the time of completing coding of the immediately-above macroblock (B in FIG. 16), namely, at the time of completing coding a sub-block 3 having 8 pixels×8 pixels included in the immediately-above macroblock. In addition, the arithmetic coding unit 1 causes the symbol occurrence probability storage unit 4 to output a stored symbol occurrence probability table at the time of completing coding of the left macroblock (A in FIG. 16), namely, at the time of completing coding a sub-block 3 having 8 pixels×8 pixels included in the left macroblock. Then, the arithmetic coding unit 1 writes (inputs), into the symbol occurrence probability storage unit 4, the outputted symbol occurrence probability tables at the time of starting coding of the target macroblock (X in FIG. 16).

This is the description for the image coding device according to the third embodiment.

As described above, the image coding device according to the third embodiment codes the first image included in each macroblock, by using symbol occurrence probabilities of the immediately-above and the left macroblocks that are the spatially closest to the target macroblock, and that are not the closest to the macroblock in coding order. Furthermore, the image coding device according to the third embodiment codes the target macroblock using a symbol occurrence probability generated by averaging the two symbol occurrence probabilities of the immediately-above and left macroblocks. Thereby, the image coding device according to the third embodiment can code target image based on a symbol occurrence probability of image that is the spatially closest to the target image. As a result, it is possible to achieve higher coding efficiency.

It should be noted in the image coding device according to the third embodiment that a picture is not necessarily divided into slices. It is possible to use a more appropriate symbol occurrence probability, even if a picture is not divided into slices as shown in FIG. 17A.

It should also be noted that, as shown in FIG. 17B, the image coding device according to the third embodiment may code a target macroblock based on a symbol occurrence probability table only of macroblocks within the same slice. In other words, in the same manner for the situation where a target macroblock is at the far end of a picture, the image coding device according to the third embodiment may not use a symbol occurrence probability table that is used to code a macroblock in a different slice, even if a target macroblock is adjacent to a slice border.

It should also be noted as shown in FIG. 17C in that the image coding device according to the third embodiment can use a more appropriate symbol occurrence probability even in cording order that is raster order used in H.264 standard or the like.

Especially, when images are coded in raster order as shown in FIG. 17C and the target macroblock X positioned on the far left of a picture is coded based on a symbol occurrence probability table updated for the macroblock B that is spatially close to the target macroblock as shown in FIG. 17A, it is possible to improve coding efficiency.

It should also be noted in the third embodiment that the arithmetic coding method defined by H.264 standard is adopted. However, any other method can be adopted as long as the coding is performed based on the symbol occurrence probability table or data similar to the symbol occurrence probability table which is adaptively updated depending on image.

It should also be noted in the third embodiment that the image coding device codes image in units of macroblocks each having 16 pixels×16 pixels. However, the image coding device may code image in units each having 8 pixels×8 pixels, 32 pixels×32 pixels, or 64 pixels×16 pixels, for example.

It should also be noted that it has been described in the third embodiment that images in a slice are coded in a zigzag order. However, the coding order may be raster order defined by H.264 standard or any other orders.

It should also be noted in the third embodiment that the above description has been given for coding, but it is, of course, possible to perform decoding by reversing the steps in the coding.

It should also be noted in the third embodiment that the coding is based on H.264 standard, but the coding may be based on any other similar standards.

It should also be noted in the third embodiment that the image coding device uses pStateIdx to calculate a symbol occurrence probability. However, pStateIdx does not linearly correspond to an actual symbol occurrence probability. It is therefore possible that the image coding device transforms pStateIdx into an actual symbol occurrence probability to be used in the calculation, and then inversely transforms the symbol occurrence probability to the original pStateIdx. It is also possible that the image coding device calculates a symbol occurrence probability by using a table that is used to calculate a symbol occurrence probability for each pair of pStateIdx values.

Fourth Embodiment

First, the description is given for a summary of an image coding device according to the fourth embodiment of the present invention. The image coding device according to the fourth embodiment differs from the image coding device according to the third embodiment in that a position of an image for which a symbol occurrence probability table is outputted is spatially closer to a position of an image which is coded based on the outputted symbol occurrence probability table. Thereby, the image coding device according to the fourth embodiment can further improve coding efficiency.

This is the summary of the image coding device according to the fourth embodiment.

Since the structure of the image coding device according to the fourth embodiment is the same as the structure of the image coding device according to the third embodiment, it will be not explained again.

The processing performed by the image coding device according to the fourth embodiment differs from the processing performed by the image coding device according to the third embodiment in the symbol occurrence probability calculation at S150 in FIG. 12 and the symbol occurrence probability outputting at S155 in FIG. 12.

The image coding device according to the third embodiment codes a target macroblock based on symbol occurrence probability table(s) outputted at the time of completing coding of neighboring macroblock(s). In the third embodiment, as obvious from FIG. 16, in terms of images each having 8 pixels×8 pixels, a position of an image for which a symbol occurrence probability table is outputted is not spatially close to a position of a target image. Therefore, the image coding device according to the fourth embodiment codes a target image based on a symbol occurrence probability table that is updated at the time of processing an image that is positioned spatially closer to the target image.

Figure 18:
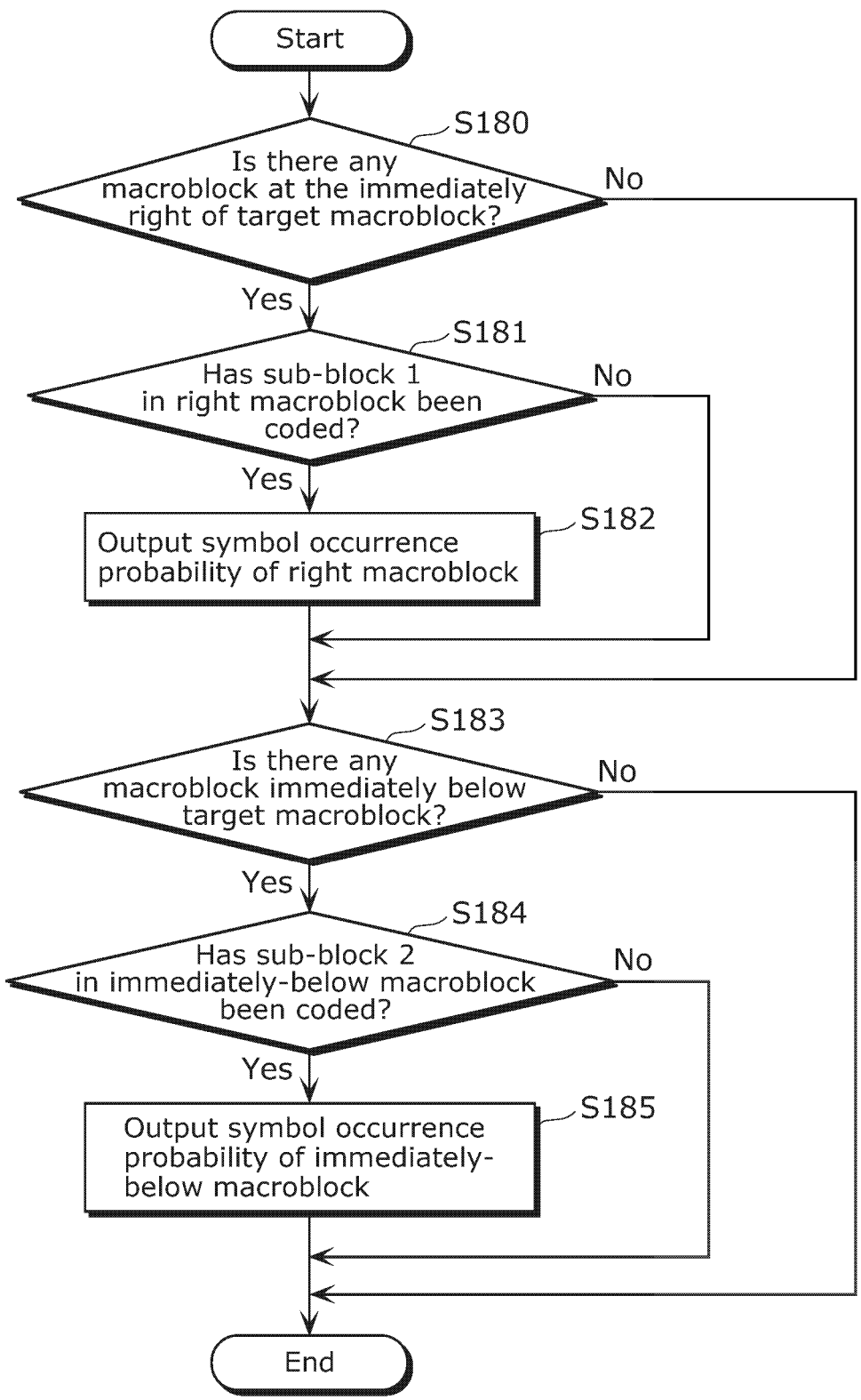
FIG. 18 is a flowchart of symbol occurrence probability outputting according to a fourth embodiment of the present invention.

Symbol occurrence probability outputting at S155 in FIG. 12 according to the fourth embodiment is described with a flowchart of FIG. 18. As shown in FIG. 18, at the beginning, the arithmetic coding unit 1 determines whether or not there is a macroblock at the immediate right of a target macroblock (hereinafter, referred to also as a "right macroblock") (S180). If there is a macroblock at the immediate right of the target macroblock (Yes at S180), then the arithmetic coding unit 1 further determines whether or not a sub-block 1 in the right macroblock has already been coded (S181).

If the sub-block 1 has already been coded (Yes at S181), the symbol occurrence probability storage unit 4 outputs a symbol occurrence probability table to be used in the right macroblock (S182). On the other hand, if there is no macroblock at the immediate right of the target macroblock (No at S180), or if the sub-block 1 has not yet been coded (No at S181), then the arithmetic coding unit 1 proceeds to a next step.

Next, the arithmetic coding unit 1 determines whether or not there is a macroblock immediately below the target macroblock (hereinafter, referred to also as an "immediately-below macroblock") (S183). If there is a macroblock immediately below the target macroblock (Yes at S183), then the arithmetic coding unit 1 further determines whether or not a sub-block 2 in the immediately-below macroblock has already been coded (S184).

If the sub-block 2 has already been coded (Yes at S184), the symbol occurrence probability storage unit 4 outputs a symbol occurrence probability table to be used in the immediately-below macroblock (S185). On the other hand, if there is no macroblock immediately below the target macroblock (No at S183), or if the sub-block 2 has not yet been coded (No at S184), then the arithmetic coding unit 1 completes the processing.

Moreover, in the symbol occurrence probability calculation at S150 in FIG. 12, the symbol occurrence probability calculation unit 7 codes the target macroblock by using the symbol occurrence probability table outputted for the right macroblock (S182 in FIG. 18), when a symbol occurrence probability table of the left macroblock is used in the coding. In addition, the symbol occurrence probability calculation unit 7 codes the target macroblock by using the symbol occurrence probability table outputted for the immediately-below macroblock (S185 in FIG. 18), when a symbol occurrence probability table of the immediately-above macroblock is used in the coding.

Figure 19:
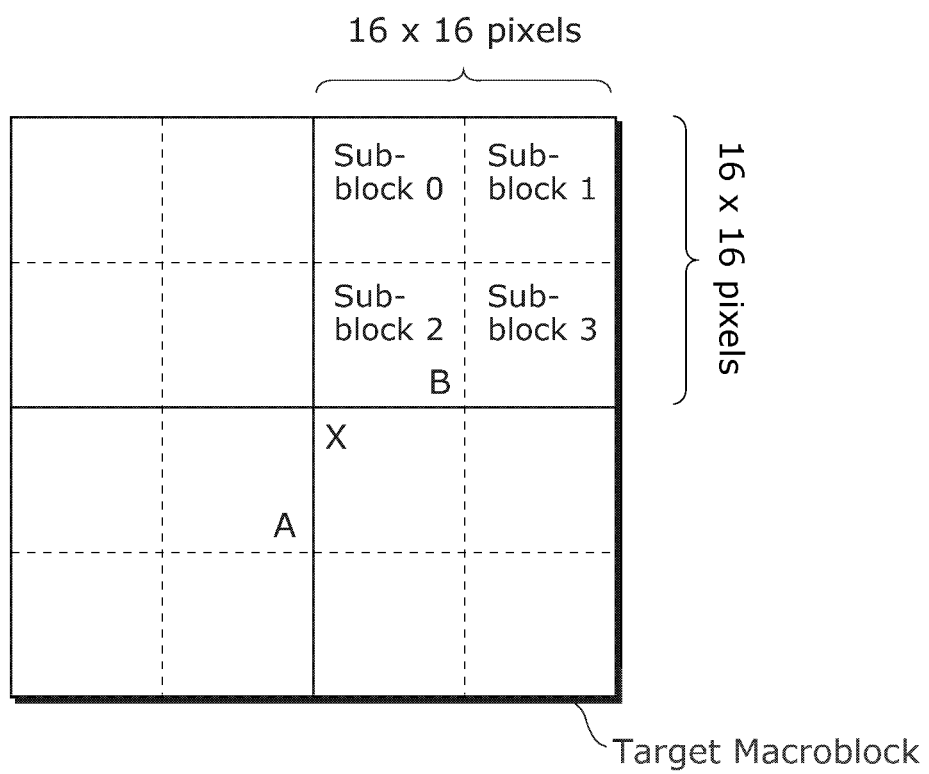
FIG. 19 is a conceptual diagram showing details of processing performed by an image coding device according to the fourth embodiment of the present invention.

By the above-described processing, as shown in FIG. 19, a symbol occurrence probability table is outputted at the time of completing coding of the sub-block 2 (B in FIG. 19) among sub-blocks each having 8 pixels×8 pixels included in the immediately-above macroblock. In addition, a symbol occurrence probability table is outputted at the time of completing coding of the sub-block 1 (A in FIG. 19) among sub-blocks each having 8 pixels×8 pixels included in the left macroblock.

Then, at the time of starting the target sub-block (X in FIG. 19), the symbol occurrence probability calculation unit 7 averages the two outputted symbol occurrence probability tables and writes the averaged table into the symbol occurrence probability storage unit 4.

This is the description for the image coding device according to the fourth embodiment.

As described above, the image coding device according to the fourth embodiment codes a target image based on a symbol occurrence probability table outputted (generated) at the time of processing an neighboring image having 8 pixels×8 pixels positioned closer to the target image, and the symbol occurrence probability table has been outputted at the time of completing coding of the neighboring image, not at the time of completing coding of the macroblock including the neighboring image. In addition, the image coding device according to the fourth embodiment codes the target image based on a symbol occurrence probability table generated by averaging two symbol occurrence probability tables obtained from the immediately-above and immediately-left images.

Thereby, the image coding device according to the fourth embodiment can code a target image based on a symbol occurrence probability of image that is the spatially closest to the target image. As a result, it is possible to achieve higher coding efficiency.

It should be noted in the image coding device according to the fourth embodiment that a picture is not necessarily divided into slices. The image coding device according to the fourth embodiment can use a more appropriate symbol occurrence probability, even if a picture is not divided into slices as shown in FIG. 17A.

It should also be noted that, as shown in FIG. 17B, the image coding device according to the fourth embodiment may code a target image based on a symbol occurrence probability table that is to be used to code images only in the same slice. In other words, in the same manner for the situation where a target macroblock is at the far end of a picture, the image coding device according to the fourth embodiment may not use a symbol occurrence probability table that is used to code a macroblock in a different slice, even if a target macroblock is adjacent to a slice border.

It should also be noted as shown in FIG. 17C in that the image coding device according to the fourth embodiment can use a more appropriate symbol occurrence probability even in cording order that is raster order used in H.264 standard or the like.

Especially, when images are coded in raster order as shown in FIG. 17C and the target macroblock X positioned on the far left of a picture is coded based on a symbol occurrence probability table updated for the macroblock B that is spatially close to the target macroblock as shown in FIG. 17A, it is possible to improve coding efficiency.

It should also be noted in the fourth embodiment that the arithmetic coding method defined by H.264 standard is adopted. However, any other method can be adopted as long as the coding is performed based on the symbol occurrence probability table or data similar to the symbol occurrence probability table which is adaptively updated depending on image.

It should also be noted in the fourth embodiment that the image coding device codes image in units of macroblocks each having 16 pixels×16 pixels. However, the image coding device may code image in units each having 8 pixels×8 pixels, 32 pixels×32 pixels, or 64 pixels×16 pixels, for example. Each of the sub-blocks, which are finer than the macroblocks, may have any size, such as 2 pixels×2 pixels or 4 pixels×4 pixels.

It should also be noted that it has been described in the fourth embodiment that images in a slice are coded in a zigzag order. However, the coding order may be raster order defined by H.264 standard or any other orders.

It should also be noted in the fourth embodiment that the above description has been given for coding, but it is, of course, possible to perform decoding by reversing the steps in the coding.

It should also be noted in the fourth embodiment that the coding is based on H.264 standard, but the coding may be based on any other similar standards.

It should also be noted in the fourth embodiment that the image coding device uses pStateIdx to calculate a symbol occurrence probability. However, pStateIdx does not linearly correspond to an actual symbol occurrence probability. It is therefore possible that the image coding device transforms pStateIdx into an actual symbol occurrence probability to be used in the calculation, and then inversely transforms the symbol occurrence probability to the original pStateIdx. It is also possible that the image coding device calculates a symbol occurrence probability by using a table that is used to calculate a symbol occurrence probability for each pair of pStateIdx values.

It should also be noted in the fourth embodiment that a symbol occurrence probability is calculated for the first sub-block of the target macroblock. However, a symbol occurrence probability may be calculated in units of smaller images such as bocks each having 8 pixels and 8 pixels.

Fifth Embodiment

First, the description is given for a summary of an image coding device according to the fifth embodiment of the present invention. The image coding device according to the fifth embodiment codes a target macroblock based on a symbol occurrence probability table of a macroblock spatially positioned at the immediate upper left of the target macroblock (hereinafter, referred to also as an "upper-left macroblock"), as the upper-left macroblock is regarded as a position spatially close to the target macroblock. Therefore, like the image coding device according to the third embodiment, the image coding device according to the fifth embodiment uses information of image positioned spatially close to target image. However, the image coding device according to the fifth embodiment differs from the image coding device according to the third embodiment in shortening a delay in the coding processing.

This is the summary of the image coding device according to the fifth embodiment.

Since the structure of the image coding device according to the fifth embodiment is the same as the structure of the image coding device according to the third embodiment, it will be not explained again.

The following describes processing performed by the image coding device according to the fifth embodiment. The processing performed by the image coding device according to the fifth embodiment differs from the processing performed by the image coding device according to the third embodiment in the symbol occurrence probability calculation at S150 in FIG. 12.

Figure 20:
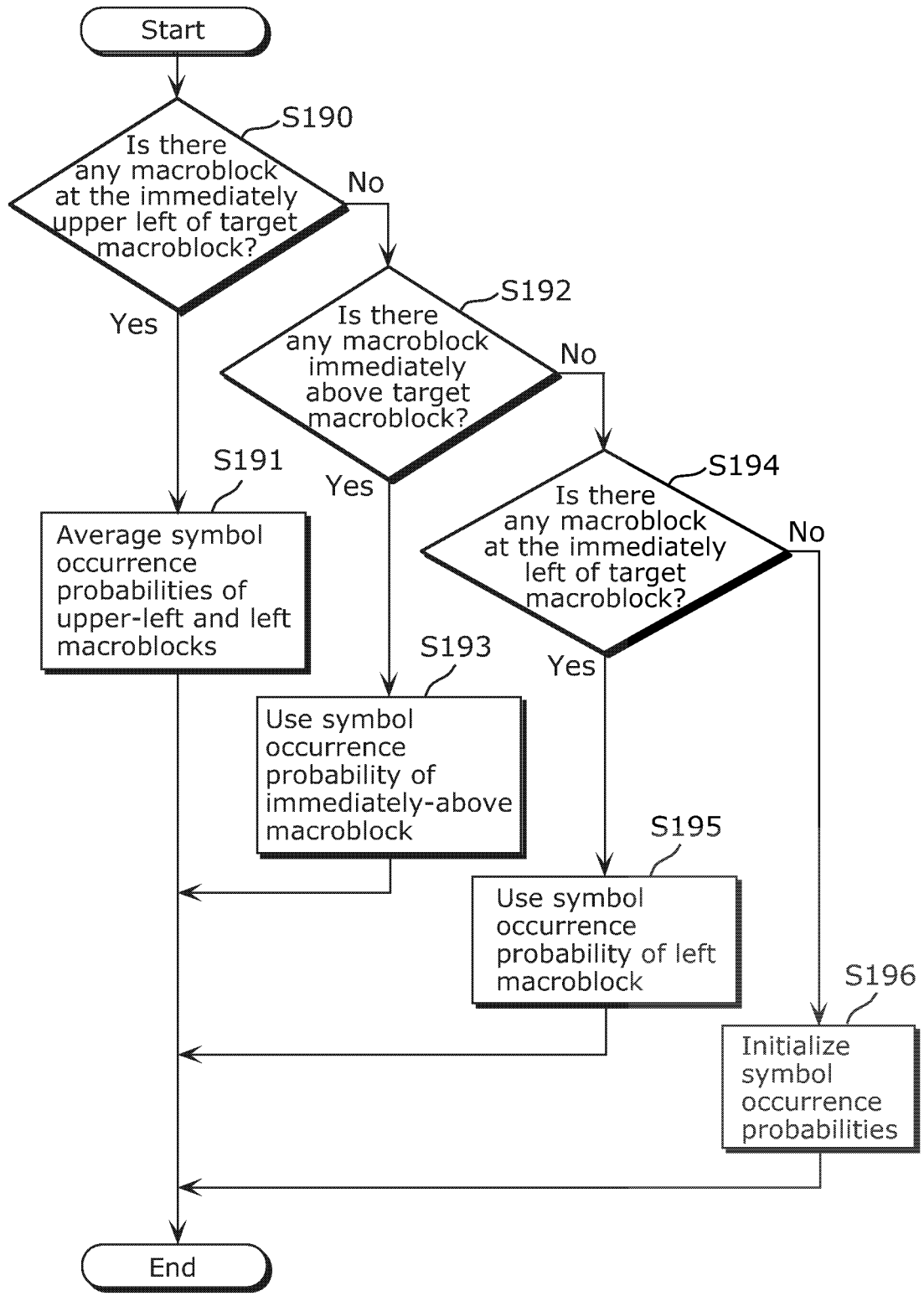
FIG. 20 is a flowchart of symbol occurrence probability initialization according to the fifth embodiment of the present invention.

Symbol occurrence probability calculation at S150 in FIG. 12 according to the fifth embodiment is described with a flowchart of FIG. 20. As shown in FIG. 20, at the beginning, the arithmetic coding unit 1 determines whether or not there is a macroblock at the immediate upper left of a target macroblock (hereinafter, referred to also as an "upper-left macroblock") (S190). If there is a macroblock at the upper left of the target macroblock (Yes at S190), this means that there is definitely a macroblock at the immediate left of the target macroblock. Therefore, the symbol occurrence probability calculation unit 7 averages two symbol occurrence probabilities of the upper-left macroblock and the left macroblock to calculate a new symbol occurrence probability, and writes the calculated symbol occurrence probability into the symbol occurrence probability storage unit 4 (S191). Here, the method for the averaging is the same as the method described in the third embodiment.

On the other hand, if there is no macroblock at the immediate upper left of the target macroblock (No at S190), then the arithmetic coding unit 1 further determines whether or not there is a macroblock immediately above the target macroblock (S192). If there is a macroblock immediately above the target macroblock (Yes at S192), then the symbol occurrence probability calculation unit 7 writes a symbol occurrence probability table of the immediately-above macroblock into the symbol occurrence probability storage unit 4 (S193).

On the other hand, if there is no macroblock immediately above the target macroblock (No at S192), then the arithmetic coding unit 1 further determines whether or not there is a macroblock at the immediate left of the target macroblock (S194). If there is a macroblock immediately above the target macroblock (Yes at S194), then the symbol occurrence probability calculation unit 7 writes a symbol occurrence probability table of the left macroblock into the symbol occurrence probability storage unit 4 (S195).

If there is no macroblock at the immediate left of the target macroblock (No at S194), this means that there is no macroblock at the left of nor immediately above the target macroblock. Therefore, the arithmetic coding unit 1 initializes the symbol occurrence probability table using the method defined by H.264 standard, and writes the initialized table into the symbol occurrence probability storage unit 4 (S196). It is possible that the symbol occurrence probability storage unit 4 initializes the stored symbol occurrence probability table. For the initialization of a symbol occurrence probability table, it is also possible that the symbol occurrence probability calculation unit 7 generates an initialized symbol occurrence probability table and writes the generated table into the symbol occurrence probability storage unit 4.

Figure 21:
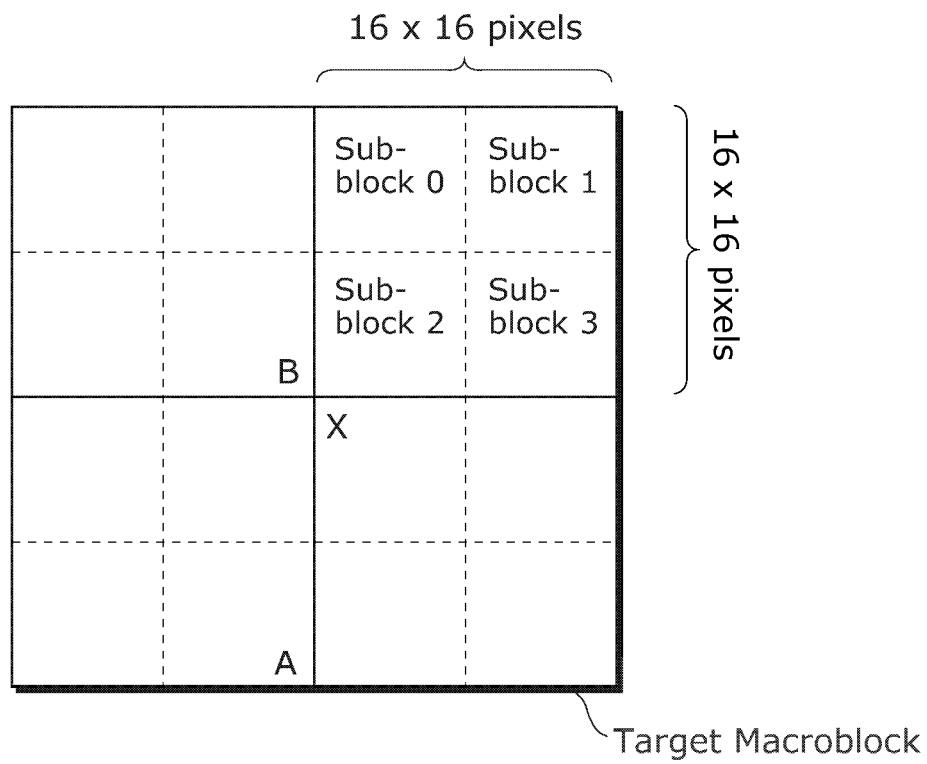
FIG. 21 is a conceptual diagram showing details of processing performed by an image coding device according to the fifth embodiment of the present invention.

By the above-described processing, as shown in FIG. 21, a symbol occurrence probability table is outputted at the time of completing coding of the upper-left macroblock, namely, at the time of completing coding of a sub-block 3 (B in FIG. 21) among sub-blocks each having 8 pixels×8 pixels included in the upper-left macroblock. In addition, a symbol occurrence probability table is outputted at the time of completing coding of the left macroblock, namely, at the time of completing coding of a sub-block 3 (A in FIG. 21) among sub-blocks each having 8 pixels×8 pixels included in the left macroblock. Then, at the time of starting the target macroblock (X in FIG. 21), the symbol occurrence probability calculation unit 7 averages the two outputted symbol occurrence probability tables and writes the averaged table into the symbol occurrence probability storage unit 4.

This is description for the processing performed by the image coding device according to the fifth embodiment.

As described above, the image coding device according to the fifth embodiment codes a target macroblock based on a symbol occurrence probability table outputted (obtained) at the time of completing coding of the upper-left macroblock, namely, at the time of completing coding of the sub-block 3 in the upper-left macroblock, as the symbol occurrence probability table of the immediately-above macroblock. In general, images are coded in an order from left to right. Therefore, the image coding device according to the fifth embodiment can start coding earlier, and thereby shorten a delay of the coding.

Moreover, in comparison to the third embodiment where a target image is coded based on a symbol occurrence probability table outputted (obtained) at the time of completing coding of a macroblock, namely, at the time of completing coding of the sub-block 3 in the macroblock, the fifth embodiment codes a target image based on a symbol occurrence probability table outputted at the time of completing coding of an image that is spatially far from the target image by the same distance as that in the third embodiment. Therefore, the image coding device according to the fifth embodiment can shorten a delay in coding to achieve the same coding efficiency as that in the third embodiment.

It should be noted in the image coding device according to the fifth embodiment that a picture is not necessarily divided into slices. It is possible to use a more appropriate symbol occurrence probability, even if a picture is not divided into slices as shown in FIG. 17A.

It should also be noted that, as shown in FIG. 17B, the image coding device according to the fifth embodiment may code a target macroblock based on a symbol occurrence probability table only of macroblocks within the same slice. In other words, in the same manner for the situation where a target macroblock is at the far end of a picture, the image coding device according to the fifth embodiment may not use a symbol occurrence probability table that is used to code a macroblock in a different slice, even if a target macroblock is adjacent to a slice border It should also be noted as shown in FIG. 17C in that the image coding device according to the fifth embodiment can use a more appropriate symbol occurrence probability even in cording order that is raster order used in H.264 standard or the like.

Especially, when images are coded in raster order as shown in FIG. 17C and the target macroblock X positioned on the far left of a picture is coded based on a symbol occurrence probability table updated for the macroblock B that is spatially close to the target macroblock as shown in FIG. 17A, it is possible to improve coding efficiency.

It should also be noted in the fifth embodiment that the arithmetic coding method defined by H.264 standard is adopted. However, any other method can be adopted as long as the coding is performed based on the symbol occurrence probability table or data similar to the symbol occurrence probability table which is adaptively updated depending on image.

It should also be noted in the fifth embodiment that the image coding device codes image in units of macroblocks each having 16 pixels×16 pixels. However, the image coding device may code image in units each having 8 pixels×8 pixels, 32 pixels×32 pixels, or 64 pixels×16 pixels, for example. Each of the sub-blocks, which are finer than the macroblocks, may have any size, such as 2 pixels×2 pixels or 4 pixels×4 pixels.

It should also be noted that it has been described in the fifth embodiment that images in a slice are coded in a zigzag order. However, the coding order may be raster order defined by H.264 standard or any other orders.

It should also be noted in the fifth embodiment that the above description has been given for coding, but it is, of course, possible to perform decoding by reversing the steps in the coding.

It should also be noted in the fifth embodiment that the coding is based on H.264 standard, but the coding may be based on any other similar standards.

It should also be noted in the fifth embodiment that the image coding device uses pStateIdx to calculate a symbol occurrence probability. However, pStateIdx does not linearly correspond to an actual symbol occurrence probability. It is therefore possible that the image coding device transforms pStateIdx into an actual symbol occurrence probability to be used in the calculation, and then inversely transforms the symbol occurrence probability to the original pStateIdx. It is also possible that the image coding device calculates a symbol occurrence probability by using a table that is used to calculate a symbol occurrence probability for each pair of pStateIdx values.

It should also be noted in the fifth embodiment that a symbol occurrence probability is calculated for the first sub-block of the target macroblock. However, a symbol occurrence probability may be calculated in units of smaller images such as bocks each having 8 pixels and 8 pixels.

Sixth Embodiment

Here, the description is given for a summary of an image coding device according to the sixth embodiment of the present invention. The image coding device according to the sixth embodiment codes a target image based on (a) a symbol occurrence probability table outputted at the time of completing coding of an upper-left macroblock and (b) a symbol occurrence probability table outputted at the time of completing coding of a sub-block 1 in a left macroblock. Thereby, the image coding device according to the sixth embodiment codes a target image based on a symbol occurrence probability table of image that is spatially positioned closer to the target image in comparison to the image coding device according to the fifth embodiment. As a result, the image coding device according to the sixth embodiment can further improve coding efficiency.

This is the summary of the image coding device according to the sixth embodiment.

Since the structure of the image coding device according to the sixth embodiment is the same as the structure of the image coding device according to the fifth embodiment, it will be not explained again.

The following describes processing performed by the image coding device according to the sixth embodiment. The processing performed by the image coding device according to the sixth embodiment differs from the processing performed by the image coding device according to the fifth embodiment in the symbol occurrence probability outputting at S155 in FIG. 12.

Figure 22:
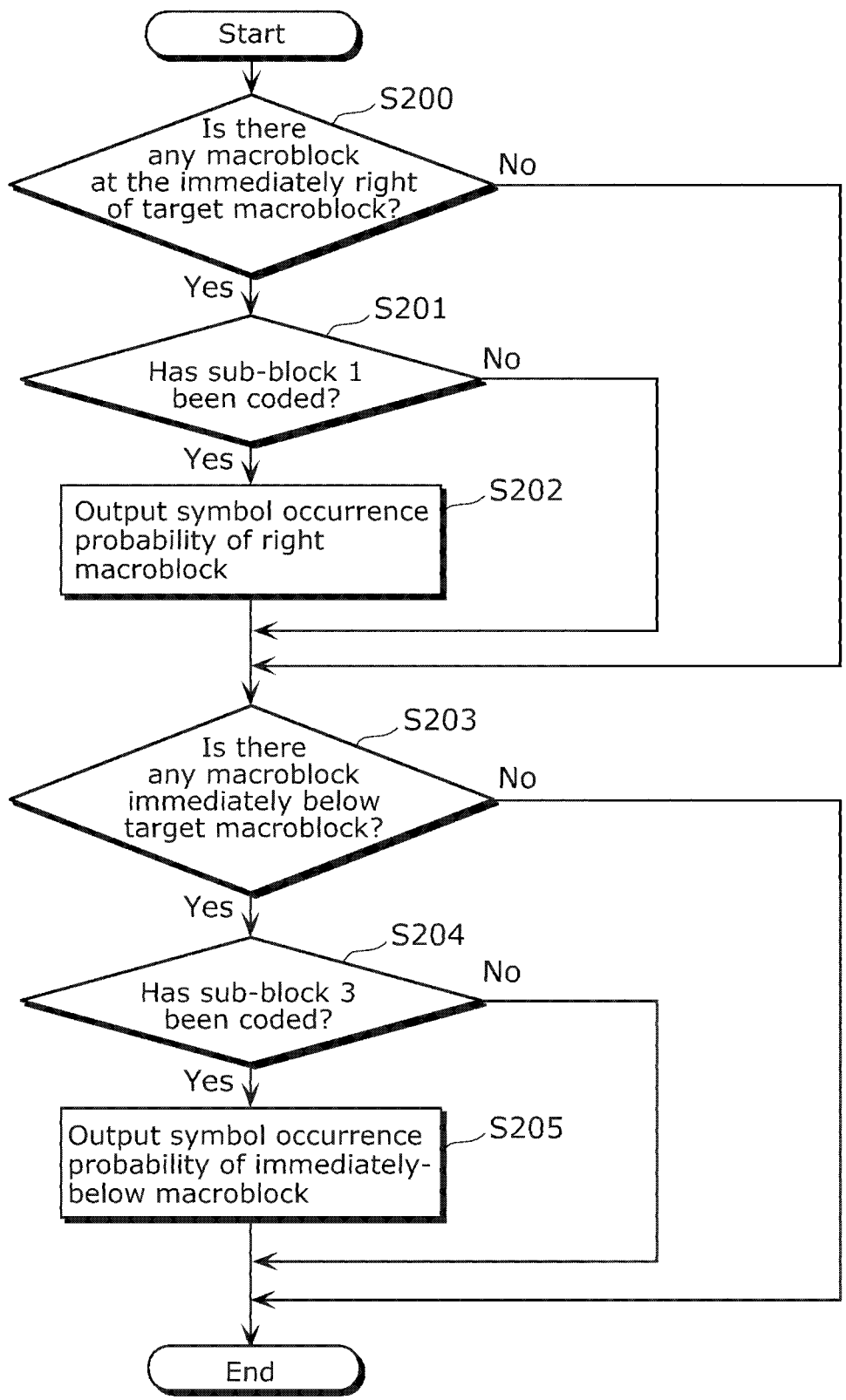
FIG. 22 is a flowchart of symbol occurrence probability outputting according to a sixth embodiment of the present invention.

Symbol occurrence probability outputting at S155 in FIG. 12 according to the sixth embodiment is described with a flowchart of FIG. 22. As shown in FIG. 22, at the beginning, the arithmetic coding unit 1 determines whether or not there is a macroblock at the immediate right of a target macroblock (S200).

If there is a macroblock at the immediate right of the target macroblock (Yes at S200), then the arithmetic coding unit 1 further determines whether or not a sub-block 1 in the target macroblock has already been coded (S201). If the sub-block 1 has already been coded (Yes at S201), the symbol occurrence probability storage unit 4 outputs a symbol occurrence probability table to be used for the right macroblock (S202). On the other hand, if there is no macroblock at the immediate right of the target macroblock (No at S200), or if the sub-block 1 has not yet been coded (No at S201), then the arithmetic coding unit 1 proceeds to a next step.

Next, the arithmetic coding unit 1 determines whether or not there is a macroblock immediately below the target macroblock (S203). If there is a macroblock immediately below the target macroblock (Yes at S203), then the arithmetic coding unit 1 further determines whether or not a sub-block 3 in the target macroblock has already been coded (S204). If the sub-block 3 has already been coded (Yes at S204), the symbol occurrence probability storage unit 4 outputs a symbol occurrence probability table to be used for the immediately-below macroblock (S205). If there is no macroblock immediately below the target macroblock (No at S203), or if the sub-block 3 in the target macroblock has not yet been coded (No at S204), then the processing is completed.

Figure 23:
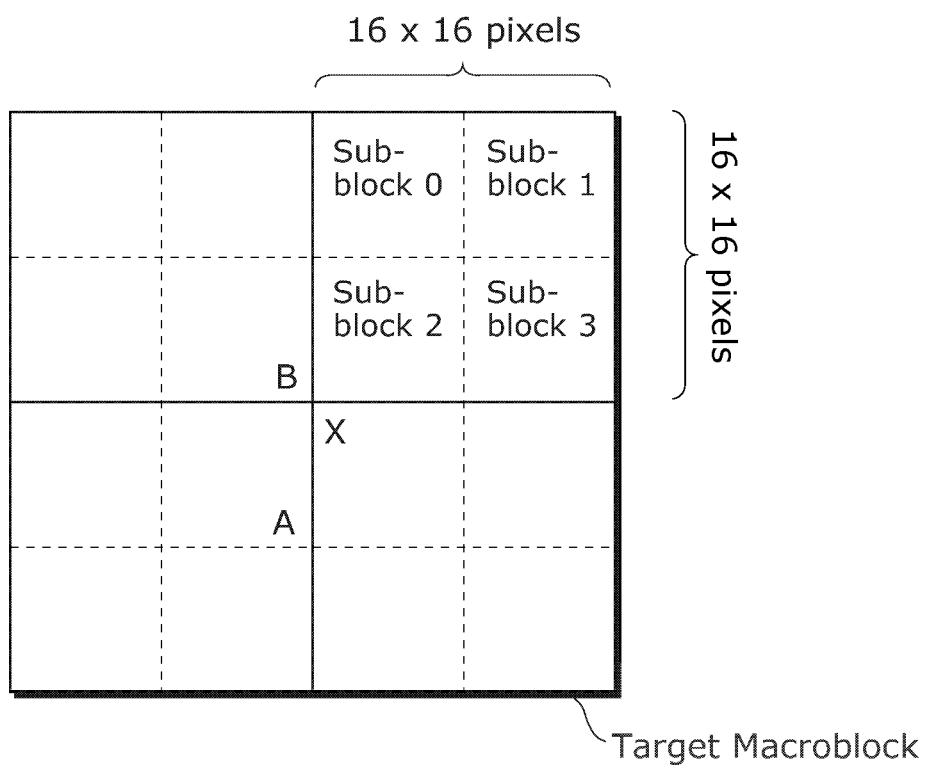
FIG. 23 is a conceptual diagram showing details of processing performed by an image coding device according to the sixth embodiment of the present invention.

By the above-described processing, as shown in FIG. 23, a symbol occurrence probability table is outputted at the time of completing coding of a sub-block 3 (B in FIG. 23) among sub-blocks each having 8 pixels×8 pixels included in the upper-left macroblock of the target macroblock. In addition, a symbol occurrence probability table is outputted at the time of completing coding of a sub-block 1 (A in FIG. 23) among sub-blocks each having 8 pixels×8 pixels included in the left macroblock of the target macroblock.

Then, at the time of starting the target macroblock (X in FIG. 23), the image coding device according to the sixth embodiment writes a new symbol occurrence probability table into the symbol occurrence probability storage unit 4. The new symbol occurrence probability table is generated by averaging the outputted two symbol occurrence probability tables.

Moreover, in the symbol occurrence probability calculation at S150 in FIG. 12, the symbol occurrence probability calculation unit 7 codes the target macroblock by using the symbol occurrence probability table outputted for the right macroblock (S202 in FIG. 22), when a symbol occurrence probability table of the immediate left macroblock is used in the coding. In addition, the symbol occurrence probability calculation unit 7 codes the target macroblock by using the symbol occurrence probability table outputted for the immediately-below macroblock (S205 in FIG. 22), when a symbol occurrence probability table of the immediately-above macroblock is used in the coding.

This is description for the processing performed by the image coding device according to the sixth embodiment.

As described above, the image coding device according to the sixth embodiment codes a target macroblock based on a symbol occurrence probability table outputted at the time of completing coding of a sub-block 1 that is spatially closer in the left macroblock in comparison to the image coding device according to the fifth embodiment. Thereby, the image coding device according to the sixth embodiment can improve coding efficiency more than the image coding device according to the fifth embodiment.

It should be noted in the image coding device according to the sixth embodiment that a picture is not necessarily divided into slices. It is possible to use a more appropriate symbol occurrence probability, even if a picture is not divided into slices as shown in FIG. 17A.

It should also be noted that, as shown in FIG. 17B, the image coding device according to the sixth embodiment may code a target macroblock based on a symbol occurrence probability table only of macroblocks within the same slice. In other words, in the same manner for the situation where a target macroblock is at the far end of a picture, the image coding device according to the sixth embodiment may not use a symbol occurrence probability table that is used to code a macroblock in a different slice, even if a target macroblock is adjacent to a slice border.

It should also be noted as shown in FIG. 17C in that the image coding device according to the sixth embodiment can use a more appropriate symbol occurrence probability even in cording order that is raster order used in H.264 standard or the like.

Especially, when images are coded in raster order as shown in FIG. 17C and the target macroblock X positioned on the far left of a picture is coded based on a symbol occurrence probability table updated for the macroblock B that is spatially close to the target macroblock as shown in FIG. 17A, it is possible to improve coding efficiency.

It should also be noted in the sixth embodiment that the arithmetic coding method defined by H.264 standard is adopted. However, any other method can be adopted as long as the coding is performed based on the symbol occurrence probability table or data similar to the symbol occurrence probability table which is adaptively updated depending on image.

It should also be noted in the sixth embodiment that the image coding device codes image in units of macroblocks each having 16 pixels×16 pixels. However, the image coding device may code image in units each having 8 pixels×8 pixels, 32 pixels×32 pixels, or 64 pixels×16 pixels, for example. Each of the sub-blocks, which are finer than the macroblocks, may have any size, such as 2 pixels×2 pixels or 4 pixels×4 pixels.

It should also be noted that it has been described in the sixth embodiment that images in a slice are coded in a zigzag order. However, the coding order may be raster order defined by H.264 standard or any other orders.

It should also be noted in the sixth embodiment that the above description has been given for coding, but it is, of course, possible to perform decoding by reversing the steps in the coding.

It should also be noted in the sixth embodiment that the coding is based on H.264 standard, but the coding may be based on any other similar standards.

It should also be noted in the sixth embodiment that the image coding device uses pStateIdx to calculate a symbol occurrence probability. However, pStateIdx does not linearly correspond to an actual symbol occurrence probability. It is therefore possible that the image coding device transforms pStateIdx into an actual symbol occurrence probability to be used in the calculation, and then inversely transforms the symbol occurrence probability to the original pStateIdx. It is also possible that the image coding device calculates a symbol occurrence probability by using a table that is used to calculate a symbol occurrence probability for each pair of pStateIdx values.

It should also be noted in the sixth embodiment that a symbol occurrence probability is calculated for the first sub-block in the target macroblock. However, a symbol occurrence probability may be calculated in units of smaller images such as bocks each having 8 pixels and 8 pixels.

Seventh Embodiment

Here, the description is given for a summary of an image coding device according to the seventh embodiment of the present invention. The image coding device according to any of the above-described embodiments uses arithmetic averaging to calculate a new symbol occurrence probability table from two symbol occurrence probability tables. The image coding device according to the seventh embodiment, however, weighs a symbol occurrence probability table of an image that is spatially closer to a target macroblock, depending on a distance from the target macroblock. Thereby, in the seventh embodiment, the target macroblock is coded based on a symbol occurrence probability table that is more appropriate than that in the sixth embodiment. Therefore, coding efficiency is improved.

This is the summary of the image coding device according to the seventh embodiment.

Since the structure of the image coding device according to the seventh embodiment is the same as the structure of the image coding device according to the sixth embodiment, it will be not explained again.

The following describes processing performed by the image coding device according to the seventh embodiment. The processing performed by the image coding device according to the seventh embodiment differs from the processing performed by the image coding device according to the sixth embodiment in the symbol occurrence probability calculation at S150 in FIG. 12. More specifically, the processing performed by the image coding device according to the seventh embodiment differs from the processing performed by the image coding device according to the sixth embodiment in the step S191 of averaging symbol occurrence probabilities of the upper-left macroblock and the left macroblock in the symbol occurrence probability calculation S150 in the flow of FIG. 20.

Like the third embodiment, the sixth embodiment uses the arithmetic averaging determined by Equation 1. However, the seventh embodiment uses weighted averaging determined by Equation 2 given below. In Equation 2, pStateIdxA denotes a symbol occurrence probability of an upper-left macroblock, and valMPSA denotes a symbol of the upper-left macroblock. Furthermore, pStateIdxB denotes a symbol occurrence probability of a left macroblock, and valMPSB denotes a symbol of the left macroblock. In Equation 2, "a" denotes a spatial distance between: a sub-block 0 that is the first sub-block in a target macroblock; and a sub-block 3 in the upper-left macroblock. In Equation 2, "b" denotes a spatial distance between: the sub-block 0 that is the first sub-block in the target macroblock; and a sub-block 1 in the left macroblock. pStateIdx denotes a symbol occurrence probability of a macroblock for which a symbol occurrence probability is to be calculated, and valMPS denotes a symbol of the macroblock.

```
if(valMPSA = = valMPSB) [
    pStateIdx = ( pStateIdxA × b + pStateIdxB × a ) / (a + b);
    valMPS = valMPSA;
] else [
    pStateIdx = ( - pStateIdxA × b + pStateIdxB × a) / (a + b);
    valMPS = valMPSB;
    if (pStateIdx < 0) [
        pStateIdx = - pStateIdx;
        valMPS = valMPSA;
    ]
]
... (Equation 2)
```

Figure 24:
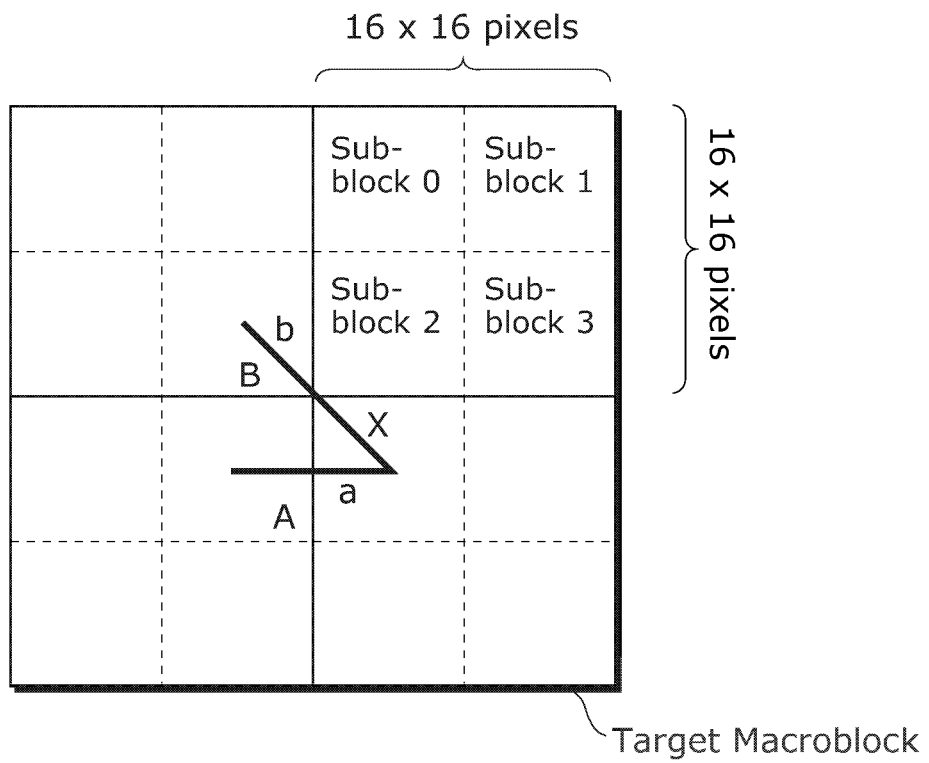
FIG. 24 is a conceptual diagram showing details of processing performed by an image coding device according to a seventh embodiment of the present invention.

As determined by Equation 2, each symbol occurrence probability is weighted by a spatial distance. As shown in FIG. 24, a distance between two sub-blocks is determined based on a center position of each of the sub-blocks, for example.

A distance between a sub-block 3 (B in FIG. 24) in an upper-left macroblock and a sub-block 0 (X in FIG. 24) in a target macroblock is longer than a distance between a sub-block 1 (A in FIG. 24) in a left macroblock and the sub-block 0 (X in FIG. 24) in the target macroblock. Therefore, the symbol occurrence probability calculation unit 7 calculates a symbol occurrence probability so that influence to the symbol occurrence probability is reduced in proportion to a distance to the target macroblock.

This is description for the processing performed by the image coding device according to the seventh embodiment.

As described above, the image coding device according to the seventh embodiment executes weighted averaging based on a spatial distance. Thereby, contribution of a symbol occurrence probability of an image spatially closer to a target image is greater, and contribution of a symbol occurrence probability of an image spatially farther to the target image is smaller. Therefore, a symbol occurrence probability table is more appropriate, and higher coding efficiency than that in the sixth embodiment is achieved.

It should be noted in the seventh embodiment that weighted averaging is applied to the symbol occurrence probability calculation according to the sixth embodiment. However, it is also possible to apply the weighted averaging to the symbol occurrence probability calculation according to any of the third, fourth, and fifth embodiments.

It should be noted in the image coding device according to the seventh embodiment that a picture is not necessarily divided into slices. It is possible to use a more appropriate symbol occurrence probability, even if a picture is not divided into slices as shown in FIG. 17A.

It should also be noted that, as shown in FIG. 17B, the image coding device according to the seventh embodiment may code a target macroblock based on a symbol occurrence probability table only of macroblocks within the same slice. In other words, in the same manner for the situation where a target macroblock is at the far end of a picture, the image coding device according to the seventh embodiment may not use a symbol occurrence probability table that is used to code a macroblock in a different slice, even if a target macroblock is adjacent to a slice border.

It should also be noted as shown in FIG. 17C in that the image coding device according to the seventh embodiment can use a more appropriate symbol occurrence probability even in cording order that is raster order used in H.264 standard or the like.

Especially, when images are coded in raster order as shown in FIG. 17C and the target macroblock X positioned on the far left of a picture is coded based on a symbol occurrence probability table updated for the macroblock B that is spatially close to the target macroblock as shown in FIG. 17A, it is possible to improve coding efficiency.

It should also be noted in the seventh embodiment that the arithmetic coding method defined by H.264 standard is adopted. However, any other method can be adopted as long as the coding is performed based on the symbol occurrence probability table or data similar to the symbol occurrence probability table which is adaptively updated depending on image.

It should also be noted in the seventh embodiment that the image coding device codes image in units of macroblocks each having 16 pixels×16 pixels. However, the image coding device may code image in units each having 8 pixels×8 pixels, 32 pixels×32 pixels, or 64 pixels×16 pixels, for example. Each of the sub-blocks, which are finer than the macroblocks, may have any size, such as 2 pixels×2 pixels or 4 pixels×4 pixels.

It should also be noted that it has been described in the seventh embodiment that images in a slice are coded in a zigzag order. However, the coding order may be raster order defined by H.264 standard or any other orders.

It should also be noted in the seventh embodiment that the above description has been given for coding, but it is, of course, possible to perform decoding by reversing the steps in the coding.

It should also be noted in the seventh embodiment that the coding is based on H.264 standard, but the coding may be based on any other similar standards.

It should also be noted in the seventh embodiment that the image coding device uses pStateIdx to calculate a symbol occurrence probability. However, pStateIdx does not linearly correspond to an actual symbol occurrence probability. It is therefore possible that the image coding device transforms pStateIdx into an actual symbol occurrence probability to be used in the calculation, and then inversely transforms the symbol occurrence probability to the original pStateIdx. It is also possible that the image coding device calculates a symbol occurrence probability by using a table that is used to calculate a symbol occurrence probability for each pair of pStateIdx values.

It should also be noted in the seventh embodiment that a symbol occurrence probability is calculated for the first sub-block in the target macroblock. However, a symbol occurrence probability may be calculated in units of smaller images such as bocks each having 8 pixels and 8 pixels.

Eighth Embodiment

Here, the description is given for a summary of an image coding device according to the eighth embodiment of the present invention. It has been described in the third embodiment that the image coding device codes a target macroblock based on a symbol occurrence probability table that is always calculated from symbol occurrence probability tables of an immediately-above macroblock and a left macroblock. This method can improve coding efficiency. However, the image coding device according to the third embodiment needs to hold a large number of symbol occurrence probability tables of macroblocks above the target macroblock. The image coding device according to the eighth embodiment restricts use of a symbol occurrence probability table immediately above a target macroblock. As a result, it is possible to reduce the number of stored symbol occurrence probability tables.

This is the summary of the image coding device according to the eighth embodiment.

Since the structure of the image coding device according to the eighth embodiment is the same as the structure of the image coding device according to the third embodiment, it will be not explained again.

The following describes a structure of the image coding device according to the eighth embodiment. The processing performed by the image coding device according to the eighth embodiment differs from the processing performed by the image coding device according to the third embodiment in the symbol occurrence probability calculation at S150 in FIG. 12 and the symbol occurrence probability outputting at S155 in FIG. 12.

Figure 25:
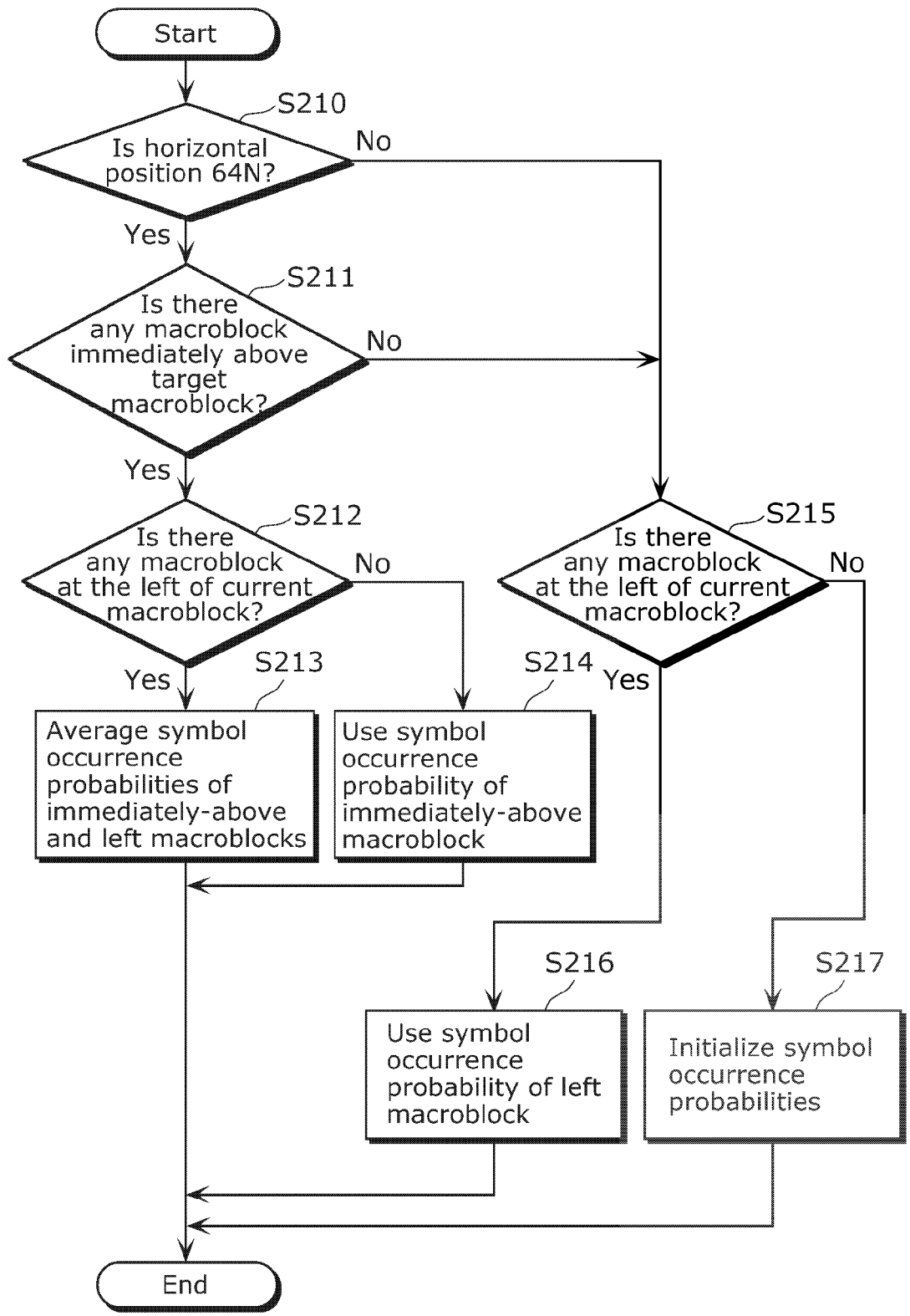
FIG. 25 is a flowchart of symbol occurrence probability initialization according to an eighth embodiment of the present invention.

The symbol occurrence probability calculation at S150 in FIG. 12 according to the eighth embodiment is described with reference to FIG. 25. At the beginning, the arithmetic coding unit 1 determines whether or not a horizontal position of a pixel at the immediately upper left of a target macroblock is 64N (where N is a natural number) (S210). If the horizontal position is 64N (Yes at S210), then the arithmetic coding unit 1 determines whether or not there is a macroblock immediately above the target macroblock (S211). If there is a macroblock immediately above the target macroblock (Yes at S211), then the arithmetic coding unit 1 determines whether or not there is a macroblock at the immediately left of the target macroblock (S212).

If there is a macroblock at the immediate left of the macroblock (Yes at S212), this means that the horizontal position is 64N and there are macroblocks immediately above and at the left of the target macroblock. In this case, the symbol occurrence probability calculation unit 7 averages two symbol occurrence probabilities obtained from the immediately-above macroblock and the left macroblock according to Equation 1 to calculate a symbol occurrence probability table. Then, the symbol occurrence probability calculation unit 7 writes the calculated symbol occurrence probability table into the symbol occurrence probability storage unit 4 (S213).

On the other hand, if there is no macroblock at the immediate left of the target macroblock (No at S212), this means that the horizontal position is 64N and there is a macroblock immediately above the target macroblock but not at the left of the target macroblock. In this case, the symbol occurrence probability calculation unit 7 writes the symbol occurrence probability table of the immediately-above macroblock directly into the symbol occurrence probability storage unit 4 (S214).

On the other hand, if the horizontal position is not 64N (No at S210) or if there is no macroblock immediately above the target macroblock (No at S211), then the arithmetic coding unit 1 determines whether or not there is a macroblock at the immediate left of the target macroblock (S215). If there is a macroblock at the immediate left of the target macroblock (Yes at S215), then the symbol occurrence probability calculation unit 7 writes the symbol occurrence probability table of the left macroblock directly into the symbol occurrence probability storage unit 4 (S216).

If there is no macroblock at the immediate left of the target macroblock (No at S215), this means that there is no macroblock immediately above nor at the left of the target macroblock. In this case, the arithmetic coding unit 1 initializes a symbol occurrence probability table (S217). The initialization may be the method defined by H.264 standard. It is possible that the symbol occurrence probability storage unit 4 initializes the stored symbol occurrence probability table. For the initialization of a symbol occurrence probability table, it is also possible that the symbol occurrence probability calculation unit 7 generates an initialized symbol occurrence probability table and writes the generated table into the symbol occurrence probability storage unit 4.

Figure 26:
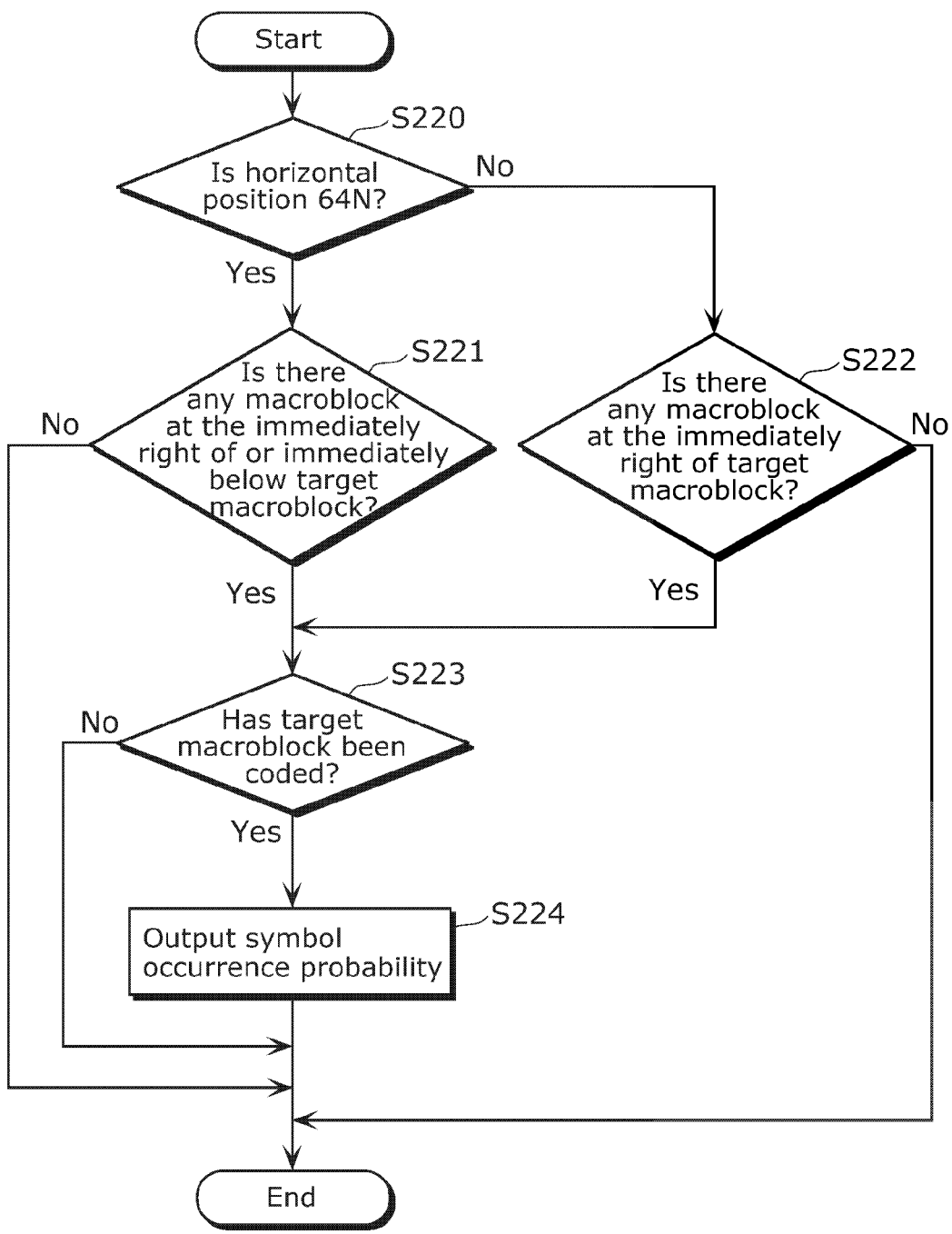
FIG. 26 is a flowchart of symbol occurrence probability outputting according to the eighth embodiment of the present invention.

The symbol occurrence probability outputting at S155 in FIG. 12 according to the eighth embodiment is described with reference to a flowchart of FIG. 26. As shown in FIG. 26, at the beginning, the arithmetic coding unit 1 determines whether or not a horizontal position of a pixel at the immediately upper left of a target macroblock is 64N (where N is a natural number) (S220). If the horizontal position is 64N (Yes at S220), then the arithmetic coding unit 1 determines whether or not there is a macroblock at the immediate right of or immediately below the target macroblock (S221). If there is neither macroblock at the immediately right of nor immediately below the target macroblock (No at S221), then the arithmetic coding unit 1 completes the processing.

On the other hand, if the horizontal position is not 64N (No at S220), then the arithmetic coding unit 1 determines whether or not there is a macroblock at the immediate right of the target macroblock (S222). If there is no macroblock at the immediate right of the target macroblock (No at S222), then the arithmetic coding unit 1 completes the processing.

If the horizontal position is 64N and there is a macroblock at the immediate right of or immediately below the target macroblock (Yes at S221), or if the horizontal position is not 64N and there is a macroblock only at the right of the target macroblock (Yes at S222), then the arithmetic coding unit 1 determines whether or not the target macroblock has already been coded (S223). If the target macroblock has not yet been coded (No at S223), then the arithmetic coding unit 1 completes the processing. On the other hand, if the target macroblock has already been coded (Yes at S223), then the arithmetic coding unit 1 outputs a symbol occurrence probability table of the target macroblock (S224).

Figure 27A:
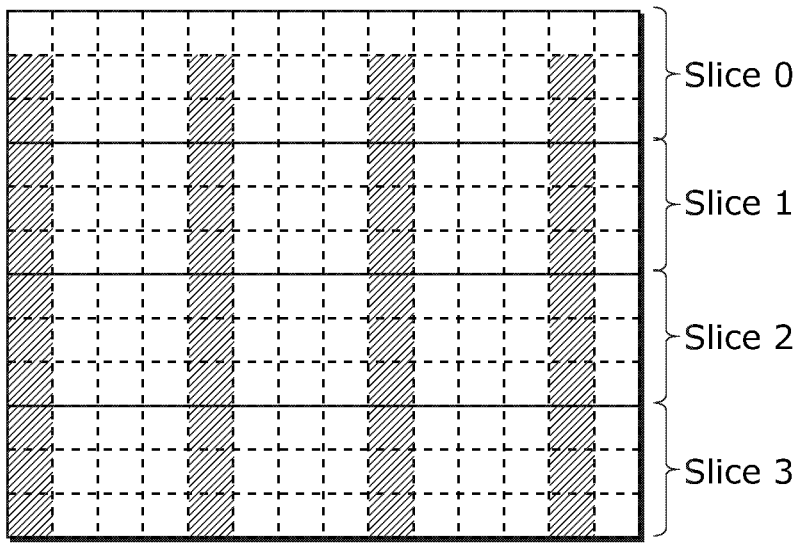
FIG. 27A is a conceptual diagram showing processing performed by an image coding device according to the eighth embodiment of the present invention.

The processing for an entire picture is described with reference to FIG. 27A. As shown in FIG. 27A, it is assumed that a picture is divided into four slices, and that each of the slices is divided into macroblocks each having 16 pixels×16 pixels. Each of shaded macroblocks in FIG. 27A shows a macroblock for which a symbol occurrence probability table is to be calculated using a symbol occurrence probability table of a macroblock immediately above the macroblock. Each of top macroblocks in a picture is not coded based on a symbol occurrence probability table of a macroblock immediately above the top macroblock, because there is no macroblock above the top macroblock. Regarding other macroblocks except the top macroblocks, one of four macroblocks in a horizontal direction is coded based on a symbol occurrence probability table of a macroblock immediately above the macroblock.

Figure 27B:
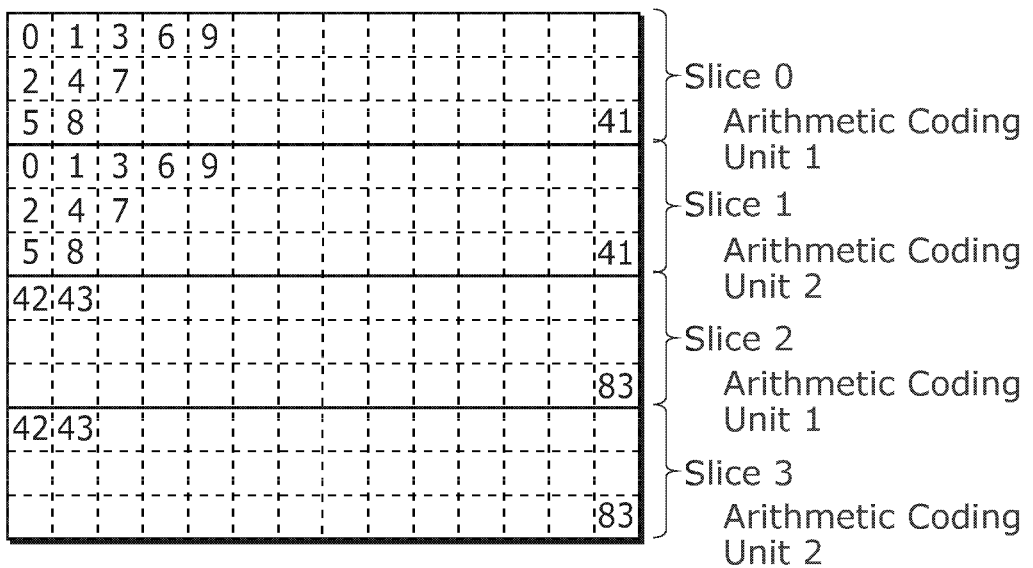
FIG. 27B is a conceptual diagram showing processing performed by the image coding device according to the eighth embodiment of the present invention.

Here, it is assumed as shown in FIG. 27B that the arithmetic coding unit 1 processes a slice 0 and the arithmetic coding unit 2 processes a slice 1. Under the assumption, the arithmetic coding unit 1 starts processing a slice 2 after processing the slice 0. Numerals assigned to macroblocks in FIG. 27B represent order of coding the macroblocks by the arithmetic coding units 1 and 2. Here, when the arithmetic coding unit 1 codes a macroblock 24 in the slice 2, the coding needs a symbol occurrence probability table of a macroblock 5 in the slice 1. More specifically, during processing of the slice 1, the arithmetic coding unit 2 needs to keep holding symbol occurrence probability tables of macroblocks arranged in a horizontal direction from the macroblock 5 on the far left of the slice 1. In the eighth embodiment, however, the symbol occurrence probability tables are held only for every four macroblocks. As a result, the held symbol occurrence probability tables are reduced to one quarter.

Figure 28:
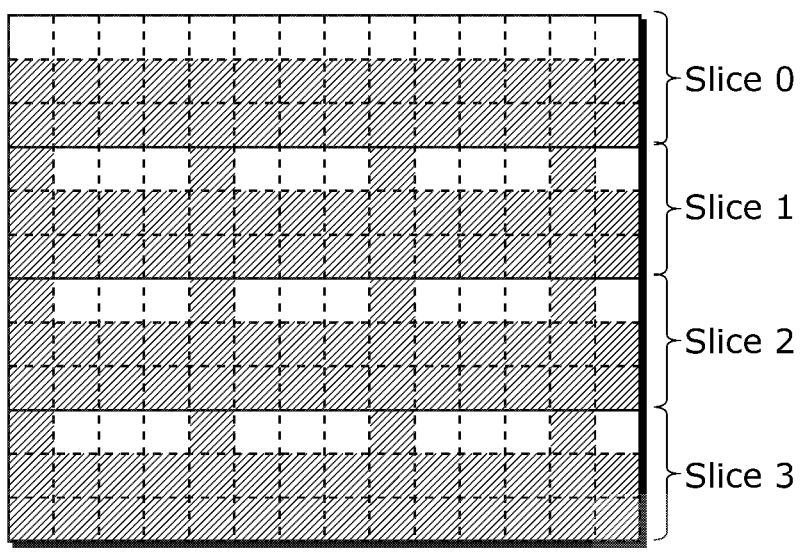
FIG. 28 is a conceptual diagram showing a variation of processing performed by the image coding device according to the eighth embodiment of the present invention.

Moreover, a symbol occurrence probability table should be exchanged between the arithmetic coding unit 1 and the arithmetic coding unit 2 only when a macroblock is coded based on information of a macroblock in a different slice. Therefore, the example shown in FIG. 28 is also possible. Regarding macroblocks having an upper border that is a slice border, one of four macroblocks is coded based on a symbol occurrence probability table of a corresponding immediately-above macroblock. On the other hand, regarding the other macroblocks in the same slice, each of the macroblocks is coded based on a symbol occurrence probability table of a corresponding immediately-above macroblock.

This is the description for processing performed by the image coding device according to the eighth embodiment.

As described above, the image coding device according to the eighth embodiment restricts use of a symbol occurrence probability table of an immediately-above macroblock only for every four macroblocks in a horizontal direction. The image coding device according to the eighth embodiment codes a target macroblock based on a symbol occurrence probability table of a macroblock positioned spatially closer to the target macroblock. Thereby, the image coding device according to the eighth embodiment can improve coding efficiency and reduce the held symbol occurrence probability tables.

It should be noted that the eighth embodiment may use weight averaging in the same manner as described in the seventh embodiment.

It should also be noted in the image coding device according to the eighth embodiment that a picture is not necessarily divided into slices. It is possible to use a more appropriate symbol occurrence probability, even if a picture is not divided into slices as shown in FIG. 17A.

It should also be noted that, as shown in FIG. 17B, the image coding device according to the eighth embodiment may code a target macroblock based on a symbol occurrence probability table only of macroblocks within the same slice. In other words, in the same manner for the situation where a target macroblock is at the far end of a picture, the image coding device according to the eighth embodiment may not use a symbol occurrence probability table that is used to code a macroblock in a different slice, even if a target macroblock is adjacent to a slice border.

It should also be noted as shown in FIG. 17C in that the image coding device according to the eighth embodiment can use a more appropriate symbol occurrence probability even in cording order that is raster order used in H.264 standard or the like.

Especially, when images are coded in raster order as shown in FIG. 17C and the target macroblock X positioned on the far left of a picture is coded based on a symbol occurrence probability table updated for the macroblock B that is spatially close to the target macroblock as shown in FIG. 17A, it is possible to improve coding efficiency.

It should also be noted in the eighth embodiment that the arithmetic coding method defined by H.264 standard is adopted. However, any other method can be adopted as long as the coding is performed based on the symbol occurrence probability table or data similar to the symbol occurrence probability table which is adaptively updated depending on image.

It should also be noted in the eighth embodiment that the image coding device codes image in units of macroblocks each having 16 pixels×16 pixels. However, the image coding device may code image in units each having 8 pixels×8 pixels, 32 pixels×32 pixels, or 64 pixels×16 pixels, for example. Each of the sub-blocks, which are finer than the macroblocks, may have any size, such as 2 pixels×2 pixels or 4 pixels×4 pixels.

It should also be noted that it has been described in the eighth embodiment that images in a slice are coded in a zigzag order. However, the coding order may be raster order defined by H.264 standard or any other orders.

It should also be noted in the eighth embodiment that the above description has been given for coding, but it is, of course, possible to perform decoding by reversing the steps in the coding.

It should also be noted in the eighth embodiment that the coding is based on H.264 standard, but the coding may be based on any other similar standards.

It should also be noted in the eighth embodiment that the image coding device uses pStateIdx to calculate a symbol occurrence probability. However, pStateIdx does not linearly correspond to an actual symbol occurrence probability. It is therefore possible that the image coding device transforms pStateIdx into an actual symbol occurrence probability to be used in the calculation, and then inversely transforms the symbol occurrence probability to the original pStateIdx. It is also possible that the image coding device calculates a symbol occurrence probability by using a table that is used to calculate a symbol occurrence probability for each pair of pStateIdx values.

It should also be noted in the eighth embodiment that a symbol occurrence probability is calculated for the first macroblock included in each slice or picture. However, a symbol occurrence probability may be calculated in units of smaller images such as bocks each having 8 pixels and 8 pixels.

It should also be noted in the eighth embodiment that one of four macroblocks is coded based on a symbol occurrence probability table of a corresponding immediately-above macroblock. However, it is also possible that one of any other number of macroblocks, for example, one of two macroblocks or one of eight macroblocks, may be coded based on a symbol occurrence probability table of a corresponding immediately-above macroblock. The determination as to whether or not to code a target macroblock based on a symbol occurrence probability table of an immediately-above macroblock may be made according to a spatial position of the target macroblock, or according to any other conditions.

Ninth Embodiment

First, the description is given for a summary of an image coding device according to the ninth embodiment of the present invention. The image coding device according to the ninth embodiment combines the arithmetic coding described in the first embodiment with pixel coding.

This is the summary of the image coding device according to the ninth embodiment.

Figure 29:
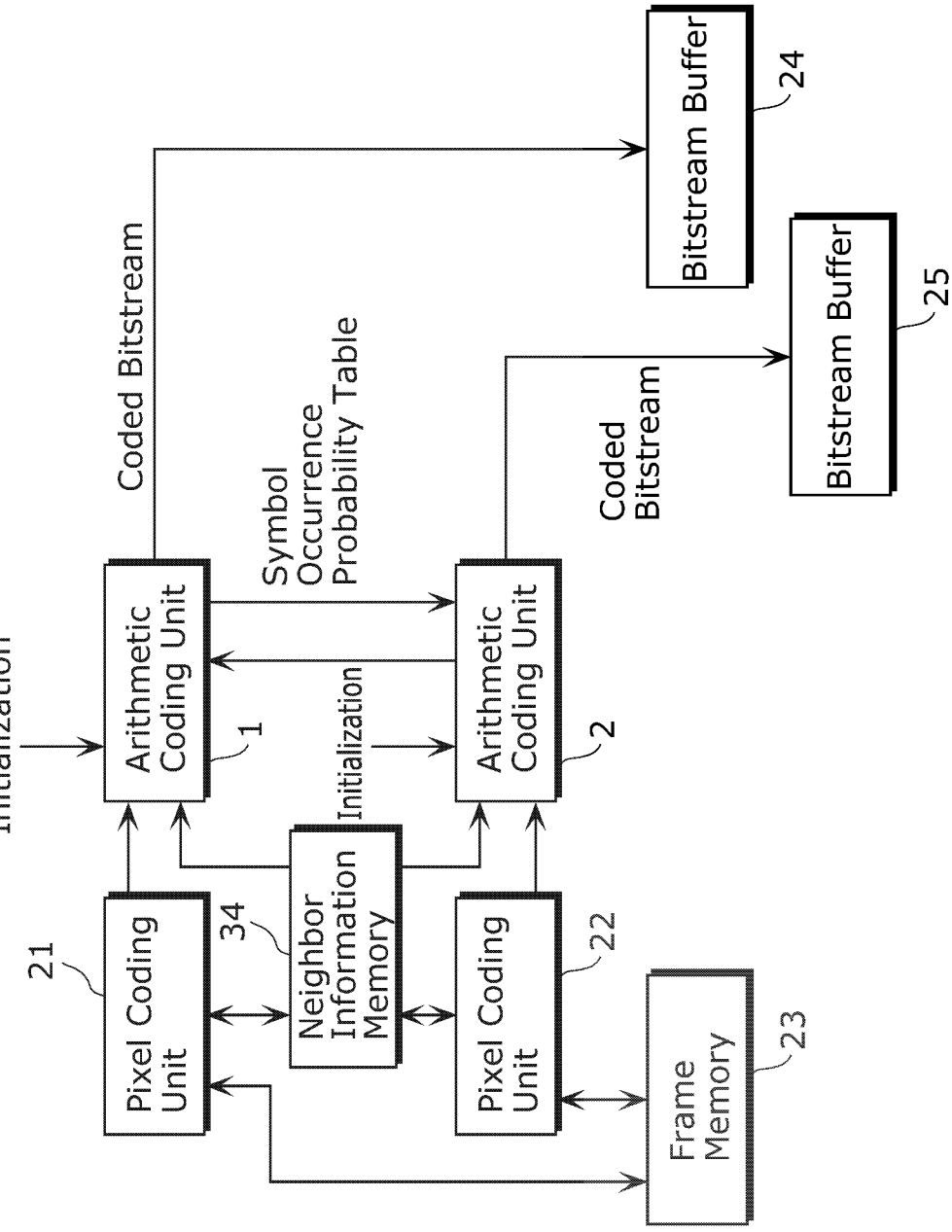
FIG. 29 is a block diagram showing a structure of an image coding device according to a ninth embodiment of the present invention.

The following describes processing performed by the image coding device according to the ninth embodiment. FIG. 29 shows a structure of the image coding device according to the ninth embodiment. The image coding device according to the ninth embodiment includes a frame memory 23, pixel coding unit 21 and 22, the arithmetic coding units 1 and 2, a neighbor information memory 34, and bitstream buffers 24 and 25.

The frame memory 23 stores input images and locally decoded images. Each of the pixel coding units 21 and 22 retrieves a part of an image from the frame memory and codes the retrieved part. Each of the arithmetic coding units 1 and 2 performs arithmetic coding. The neighbor information memory 34 stores information of neighboring macroblocks of a target macroblock. The information is used in coding of the target macroblock. Each of the bitstream buffers 24 and 25 stores a coded bitstream that has been arithmetic coded.

An internal structure of each of the arithmetic coding units 1 and 2 is the same as shown in FIG. 2 according to the first embodiment. Therefore, it will not be described again.

Figure 30:
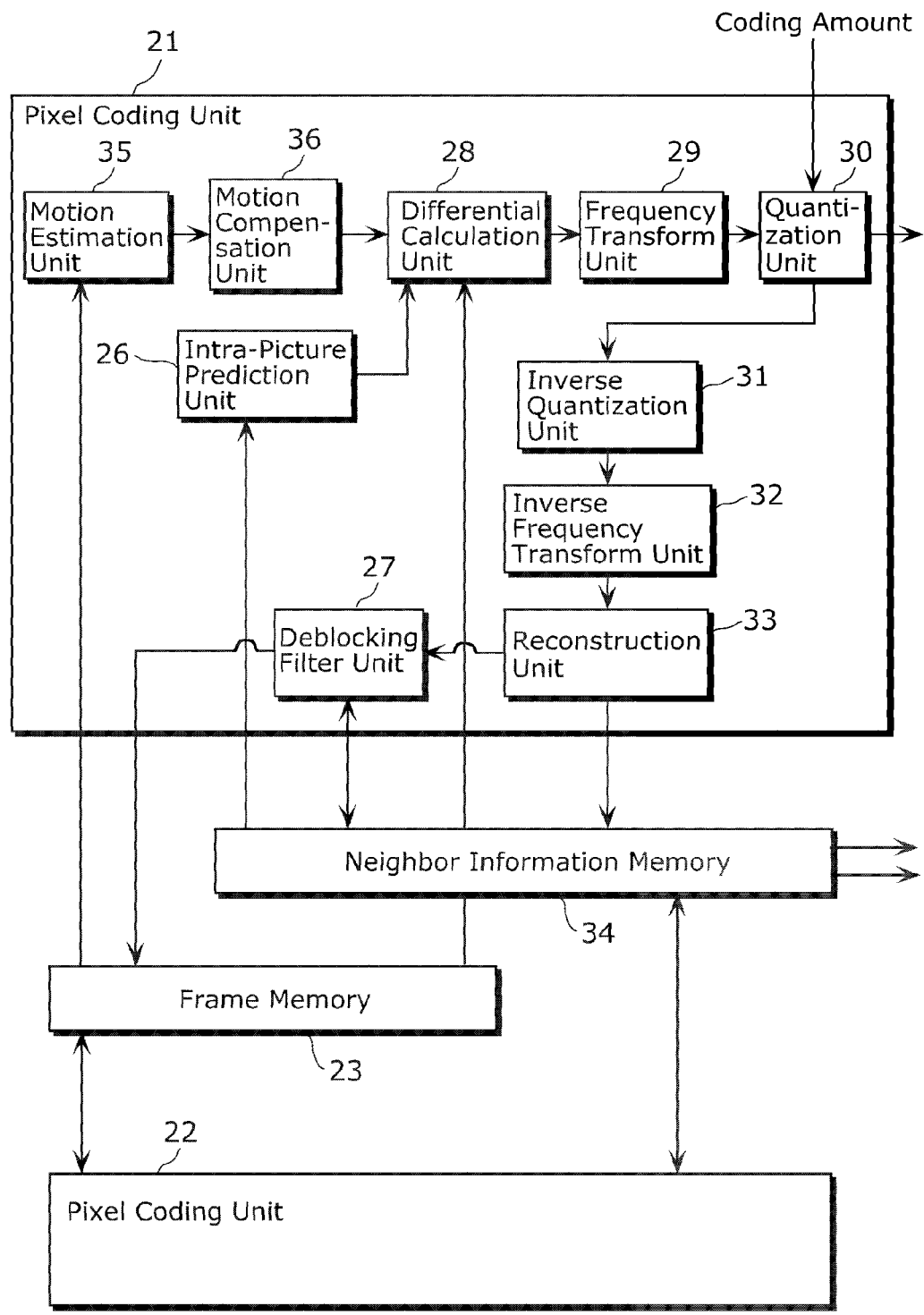
FIG. 30 is a block diagram showing a structure of a pixel coding unit according to the ninth embodiment of the present invention.

FIG. 30 is a block diagram of the pixel coding unit 21 according to the ninth embodiment. The units in FIG. 30 which are identical to the units in FIG. 29 will not be described again. The pixel coding unit 21 includes a motion estimation unit 35, a motion compensation unit 36, an intra-picture prediction unit 26, a differential calculation unit 28, a frequency transform unit 29, a quantization unit 30, an inverse quantization unit 31, an inverse frequency transform unit 32, a reconstruction unit 33, and a deblocking filter unit 27. The motion estimation unit 35 performs motion estimation.

The motion compensation unit 36 performs motion compensation based on a motion vector generated by the motion estimation, thereby generating a prediction image. The intra-picture prediction unit 26 performs intra-picture prediction to generate another prediction image. The differential calculation unit 28 generates a difference between an input image and a prediction image. The frequency transform unit 29 performs frequency transform. The quantization unit 30 performs quantization to reach a target bit rate depending on a generated coding amount. The inverse quantization unit 31 performs inverse quantization. The inverse frequency transform unit 32 performs inverse frequency transform. The reconstruction unit 33 reconstructs an image from a prediction image and a result of inverse frequency transform. The deblocking filter unit 27 performs deblocking filtering on the reconstructed decoded result.

Here, the pixel coding unit 22 is the same as the pixel coding unit 21. Therefore, the pixel coding unit 22 is not shown in FIG. 30.

This is the description for the image coding device according to the ninth embodiment.

The following describes processing performed by the image coding device according to the ninth embodiment.

Figure 31:
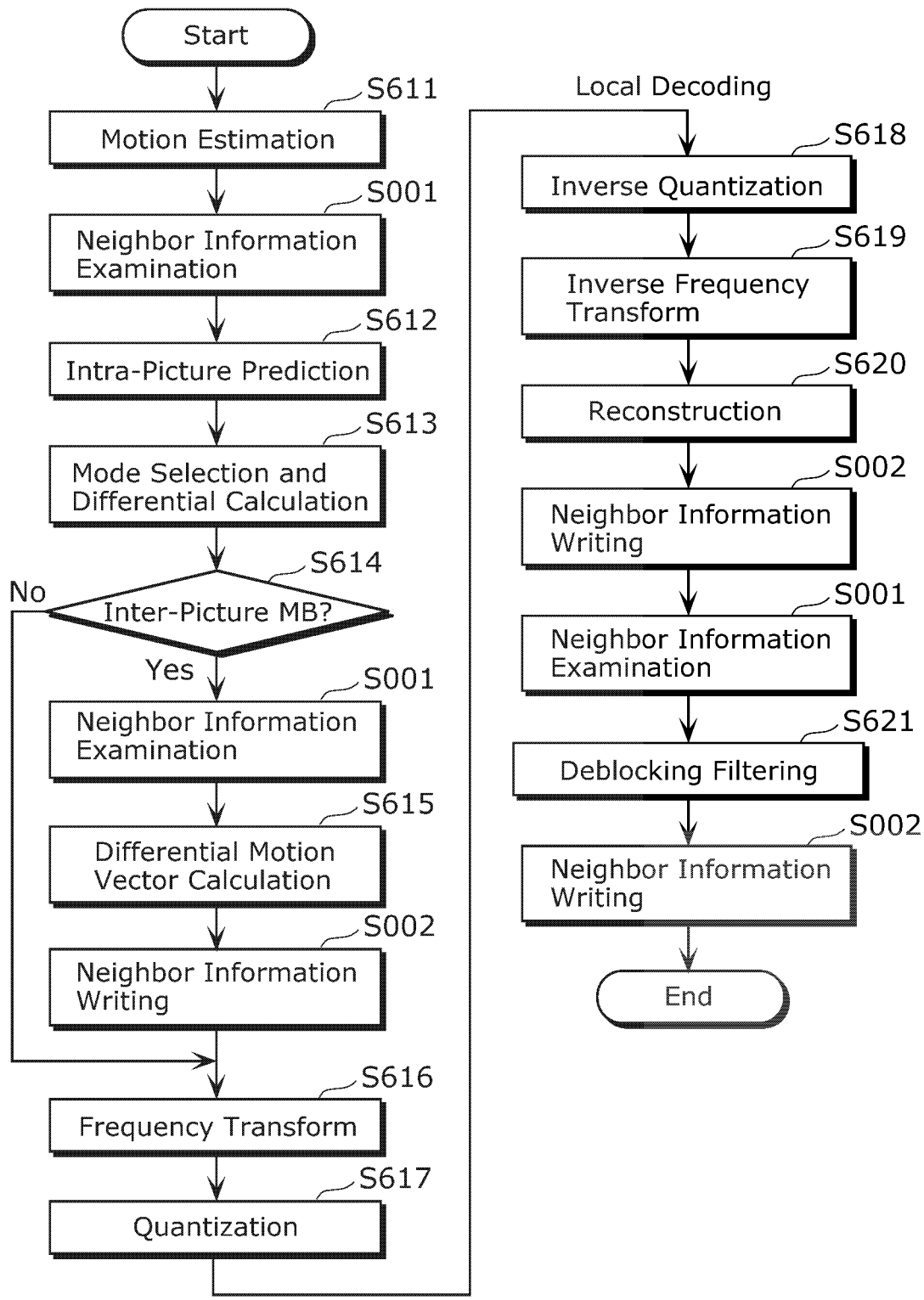
FIG. 31 is a flowchart of processing performed by the pixel coding unit according to the ninth embodiment of the present invention.

FIG. 31 is a flowchart of pixel coding processing performed by the pixel coding unit 21 shown in FIG. 29.

At the beginning, the motion estimation unit 35 estimates (detects) a part of a locally decoded picture which has the highest correlation with a target macroblock. Then, the motion compensation unit 36 generates a prediction image (S611).

Next, the intra-picture prediction unit 26 examines the neighbor information memory for intra-picture prediction (S001). The neighbor information examination at S001 is processing for determining whether or not the neighbor information memory 34 stores information necessary for intra-picture prediction. The intra-picture prediction unit 26 generates an intra-picture prediction image using images of neighboring macroblocks shown in FIG. 32 (S612).

Next, the differential calculation unit 28 determines which has a smaller coding amount, an inter-picture prediction macroblock generated by the motion estimation or an intra-picture prediction macroblock generated by the intra-picture prediction. Based on the determination result, the differential calculation unit 28 selects, as a coding mode, between the inter-picture prediction macroblock and the intra-picture prediction macroblock, and calculates differential data between the selected prediction image and the target macroblock (S613).

If the inter-picture prediction macroblock is selected as the coding mode (Yes at S614), then the differential calculation unit 28 examines the neighbor information (S001). The neighbor information examination at S001 is processing for determining whether or not the neighbor information memory 34 stores information necessary for calculation of a differential motion vector.

If it is determined that the neighbor information memory 34 stores information necessary for calculation of a differential motion vector, then the differential calculation unit 28 calculates the differential motion vector (S615). In the differential motion vector calculation, mvd shown in FIG. 33 may be calculated.

When the differential motion vector has been calculated, the differential calculation unit 28 writes the calculated motion vector into the neighbor information memory 34 (S002). Here, the neighbor information writing is performed if the neighbor information memory 34 has an available space. Otherwise, the neighbor information writing waits until the neighbor information memory 34 has an available space.

Next, the frequency transform unit 29 performs frequency transform on differential data which has been calculated by the differential calculation unit 28 (S616).

The quantization unit 30 quantizes the data on which the frequency transform has been performed (S617). Here, the quantization unit 30 decides a quantization parameter based on a generated coding amount which has been calculated by the arithmetic coding unit 1, and then performs quantization using the quantized parameter.

If the generated coding amount is predicted to be greater than a predetermined target coding amount, then the quantization unit 30 increases a quantization width to reduce the generated coding amount. On the other hand, if the generated coding amount is predicted to be smaller than the predetermined target coding amount, the quantization unit 30 decreases the quantization width to increase the generated coding amount. This feedback control causes the quantization unit 30 to adjust a generated coding amount to be closer to the target coding amount.

Eventually, the pixel coding performed by the pixel coding unit 21 for generating a coded stream is completed. However, local decoding is necessary to match a reference image with a reference image in an image decoding device. Next, the local decoding is described.

In the local decoding, at the beginning, the inverse quantization unit 31 performs inverse quantization on the target macroblock (S618).

Next, the inverse frequency transform unit 32 performs inverse frequency transform on the target macroblock. (S619).

In the case of the inter-picture prediction macroblock, then the reconstruction unit 33 reconstructs an image from (a) the data on which the inverse frequency transform has been performed and (b) the reference image which has been generated by the motion compensation unit 36 (S620). On the other hand, in the case of the intra-picture prediction macroblock, then the reconstruction unit 33 reconstructs an image from (a) the data for which the inverse frequency transform has been performed and (b) the reference image which has been generated by the intra-picture prediction unit 26 (S620).

After the reconstruction, the reconstruction unit 33 performs neighbor information writing for intra-picture prediction of a next macroblock (S002). Here, the neighbor information writing is performed if the neighbor information memory 34 has an available space. Otherwise, the neighbor information writing waits until the neighbor information memory 34 has an available space.

Next, the deblocking filter unit 27 examines neighbor information for deblocking filtering (S001). The neighbor information examination at S001 is processing for determining whether or not the neighbor information memory 34 stores information necessary for deblocking filtering.

If the neighbor information memory 34 stores information necessary for deblocking filtering, then the deblocking filter unit 27 performs deblocking filtering on the reconstructed image, and stores the resulting image into the frame memory 23 (S621).

After the deblocking filtering, the deblocking filter unit 27 performs neighbor information writing (S002). Then, the pixel coding unit 21 completes the pixel coding. Here, the neighbor information writing is performed if the neighbor information memory 34 has an available space. Otherwise, the neighbor information writing waits until the neighbor information memory 34 has an available space.

The processing performed by the pixel coding unit 22 is the same as the processing performed by the pixel coding unit 21. Therefore, it will not be described again.

Furthermore, the processing performed by each of the arithmetic coding units 1 and 2 is the same as the processing described in the first embodiment. Therefore, it will not be described again.

This is the description for the processing performed by the image coding device according to the ninth embodiment.

As described above, the image coding device according to the ninth embodiment can combine the arithmetic coding with the pixel coding.

It should be noted in the ninth embodiment that the aspect for realizing the arithmetic coding may be any aspect in the above-described embodiments.

It should also be noted in the ninth embodiment that the arithmetic coding method defined by H.264 standard is adopted. However, any other method can be adopted as long as the coding is performed based on the symbol occurrence probability table or data similar to the symbol occurrence probability table which is adaptively updated depending on image.

It should also be noted in the ninth embodiment that the image coding device codes image in units of macroblocks each having 16 pixels×16 pixels. However, the image coding device may code image in units each having 8 pixels×8 pixels, 32 pixels×32 pixels, or 64 pixels×16 pixels, for example.

It should also be noted that it has been described in the ninth embodiment that images in a slice are coded in a zigzag order. However, the coding order may be raster order defined by H.264 standard or any other orders.

It should also be noted in the ninth embodiment that the coding is based on H.264 standard, but the coding may be based on any other similar standards.

It should also be noted in the ninth embodiment that the storage unit in which data is stored is a memory or buffer, but the storage unit may be any type of a memory. The storage unit may be storage means using any different schemes, such as a flip-flop and a hard disk.

It should also be noted that the image coding device according to the ninth embodiment may be implemented as a hardware circuit or software in a processor. It should also be noted that the image coding device according to the ninth embodiment may be implemented in a plurality of processors or in a single processor.

It should also be noted that the image coding device according to the ninth embodiment includes the two bitstream buffers 24 and 25. Another processing unit in the image coding device may read two bitstreams from the two bitstream buffers 24 and 25, and convert the two bitstreams into a single bitstream. In addition, a system encoder may read bitstreams from the two bitstream buffers 24 and 25, and convert the bitstreams into a single bitstream.

Tenth Embodiment

Here, the description is given for a summary of an image decoding device according to the tenth embodiment of the present invention. The image decoding device according to the tenth embodiment corresponds to the image coding device according to the ninth embodiment.

This is the summary of the image decoding device according to the tenth embodiment.

The following describes a structure of the image decoding device according to the tenth embodiment.

Figure 34:
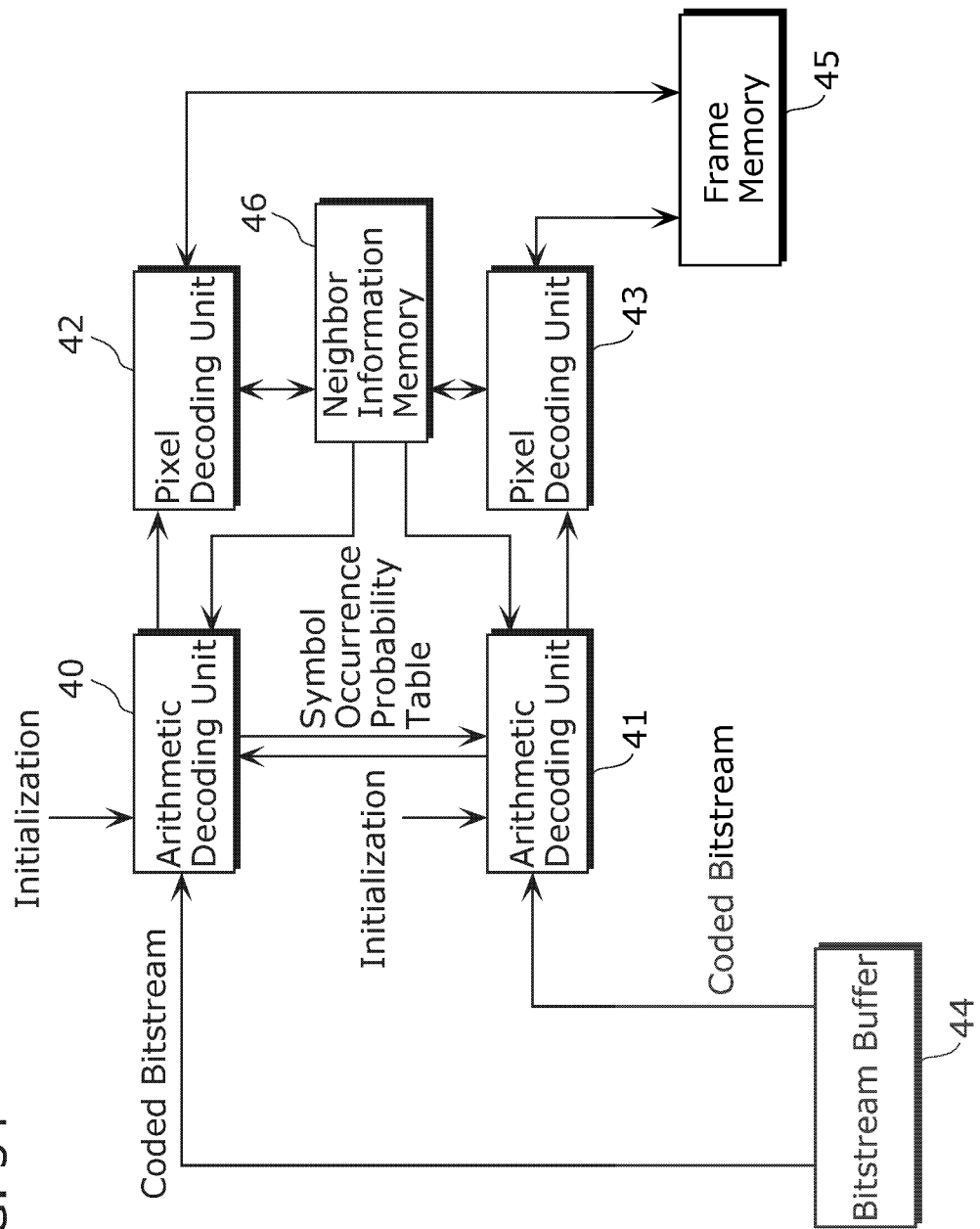
FIG. 34 is a block diagram showing a structure of an image decoding device according to a tenth embodiment of the present invention.

FIG. 34 is a structure of the image decoding device according to the tenth embodiment. The image decoding device according to the tenth embodiment includes a bitstream buffer 44, arithmetic decoding units 40 and 41, pixel decoding units 42 and 43, a neighbor information memory 46, and a frame memory 45. The bitstream buffer 44 stores coded bitstreams. Each of the arithmetic decoding units 40 and 41 performs arithmetic decoding. Each of the pixel decoding units 42 and 43 decodes pixel data. The neighbor information memory 46 stores information of neighboring macroblocks of a target macroblock. The information has been used in coding of the target macroblock. The frame memory 45 stores decoded images.

Figure 35:
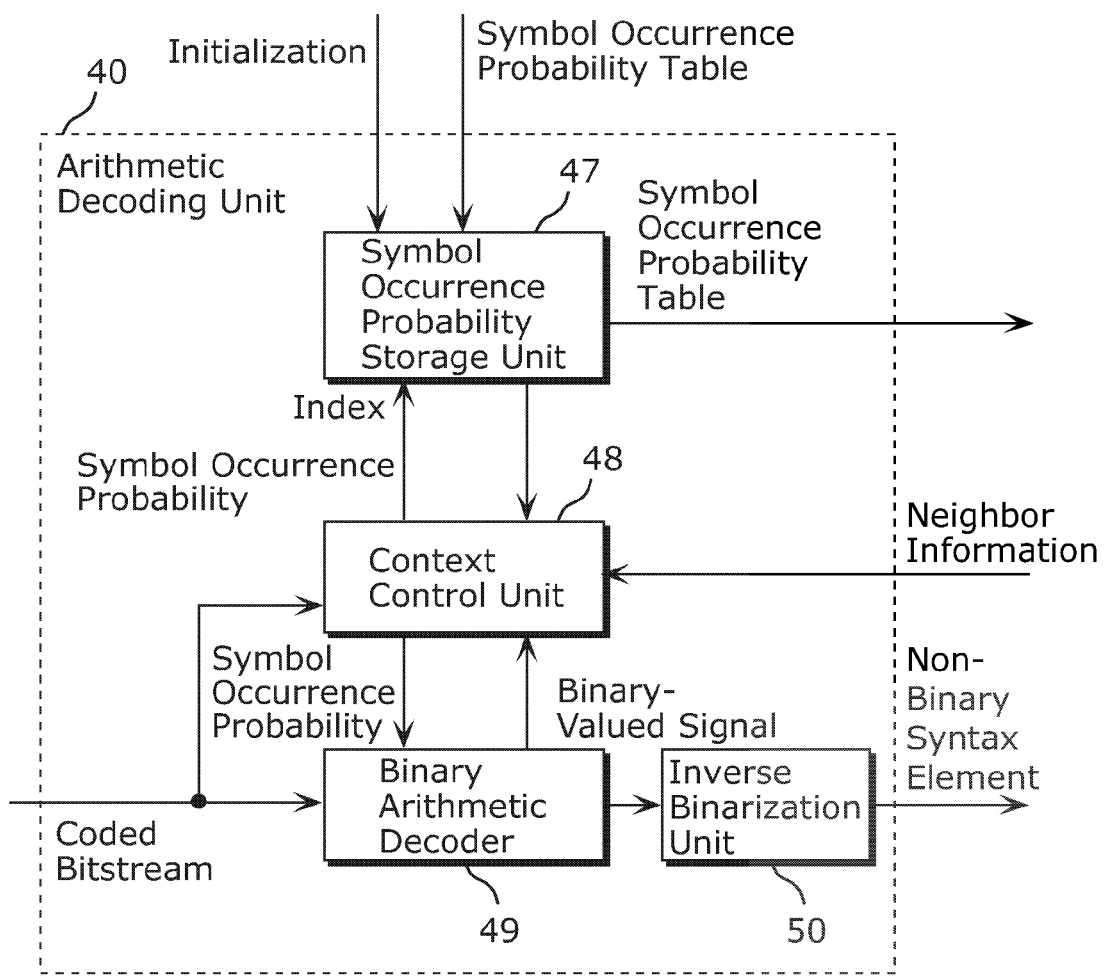
FIG. 35 is a block diagram showing a structure of an arithmetic decoding unit according to the tenth embodiment of the present invention.

FIG. 35 shows an internal structure of the arithmetic decoding unit 40 shown in FIG. 34. The arithmetic decoding unit 40 includes a symbol occurrence probability storage unit 47, a context control unit 48, a binary arithmetic decoder 49, and an inverse binarization unit 50. The symbol occurrence probability storage unit 47 stores symbol occurrence probabilities. The context control unit 48 determines which symbol occurrence probability is to be used among the symbol occurrence probabilities stored in the symbol occurrence probability storage unit 47. Then, the context control unit 48 reads the determined symbol occurrence probability from the symbol occurrence probability storage unit 47. The binary arithmetic decoder 49 performs arithmetic decoding. The inverse binarization unit 50 converts binary-valued signal into non-binary syntax element.

The arithmetic decoding unit 41 is the same as the arithmetic decoding unit 40. Therefore, the arithmetic decoding unit 41 will not be described.

Figure 36:
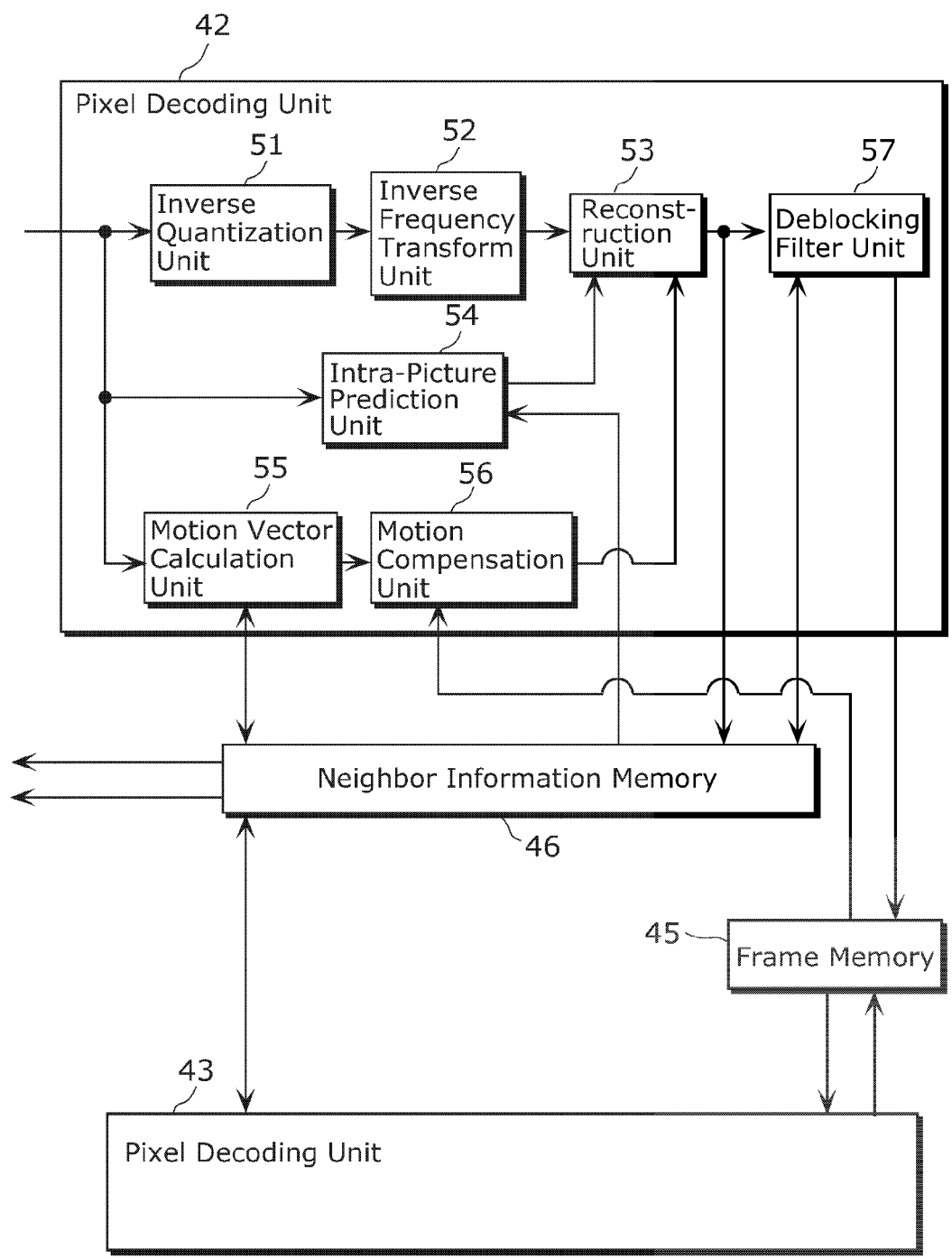
FIG. 36 is a block diagram showing a structure of a pixel decoding unit according to the tenth embodiment of the present invention.

FIG. 36 is a block diagram of the pixel decoding unit 42 according to the tenth embodiment. The units in FIG. 35 which are identical to the units in FIG. 34 will not be described again. The pixel decoding unit 42 includes an inverse quantization unit 51, an inverse frequency transform unit 52, a reconstruction unit 53, an intra-picture prediction unit 54, a motion vector calculation unit 55, a motion compensation unit 56, and a deblocking filter unit 57.

The inverse quantization unit 51 performs inverse quantization. The inverse frequency transform unit 52 performs inverse frequency transform. The reconstruction unit 53 reconstructs an image from (a) data on which the inverse frequency transform has been performed and (b) prediction data on which either motion compensation or intra-picture prediction has been performed.

The intra-picture prediction unit 54 generates prediction data from an image on the upper part or left part of a picture. The motion vector calculation unit 55 calculates a motion vector. The motion compensation unit 56 obtains a reference image of the position indicated by the motion vector, and generates prediction data by filtering. The deblocking filter unit 57 filters data of the reconstructed image to reduce block noise.

Here, the inside structure of the pixel decoding unit 43 is the same as that of the pixel decoding unit 42. Therefore, the pixel decoding unit 43 is not shown in FIG. 36.

This is the description for the structure of the image decoding device according to the tenth embodiment.

The following describes processing performed by the image decoding device according to the tenth embodiment.

Figure 37:
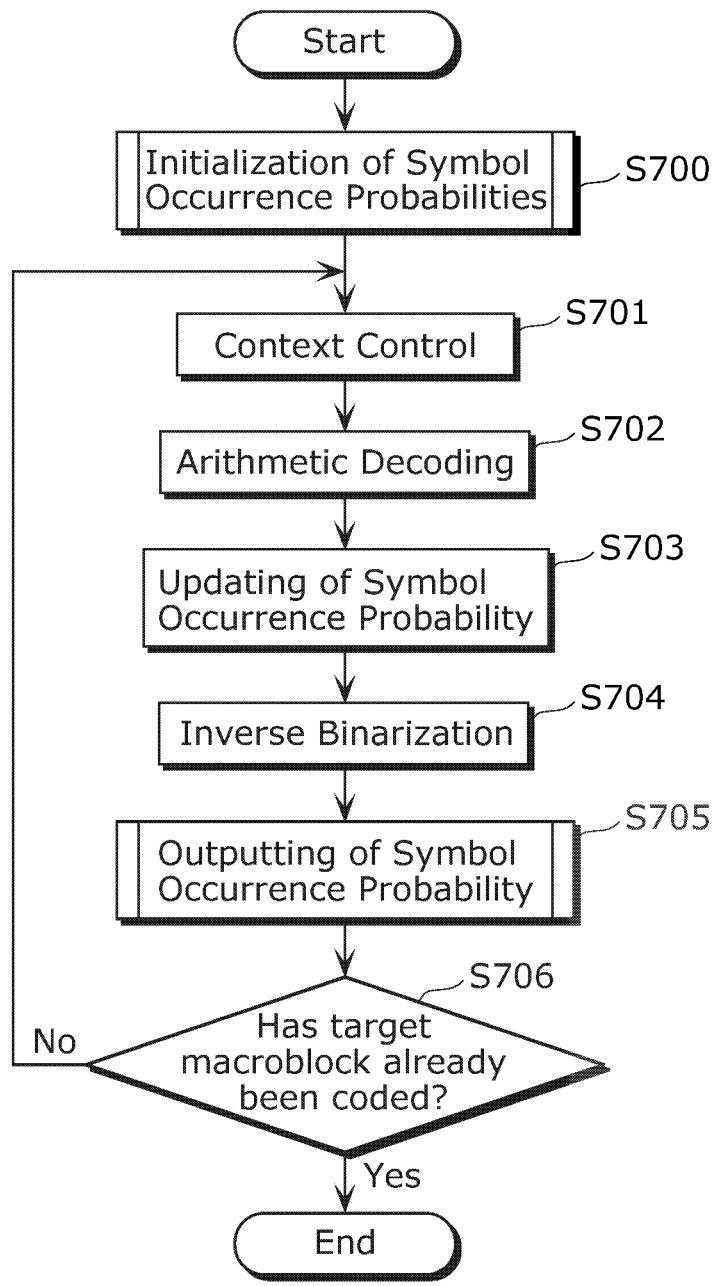
FIG. 37 is a flowchart of processing performed by the arithmetic decoding unit according to the tenth embodiment of the present invention.

FIG. 37 is a flowchart of processing performed by the arithmetic decoding unit shown in FIGS. 34 and 35. FIG. 37 shows decoding of one macroblock.

As shown in FIG. 37, at the beginning, the arithmetic decoding unit 40 according to the tenth embodiment initializes the symbol occurrence probabilities stored in the symbol occurrence probability storage unit 47 (S700). The symbol occurrence probability initialization is the same as the symbol occurrence probability initialization (S100) described in the first embodiment with reference to FIG. 3. Therefore, it will not be described again.

Then, the context control unit 48 controls a context using a method defined by H.264 standard (S701). The context control refers to processing of reading a symbol occurrence probability corresponding to a target macroblock to be decoded from the symbol occurrence probability storage unit 47 based on information of neighboring macroblock(s) of the target macroblock (neighbor information) and a bit position to be decoded, and then providing the symbol occurrence probability to the binary arithmetic decoder 49. Then, based on the symbol occurrence probability, the binary arithmetic decoder 49 arithmetic-decodes the target macroblock using a method defined by H.264 standard (S702).

The context control unit 48 stores an updated symbol occurrence probability, which results from the arithmetic decoding, into the symbol occurrence probability storage unit 47 (S703). Next, the inverse binarization unit 50 converts binary-valued signal into non-binary syntax element using a method defined by H.264 standard (S704).

As needed, the arithmetic decoding unit 40 causes the symbol occurrence probability storage unit 47 to output a stored symbol occurrence probability (S705). The symbol occurrence probability outputting is the same as the symbol occurrence probability outputting (S105) described in the first embodiment with reference to FIG. 3. Therefore, it will not be described again.

Next, the arithmetic decoding unit 40 determines whether or not the target macroblock has already been decoded (S706). If the target macroblock has already been decoded (Yes at S706), then the arithmetic decoding unit 40 completes the processing. On the other hand, if the target macroblock has not yet been decoded (No at S706), then the arithmetic decoding unit 40 repeats the processing from the context control at S701.

Figure 38:
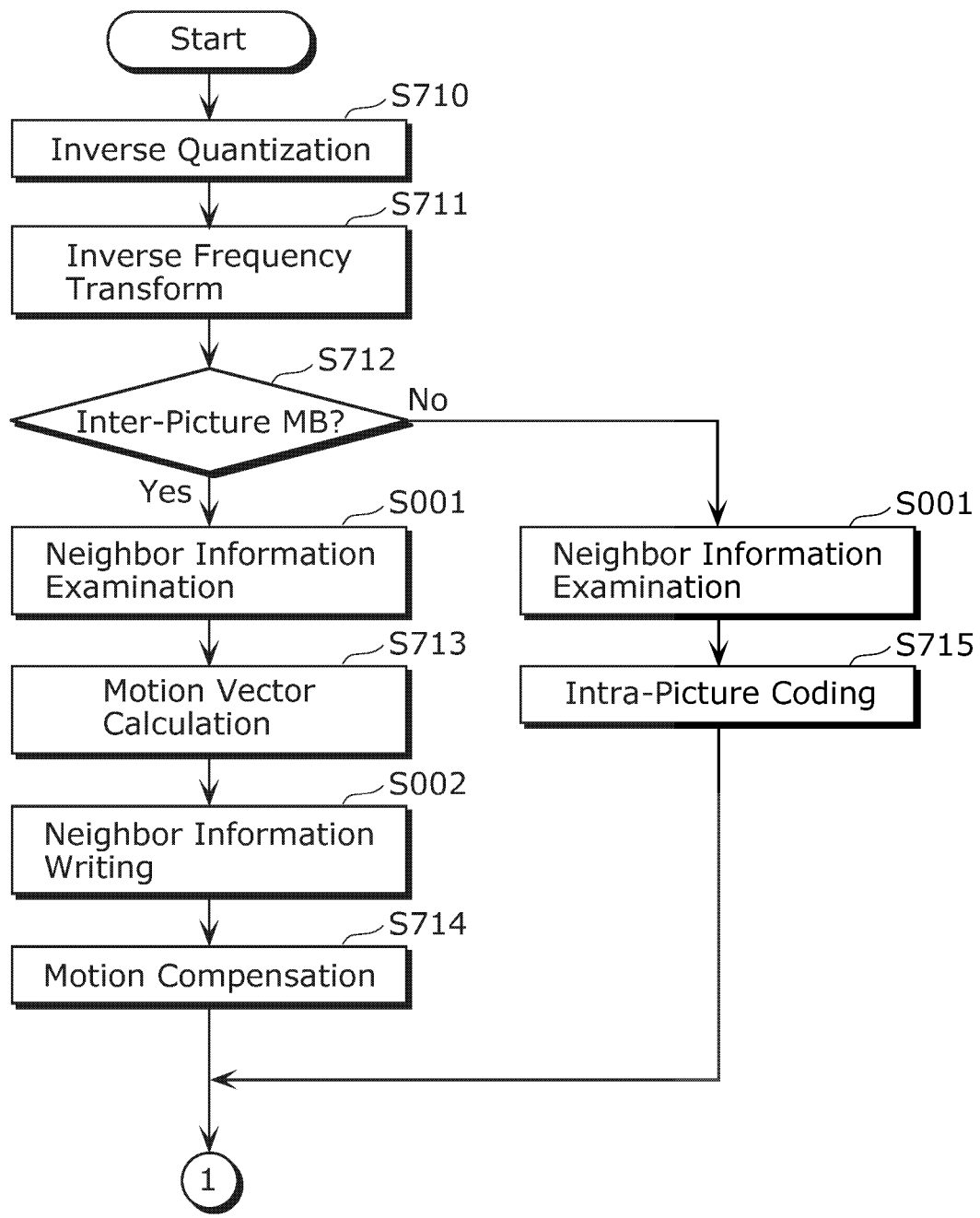
FIG. 38 is a flowchart of processing performed by the pixel decoding unit according to the tenth embodiment of the present invention.
Figure 39:
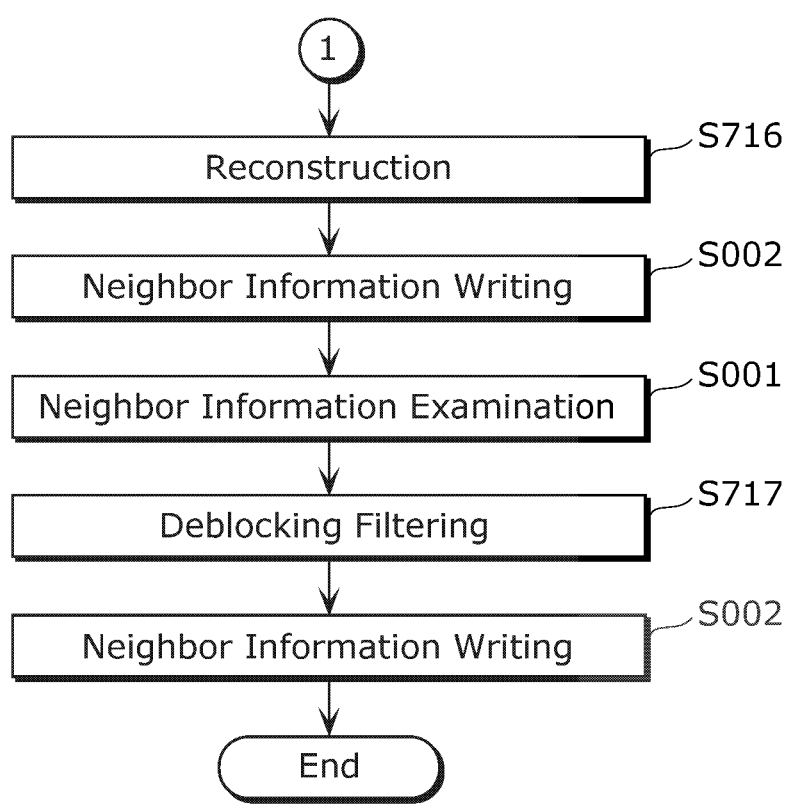
FIG. 39 is a flowchart of processing performed by the pixel decoding unit according to the tenth embodiment of the present invention.

Next, the processing performed by the pixel decoding unit 42 shown in FIGS. 34 and 36 is described with reference to flowcharts of FIGS. 38 and 39.

At the beginning, the inverse quantization unit 51 inversely quantizes data provided from the arithmetic decoding unit 40 (S710). Next, the inverse frequency transform unit 52 performs inverse frequency transform on the inversely-quantized data (S711).

Next, if a target macroblock to be decoded is an inter-picture prediction macroblock (Yes at S712), then the motion vector calculation unit 55 examines whether or not the neighbor information memory 46 stores information necessary for motion vector calculation (S001). If the neighbor information memory 46 does not store information necessary for motion vector calculation, then the motion vector calculation unit 55 waits until the necessary information is written into the neighbor information memory 46.

On the other hand, if the neighbor information memory 46 stores the information necessary for motion vector calculation, then the motion vector calculation unit 55 calculates a motion vector using the information (S713).

Figure 33:
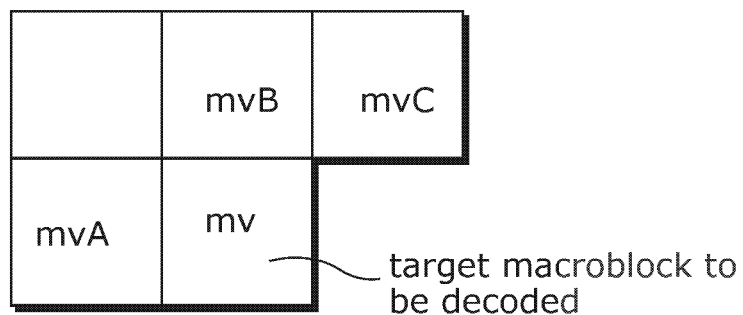
FIG. 33 is a conceptual diagram showing details of processing performed by the image coding device according to the ninth embodiment of the present invention.

FIG. 33 shows a summary of the motion vector calculation. A prediction motion vector value mvp is calculated from an intermediate value of motion vectors mvA, mvB, and mvC of neighboring macroblocks. Then, a differential motion vector value mvd in a stream is added to the prediction motion vector value mvp. As a result, a motion vector my is obtained.

After the motion vector calculation, the motion vector calculation unit 55 examines whether or not the neighbor information memory 46 has an available space (S002). If the neighbor information memory 46 has an available space, then the motion vector calculation unit 55 writes the calculated motion vector into the neighbor information memory 46. Otherwise, the motion vector calculation unit 55 waits until the neighbor information memory 34 has an available space.

The motion compensation unit 56 obtains a reference image from the frame memory 45 by using the calculated motion vector, and then performs motion compensation calculation such as filtering (S714).

On the other hand, if the target macroblock to be decoded is an intra-picture prediction macroblock (No at S712), then the intra-picture prediction unit 54 examines whether or not the neighbor information memory 46 stores information necessary for intra-picture prediction calculation (S001). If the neighbor information memory 46 does not store information necessary for intra-picture prediction calculation, then the intra-picture prediction unit 54 waits until the necessary information is written into the neighbor information memory 46.

Figure 32:
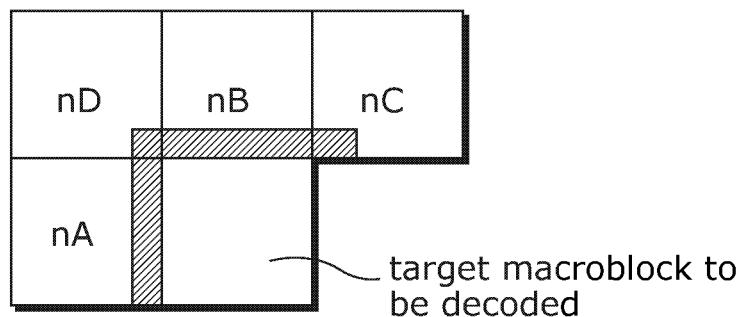
FIG. 32 is a conceptual diagram showing details of the processing performed by the pixel coding unit according to the ninth embodiment of the present invention.

On the other hand, if the neighbor information memory 46 stores information necessary for intra-picture prediction calculation, then the intra-picture prediction unit 54 performs intra-picture prediction calculation using the information (S715). The intra-picture prediction calculation requires neighbor information that is pieces of reconstructed pixel data nA, nB, nC, and nD as shown in FIG. 32 depending on the intra-picture prediction mode. If the neighbor information memory 46 stores information necessary for intra-picture prediction calculation, then the intra-picture prediction unit 54 performs the intra-picture prediction calculation (S715).

After the motion compensation at S714 or the intra-picture prediction at S715, then the reconstruction unit 53 adds (S716) the prediction image data generated by the motion compensation or the intra-picture prediction to the differential data on which the inverse frequency transform has been performed, thereby generating a reconstructed image.

Next, the reconstruction unit 53 examines whether or not the neighbor information memory 46 has an available space (S002). If the neighbor information memory 46 has an available space, then the reconstruction unit 53 writes the reconstructed image generated in the reconstruction at S716 into the neighbor information memory 46. Otherwise, the reconstruction unit 53 waits until the neighbor information memory 34 has an available space.

Next, the deblocking filter unit 57 examines whether or not the neighbor information memory 46 stores information necessary for deblocking filtering (S001). If the neighbor information memory 46 does not store information necessary for deblocking filtering, then the deblocking filter unit 57 waits until the necessary information is written into the neighbor information memory 46.

On the other hand, if the neighbor information memory 46 stores information necessary for deblocking filtering, then the deblocking filter unit 57 performs deblocking filtering by using the information (S717), and then writes the resulting decoded image into the frame memory 45.

After the deblocking filtering, the deblocking filter unit 57 examines whether or not the neighbor information memory 46 has an available space (S002). If the neighbor information memory 46 has an available space, then the deblocking filter unit 57 writes the result of the deblocking filtering into the neighbor information memory 46. Eventually, the pixel decoding unit 42 completes the processing.

The processing performed by the pixel decoding unit 43 is the same as that of the pixel decoding unit 42. Therefore, it will not be described again.

This is the description for the processing performed by the image decoding device according to the tenth embodiment.

As described above, the image decoding device according to the tenth embodiment can combine the arithmetic coding with the pixel coding.

It should be noted that the image decoding device according to the tenth embodiment may use any arithmetic coding described in the above-described embodiments.

It should also be noted in the tenth embodiment that the arithmetic coding method defined by H.264 standard is adopted. However, any other method can be adopted as long as the decoding is performed based on the symbol occurrence probability table or data similar to the symbol occurrence probability table which is adaptively updated depending on image.

It should also be noted in the tenth embodiment that the image decoding device decodes image in units of macroblocks each having 16 pixels×16 pixels. However, the image decoding device may decode image in units each having 8 pixels×8 pixels, 32 pixels×32 pixels, or 64 pixels×16 pixels, for example.

It should also be noted that it has been described in the tenth embodiment that images in a slice are coded in a zigzag order. However, the coding order may be raster order defined by H.264 standard or any other orders.

It should also be noted in the tenth embodiment that the decoding is based on H.264 standard, but the decoding may be based on any other similar standards.

It should also be noted in the tenth embodiment that the storage unit in which data is stored is a memory or buffer, but the storage unit may be any type of a memory. The storage unit may be storage means using any different schemes, such as a flip-flop and a hard disk.

It should also be noted that the image decoding device according to the tenth embodiment may be implemented as a hardware circuit or software in a processor. It should also be noted that the image decoding device according to the tenth embodiment may be implemented in a plurality of processors or in a single processor.

Although the image coding device and the image decoding device according to the present invention have been described with reference to a plurality of embodiments as above, the present invention is not limited to these embodiments. Those skilled in the art will be readily appreciated that various modifications and combinations of the structural elements are possible in the exemplary embodiments. Such modifications and combinations are also embodiments of the present invention For example, processing performed by a certain processing unit may be performed by a different processing unit. Inn addition, an order of steps in the processing may be changed. A plurality of the steps may be performed in parallel.

It should also be noted that the present invention can be implemented not only as the image coding device and the image decoding device, but also as: a method including steps performed by the image coding device and the image decoding device. The present invention can be implemented also as a program causing a computer to execute the steps in the method. Moreover, the present invention can be implemented also as a computer-readable recording medium, such as a Compact Disc-Read Only Memory (CD-ROM), on which the program is recorded.

It should also be noted that it has been described in the above-described embodiments that a picture is divided into a plurality of slices, but a picture may be divided into more common regions.

It should also be noted that it has been described in the above-described embodiments that the arithmetic coding is performed based on a symbol occurrence probability table, but the image coding device according to the present invention may code image based on probability information except the symbol occurrence probability table, by using a coding method except the arithmetic coding.

Eleventh Embodiment

Figure 40A:
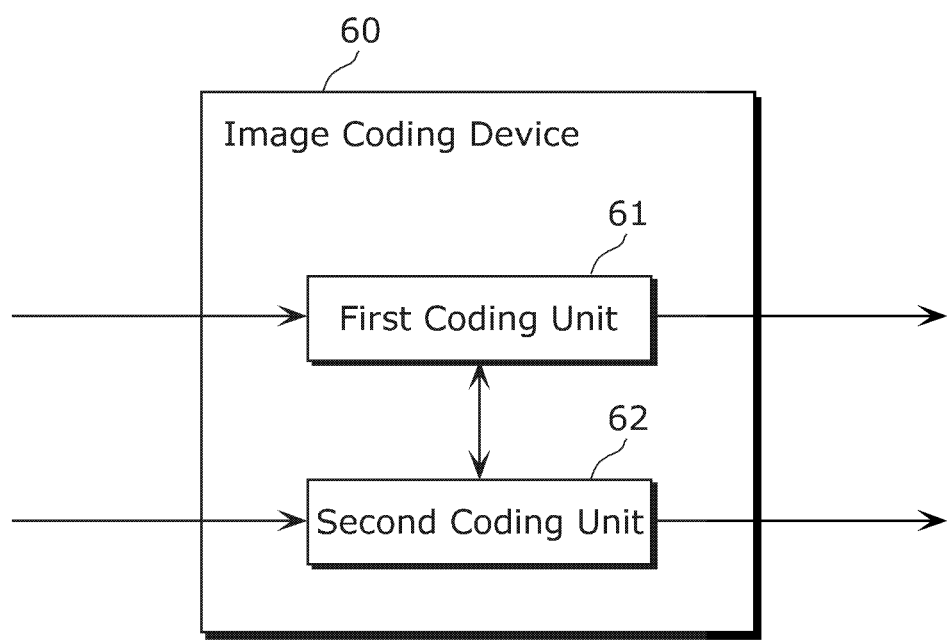
FIG. 40A is a block diagram showing a structure of an image coding device according to an eleventh embodiment of the present invention.

FIG. 40A is a block diagram of an image coding device according to the eleventh embodiment. The image coding device 60 shown in FIG. 40A includes a first coding unit 61 and a second coding unit 62. The first coding unit 61 corresponds to the arithmetic coding unit 1 described in the above-described embodiments. The second coding unit 62 corresponds to the arithmetic coding unit 2 described in the above-described embodiments. The image coding device 60 codes a picture having a plurality of regions each including a plurality of blocks.

Figure 40B:
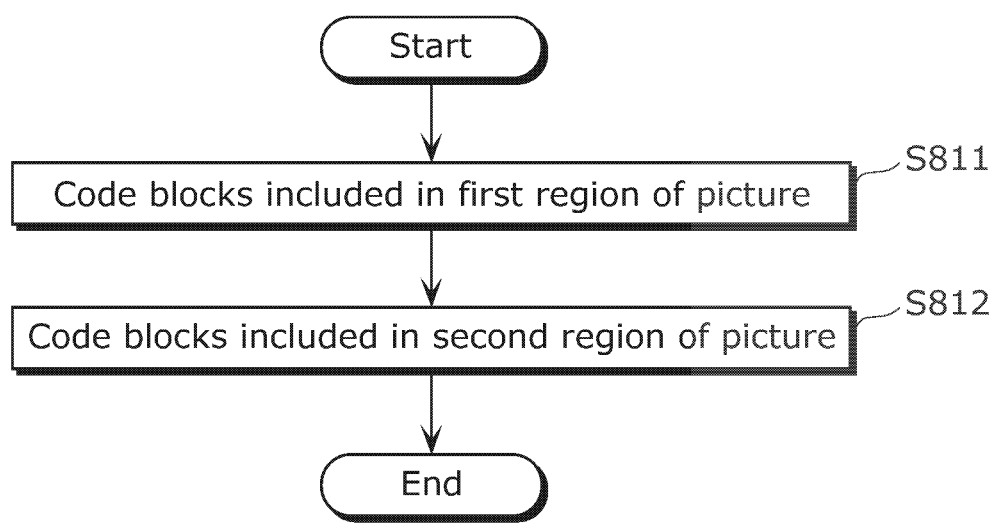
FIG. 40B is a flowchart of processing performed by the image coding device according to the eleventh embodiment of the present invention.

FIG. 40B is a flowchart of processing performed by the image coding device shown in FIG. 40A.

At the beginning, the first coding unit 61 sequentially codes blocks included in a first region of the plurality of regions, based on first probability information indicating data occurrence probabilities (S811). After coding of a target block to be coded and before coding of a next block to be coded, the first coding unit 61 updates the first probability information depending on data of the target block.

Next, the second coding unit 62 sequentially codes blocks included in a second region of the plurality of regions, based on second probability information indicating data occurrence probabilities (S812). After coding of a target block to be coded and before coding of a next block to be coded, the second coding unit 62 updates the second probability information depending on data of the target block.

Furthermore, prior to coding of the first block to be coded, the second coding unit 62 updates the second probability information based on the first probability information updated by the first coding unit 61.

Thereby, when the first image in a region of a picture is to be coded, the probability information is updated depending on characteristics of the image. Therefore, coding efficiency is improved.

Figure 41A:
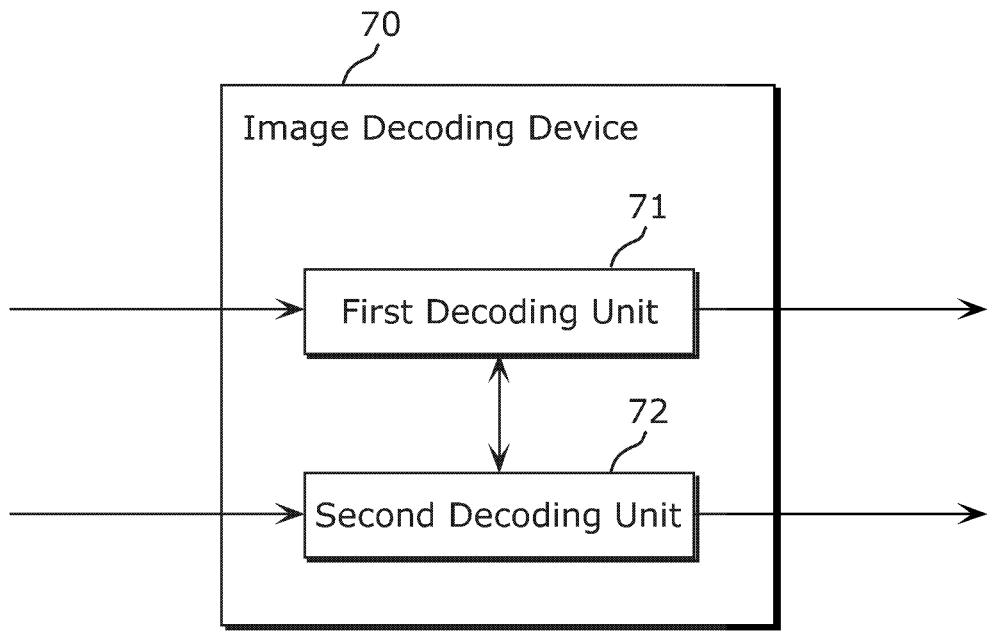
FIG. 41A is a block diagram showing a structure of an image decoding device according to the eleventh embodiment of the present invention.

FIG. 41A is a block diagram of an image decoding device according to the eleventh embodiment. The image decoding device 70 shown in FIG. 41A includes a first decoding unit 71 and a second decoding unit 72. The first decoding unit 71 corresponds to the arithmetic decoding unit 40 described in the tenth embodiment. The second decoding unit 72 corresponds to the arithmetic decoding unit 41 described in the tenth embodiment. The image decoding device 70 decodes a picture having a plurality of regions each including a plurality of blocks.

Figure 41B:
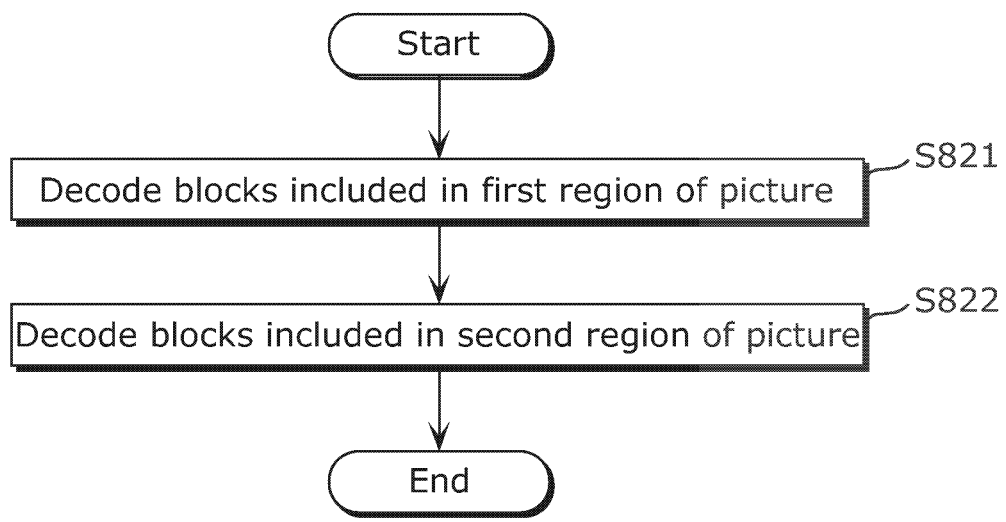
FIG. 41B is a flowchart of processing performed by the image decoding device according to the eleventh embodiment of the present invention.

FIG. 41B is a flowchart of processing performed by the image decoding device shown in FIG. 41A.

At the beginning, the first decoding unit 71 sequentially decodes blocks included in the first region of the plurality of regions, based on first probability information indicating data occurrence probabilities (S821). After decoding of a target block to be decoded and before decoding of a next block to be decoded, the first decoding unit 71 updates the first probability information depending on data of the target block.

Next, the second decoding unit 72 sequentially decodes blocks included in a second region of the plurality of regions, based on second probability information indicating data occurrence probabilities (S822). After decoding of a target block to be decoded and before decoding of a next block to be decoded, the second decoding unit 72 updates the second probability information depending on data of the target block.

Furthermore, prior to decoding of the first block to be decoded, the second decoding unit 72 updates the second probability information based on the first probability information updated by the first decoding unit 71.

Figure 42A:
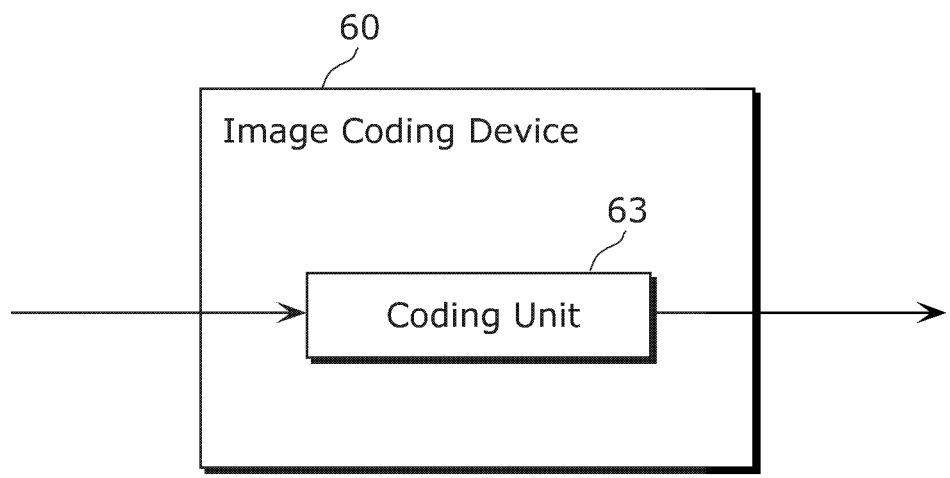
FIG. 42A is a block diagram showing a structure of an image coding device according to a twelfth embodiment of the present invention.

Thereby, the image decoding device according to the tenth embodiment can perform decoding in accordance with the image coding device according to the tenth embodiment Twelfth Embodiment FIG. 42A is a block diagram of an image coding device according to the twelfth embodiment. The image coding device 60 shown in FIG. 42A includes a coding unit 63. The coding unit 63 corresponds to the arithmetic coding unit 1 or 2 described in the above-described embodiments. The image coding device 60 codes an image including a plurality of blocks.

Figure 42B:
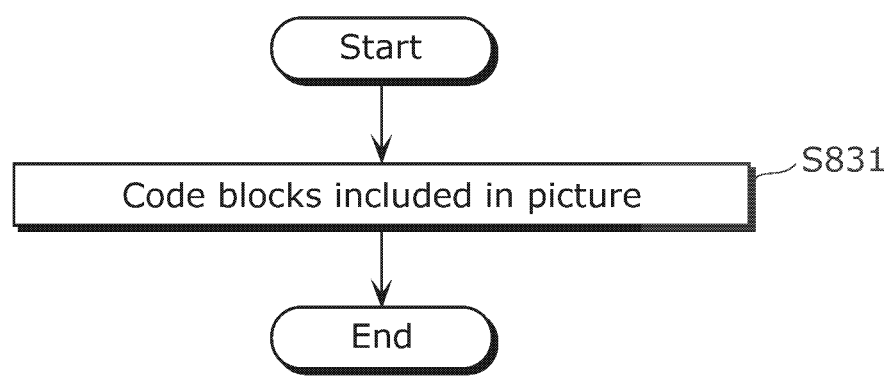
FIG. 42B is a flowchart showing processing performed by the image coding device according to the twelfth embodiment of the present invention.

FIG. 42B is a flowchart of processing performed by the image coding device shown in FIG. 42A.

The coding unit 63 codes a plurality of blocks based on probability information indicating data probability information (S831). After coding of a target block to be coded and before coding of a next block to be coded, the coding unit 63 updates the probability information depending on data of the target block. Moreover, the coding unit 63 codes the target block based on the probability information updated depending on data of a neighboring block above the target block.

Thereby, the target block is coded depending on the probability information updated based on the neighboring above block that is spatially close to the target block. Therefore, coding efficiency is improved.

Figure 43A:
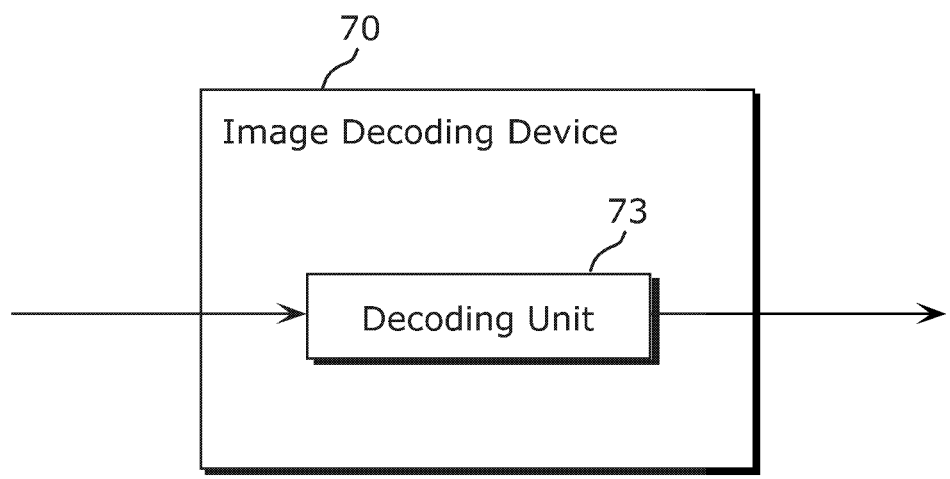
FIG. 43A is a block diagram showing a structure of an image decoding device according to the twelfth embodiment of the present invention.

FIG. 43A is a block diagram of an image decoding device according to the twelfth embodiment. The image decoding device 70 shown in FIG. 43A includes a decoding unit 73. The decoding unit 73 corresponds to the arithmetic decoding unit 40 or 41 described in the tenth embodiment. The image decoding device 70 decodes an image including a plurality of blocks.

Figure 43B:
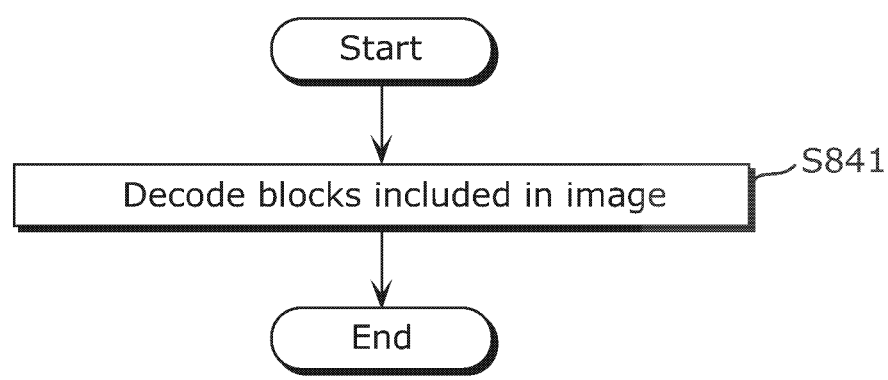
FIG. 43B is a flowchart of processing performed by the image decoding device according to the twelfth embodiment of the present invention.

FIG. 43B is a flowchart of processing performed by the image decoding device shown in FIG. 43A.

The decoding unit 73 decodes a plurality of blocks based on pieces of probability information indicating data probability information (S841). After decoding of a target block to be decoded and before decoding of a next block to be decoded, the decoding unit 73 updates the probability information depending on data of the target block. In addition, the decoding unit 73 decodes the target block based on probability information updated depending on data of an immediately-above block adjacent to the target block.

Thereby, the image decoding device according to the twelfth embodiment can perform decoding in accordance with the image coding device according to the twelfth embodiment.

Figure 44A:
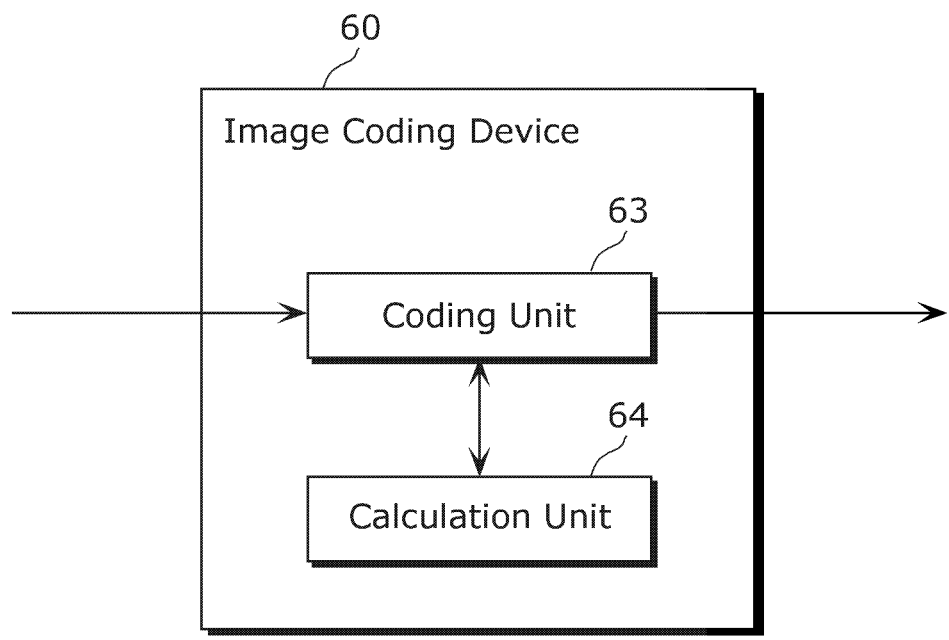
FIG. 44A is a block diagram showing a structure of an image coding device according to a variation of the twelfth embodiment of the present invention.

FIG. 44A is a block diagram of an image coding device according to a variation of the twelfth embodiment. The image coding device 60 shown in FIG. 44A further includes a calculation unit 64. The calculation unit 64 corresponds to the symbol occurrence probability calculation unit 7 described in the above-described embodiments.

Figure 44B:
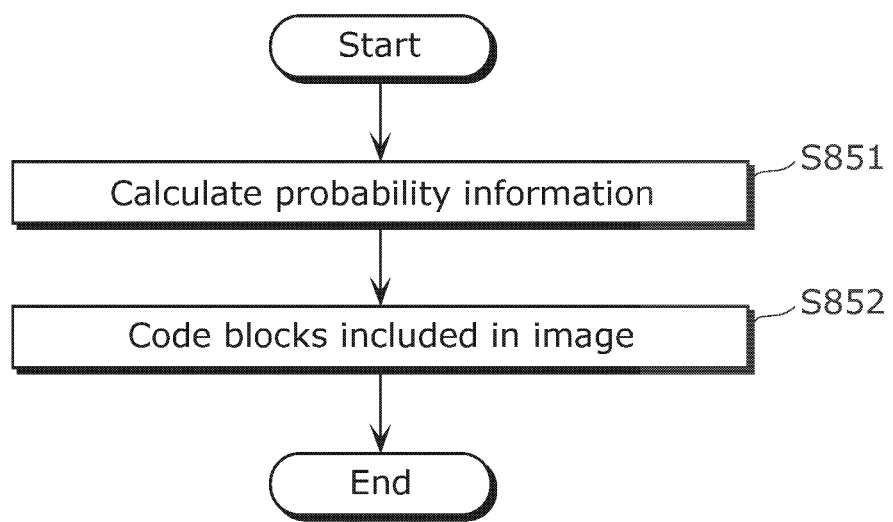
FIG. 44B is a flowchart showing processing performed by the image coding device according to the variation of the twelfth embodiment of the present invention.

FIG. 44B is a flowchart of processing performed by the image coding device shown in FIG. 44A.

The calculation unit 64 calculates probability information to be used in coding of a target block to be coded, based on (a) probability information updated depending on data of a block immediately above the target block and (b) probability information updated depending on data of a block at the immediate left of the target block (S851).

The coding unit 63 codes the target block based on the probability information calculated by the calculation unit 64 (S852).

Thereby, a block is coded depending on plural pieces of probability information. Therefore, coding efficiency is further improved.

Figure 45A:
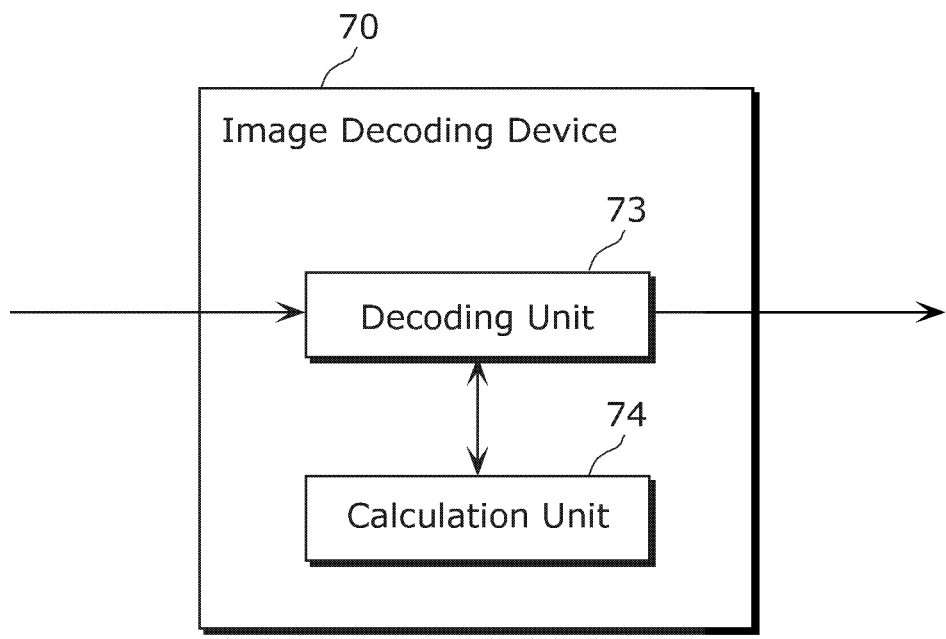
FIG. 45A is a block diagram showing a structure of an image decoding device according to the variation of the twelfth embodiment of the present invention.

FIG. 45A is a block diagram of an image decoding device according to a variation of the twelfth embodiment. The image decoding device 70 shown in FIG. 45A further includes a calculation unit 74. The calculation unit 74 corresponds to the symbol occurrence probability calculation unit 7 described in the above-described embodiments.

Figure 45B:
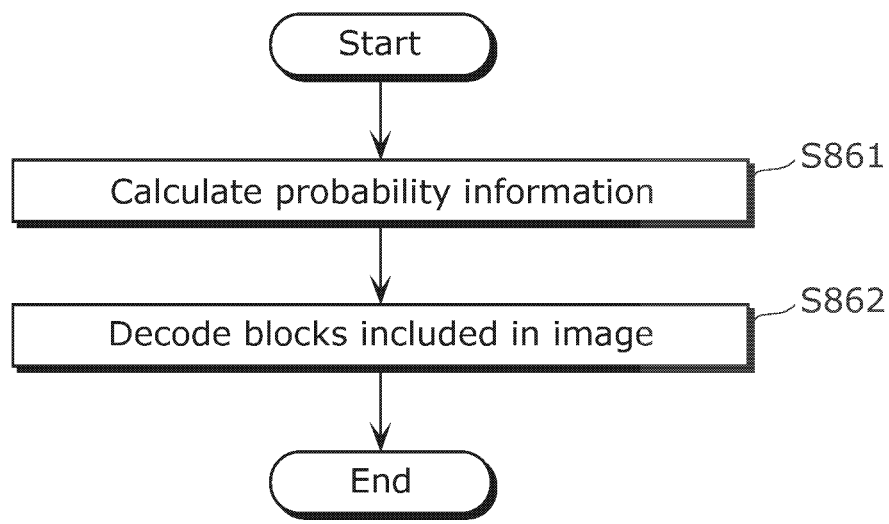
FIG. 45B is a flowchart showing processing performed by the image decoding device according to the variation of the twelfth embodiment of the present invention.

FIG. 45B is a flowchart of processing performed by the image decoding device shown in FIG. 45A.

The calculation unit 74 calculates probability information to be used in decoding of a target block to be decoded, based on (a) probability information updated depending on data of a block immediately above the target block and (b) probability information updated depending on data of a block at the immediate left of the target block (S861).

The decoding unit 73 decodes the target block based on the probability information calculated by the calculation unit 74 (S862).

Thereby, the image decoding device according to the variation of the twelfth embodiment can perform decoding in accordance with the image coding device according to the variation of the twelfth embodiment.

Thirteenth Embodiment

Furthermore, by recording a program, which realizes the image coding method and the image decoding method described in each of the embodiments, onto a recording medium, it is possible to easily perform the processing as described in each of the embodiments in an independent computer system. The recording medium may be any medium, such as a magnetic disk, an optical disk, a magnet-optical disk, an integrated circuit (IC) card, and a semiconductor memory, as far as the medium can record the program.

Furthermore, the applications of the image coding method and the image decoding method described in each of the above embodiments, and a system using such applications are described below.

Figure 46:
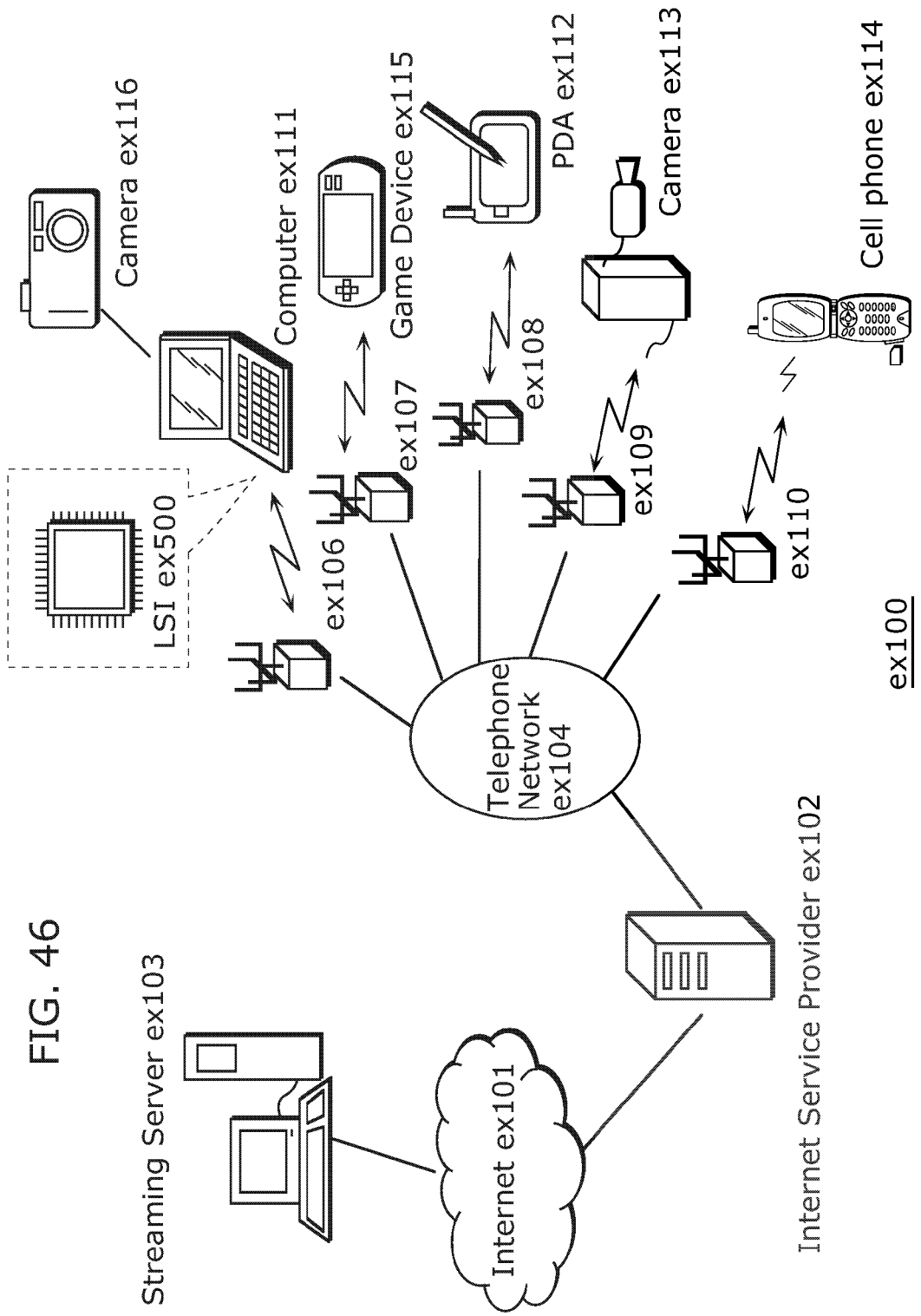
FIG. 46 is a diagram showing an overall configuration of a content supply system for implementing content distribution service according to the embodiment of the present invention.

FIG. 46 is a block diagram showing the overall configuration of a content supply system ex100 for realizing content distribution service. The area for providing communication service is divided into cells of desired size, and base stations ex106 to ex110 which are fixed wireless stations are placed in respective cells.

In this content supply system ex100, various devices such as a computer ex111, a Personal Digital Assistant (PDA) ex112, a camera ex113, a cell phone ex114 and a game device ex115 are connected to one another, via a telephone network ex104 and base stations ex106 to ex110. Furthermore, the various devices are connected to the Internet ex101 via an Internet service provider ex102.

However, the content supply system ex100 is not limited to the combination as shown in FIG. 46, and may include a combination of any of these devices which are connected to each other. Also, each device may be connected directly to the telephone network ex104, not through the base stations ex106 to ex110 which are the fixed wireless stations. Furthermore, the devices may be connected directly to one another via Near Field Communication (NFC) or the like.

The camera ex113 is a device such as a digital video camera capable of shooting moving images. The camera ex116 is a device such as a digital video camera capable of shooting still images and moving images. The cell phone ex114 may be any of a cell phone of a Global System for Mobile Communications (GSM) system, a Code Division Multiple Access (CDMA) system, a Wideband-Code Division Multiple Access (W-CDMA) system, a Long Term Evolution (LTE) system, a High Speed Packet Access (HSPA) system, a Personal Handy-phone System (PHS), and the like.

In the content supply system ex100, the camera ex113 is connected to a streaming server ex103 via the base station ex109 and the telephone network ex104, which realizes live distribution or the like. In the live distribution, the coding as described in the above embodiments is performed for a content (such as a video of a live music performance) shot by a user using the camera ex113, and the coded content is provided to the streaming server ex103. On the other hand, the streaming server ex103 makes steam distribution of the received content data to the clients at their requests. The clients include the computer ex111, the PDA ex112, the camera ex113, the cell phone ex114, the game device ex115, and the like, capable of decoding the above-mentioned coded data. Each device receiving the distributed data decodes the received data to be reproduced.

Here, the coding of the data shot by the camera may be performed by the camera ex113, the streaming server ex103 for transmitting the data, or the like. Likewise, either the client or the streaming server ex103 may decode the distributed data, or both of them may share the decoding. Also, the still image and/or moving image data shot by the camera ex116 may be transmitted not only to the camera ex113 but also to the streaming server ex103 via the computer ex111. In this case, either the camera ex116, the computer ex111, or the streaming server ex103 may perform the coding, or all of them may share the coding.

It should be noted that the above-described coding and the decoding are performed by a Large Scale Integration (SLI) ex500 generally included in each of the computer ex111 and the devices. The LSI ex500 may be implemented as a single chip or a plurality of chips. It should be noted that software for coding and decoding images may be integrated into any type of a recording medium (such as a CD-ROM, a flexible disk and a hard disk) that is readable by the computer ex111 or the like, so that the coding and decoding are performed by using the software. Furthermore, if the cell phone ex114 is a camera-equipped cell phone, it may transmit generated moving image data. This moving image data is the data coded by the LSI ex500 included in the cell phone ex114.

It should be noted that the streaming server ex103 may be implemented as a plurality of servers or a plurality of computers, so that data is divided into pieces to be processed, recorded, and distributed separately.

As described above, the content supply system ex100 enables the clients to receive and reproduce coded data. Thus, in the content supply system ex100, the clients can receive information transmitted by the user, then decode and reproduce it, so that the user without specific rights nor equipment can realize individual broadcasting.

Figure 47:
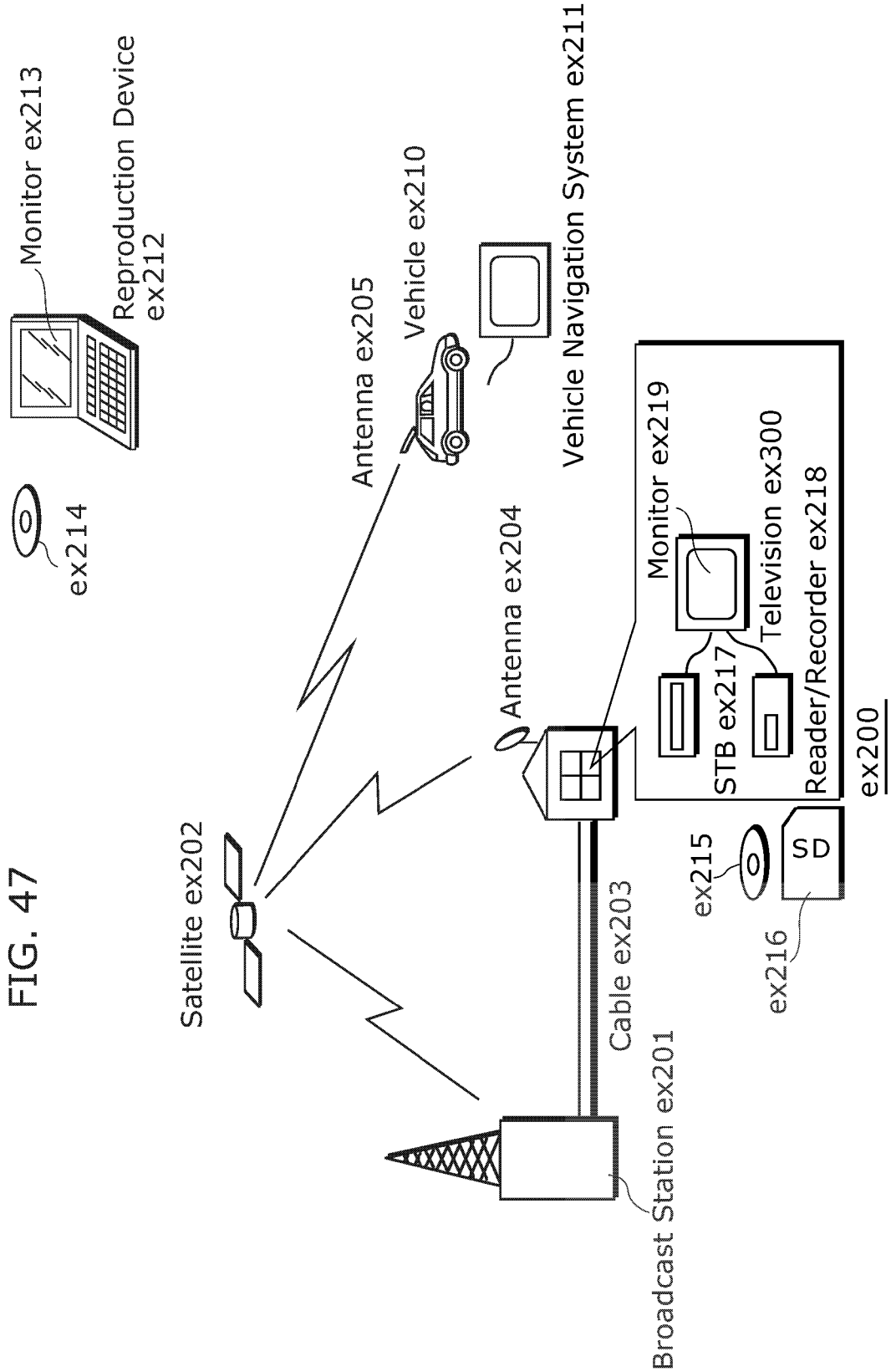
FIG. 47 is a diagram showing an overall configuration of a digital broadcast system according to the embodiment of the present invention.

The present invention is not limited to the example of the content supply system ex100. At least either the image coding device or the image decoding device in the above embodiments can be incorporated into the digital broadcast system ex200 as shown in FIG. 47. More specifically, a bit stream of video information is transmitted from a broadcast station ex201 to a communication or broadcast satellite ex202 via radio waves. The bitstream is a coded bitstream generated by the image coding method described in the above embodiments. Upon receipt of it, the broadcast satellite ex202 transmits radio waves for broadcasting, and a home antenna ex204 with a satellite broadcast reception function receives the radio waves. A device such as a television (receiver) ex300 or a Set Top Box (STB) ex217 decodes the coded bit stream for reproduction.

The image decoding device described in the above embodiments can be implemented in a reproduction device ex212 for reading and decoding a coded bit stream recorded on a recording medium ex214 such as a CD and DVD that is a recording medium. In this case, the reproduced video signals are displayed on a monitor ex213.

The image decoding device or the image coding device described in the above embodiments can be implemented in a reader/recorder ex218 for reading and decoding a coded bitstream recorded on a recording medium ex215 such as a DVD and a BD or for coding and writing video signals into the recording medium ex215. In this case, the reproduced video signals are displayed on a monitor ex219, and the recording medium ex215, on which the coded bitstream is recorded, allows a different device of system to reproduce the video signals. It is also conceived to implement the image decoding device in the set top box ex217 connected to a cable ex203 for cable television or the antenna ex204 for satellite and/or terrestrial broadcasting so as to reproduce them on a monitor ex219 of the television. The image decoding device may be incorporated into the television, not in the set top box.

Figure 48:
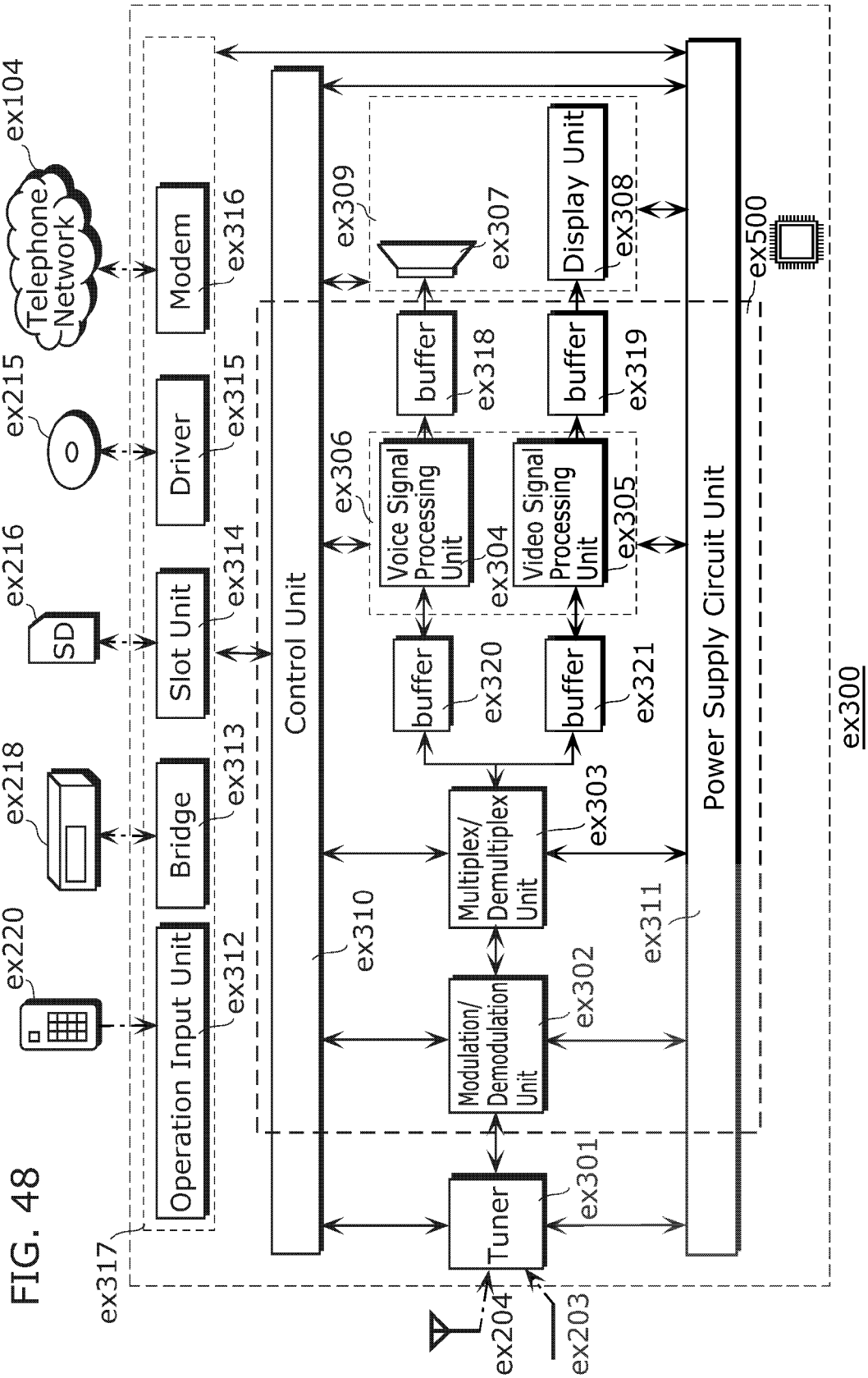
FIG. 48 is a block diagram showing a structure example of a TV according to the embodiment of the present invention.

FIG. 48 is a diagram showing a television (receiver) ex300 using the image decoding method described in the above embodiments. The television ex300 includes: a tuner ex301 that receives or outputs a bitstream of video information via the antenna ex204, the cable ex203, or the like that receives the above broadcasting; a modulation/demodulation unit ex302 that demodulates the received coded data or modulates generated coded data to be transmitted to the outside; and a multiplex/demultiplex unit ex303 that demultiplexes the modulated video data from the modulated voice data or multiplexes the coded video data and the coded voice data.

In addition, the television ex300 includes: a signal processing unit ex306 having (a) a voice signal processing unit ex304 that decodes or codes voice data and (b) a video signal processing unit ex305 that decodes or codes video data; and an output unit ex309 having (c) a speaker ex307 that outputs the decoded voice signal and (d) a display unit ex308, such as a display, that displays the decoded video signal. Furthermore, the television ex300 includes an interface unit ex317 having an operation input unit ex312 that receives inputs of user operations, and the like. Moreover, the television ex300 includes: a control unit ex310 for the overall controlling of the respective units; and a power supply circuit unit ex311 that supplies the respective units with power.

In addition to the operation input unit ex312, the interface unit ex317 may include: a bridge ex313 connected to external devices such as the reader/recorder ex218; a slot unit ex314 enabling the recording medium ex216 such as a SD card to be attached to the interface unit ex317; a driver ex315 for connecting to an external recording medium such as a hard disk; a modem ex316 connected to a telephone network; and the like. It should be noted that the recording medium ex216 enables information to be electrically recorded on a stored nonvolatile/volatile semiconductor memory device.

The units in the television ex300 are connected to one another via a synchronous bus.

First, the description is given for the structure by which the television ex300 decodes and reproduces data received from the outside via the antenna ex204 or the like. The television ex300 receives a user operation from a remote controller ex220 or the like. Then, under the control of the control unit ex310 having a CPU and the like, the television ex300 demodulates video data and voice data at the modulation/demodulation unit ex302, and demultiplexes the demodulated video data from the demodulated voice data at the multiplex/demultiplex unit ex303. In addition, the television ex300 decodes the demultiplexed voice data at the voice signal processing unit ex304, and decodes the demultiplexed video data at the video signal processing unit ex305 using the decoding method described in the above embodiments. The decoded voice signal and the decoded video signal are separately outputted from the output unit ex309 to the outside. When outputting the signals, the signals may be temporarily accumulated in, for example, buffers ex318 and ex319, so that the voice signal and the video signal are reproduced in synchronization with each other. Furthermore, the television ex300 may read the coded bitstream, not from broadcasting or the like but from the recording media ex215 and ex216 such as a magnetic/optical disk and a SD card.

Next, the description is given for the structure by which the television ex300 codes voice signal and video signal, and transmits the coded signals to the outside or writes them onto a recording medium or the like. The television ex300 receives a user operation from the remote controller ex220 or the like, and then, under the control of the control unit ex310, codes voice signal at the voice signal processing unit ex304, and codes video data at the video signal processing unit ex305 using the coding method described in the above embodiments. The coded voice signal and the coded video signal are multiplexed at the multiplex/demultiplex unit ex303 and then outputted to the outside. When multiplexing the signals, the signals may be temporarily accumulated in, for example, buffers ex320 and ex321, so that the voice signal and the video signal are in synchronization with each other.

It should be noted that the buffers ex318 to ex321 may be implemented as a plurality of buffers as shown, or may share one or more buffers. It should also be noted that, besides the shown structure, it is possible to include a buffer, for example, between the modulation/demodulation unit ex302 and the multiplex/demultiplex unit ex303, so that the buffer serves as a buffer preventing system overflow and underflow, and thereby accumulate data in the buffer.

It should also be noted that, in addition to the structure for receiving voice data and video data from broadcasting, recording media, and the like, the television ex300 may also have a structure for receiving audio inputs from a microphone and a camera, so that the coding is preformed for the received data. Here, although it has been described that the television ex300 can perform the above-described coding, multiplexing, and providing to the outside, it is also possible that the television ex300 cannot perform all of them but can perform one of the coding, multiplexing, and providing to the outside.

It should be noted that, when the reader/recorder ex218 is to read or write a coded bitstream from/into a recording medium, either the television ex300 or the reader/recorder ex218 may perform the above-described decoding or coding, or the television ex300 and the reader/recorder ex218 may share the above-described decoding or coding.

Figure 49:
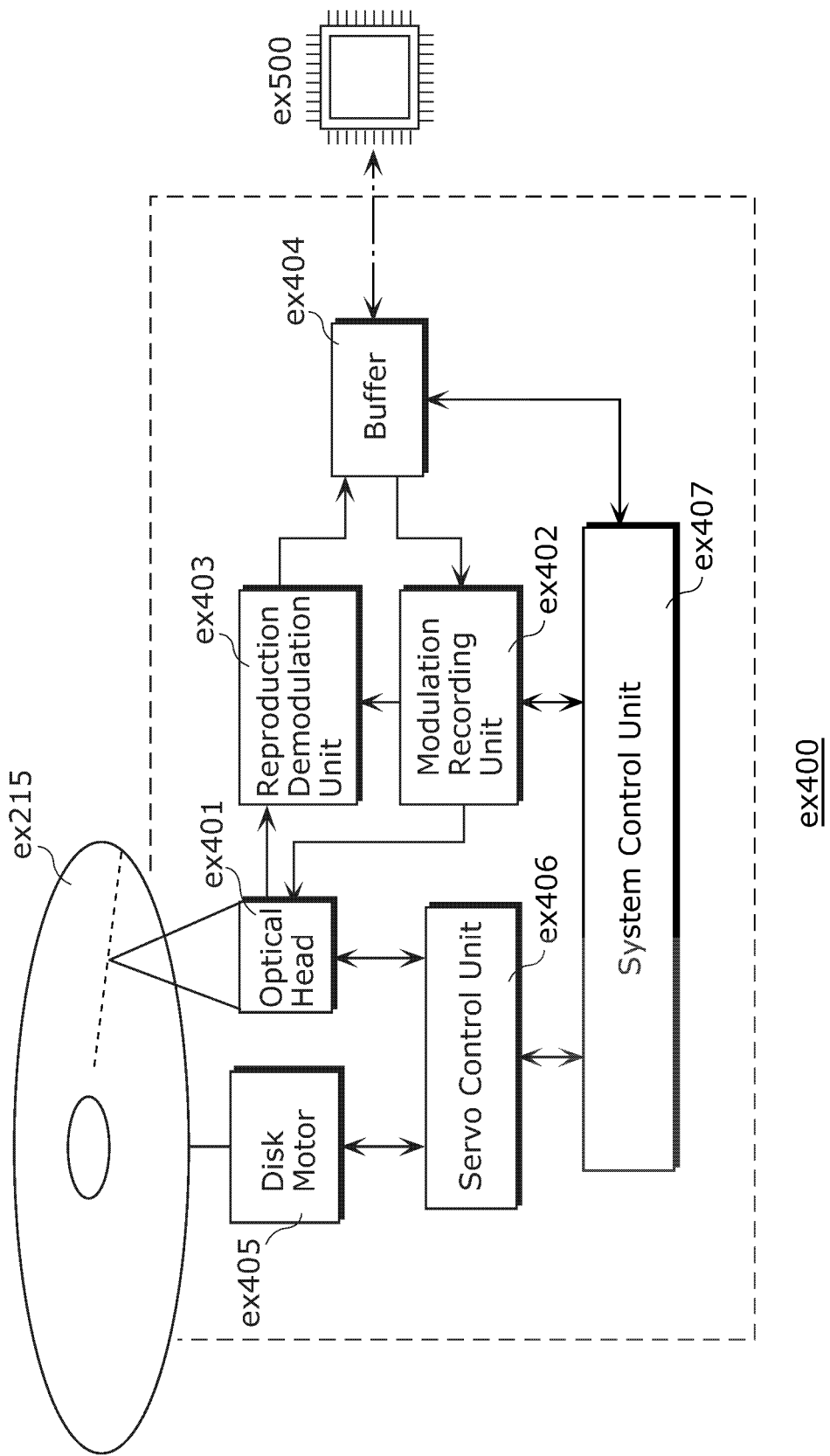
FIG. 49 is a block diagram showing a structure example of an information reproduction/recording unit which reads/writes information from/to a recording medium that is an optical disc according to the embodiment of the present invention.

For one example, FIG. 49 shows a structure of an information reproducing/recording unit ex400 in the case where data is read from or written into an optical disk. The information reproducing/recording unit ex400 includes the following units ex401 to ex407.

The optical head ex401 writes information into the recording medium ex215 as an optical disk by irradiating laser spot on a recording surface of the recording medium ex215, and reads information from the recording medium ex215 by detecting light reflected on the recording surface of the recording medium ex215. The modulation recording unit ex402 electrically drives a semiconductor laser included in the optical head ex401, and thereby modulates laser light according to recorded data. A reproduction demodulation unit ex403 amplifies reproduction signal that is obtained by electrically detecting light reflected on the recording surface by a photo detector included in the optical head ex401, then demultiplexes and demodulates signal components recorded on the recording medium ex215, and reproduces necessary information. A buffer ex404 temporarily holds the information to be recorded onto the recording medium ex215, and the information reproduced from the recording medium ex215. A disk motor ex405 rotates the recording medium ex215. A servo control unit ex406 moves the optical head ex401 to a predetermined information track while controlling rotation driving of the disk motor ex405, thereby performing tracking processing of the laser spot.

The system control unit ex407 controls the overall information reproducing/recording unit ex400. The above-described reading and writing are realized when the system control unit ex407 records and reproduces information via the optical head ex401 while cooperating the modulation recording unit ex402, the reproduction demodulation unit ex403, and the servo control unit ex406, by using various information stored in the buffer ex404 and new information generated and added as needed. The system control unit ex407 includes, for example, a microprocessor, and performs the above processing by executing a reading/writing program.

Although it has been described above that the optical head ex401 irradiates laser spot, the optical head ex401 may perform higher-density recording by using near-field light.

Figure 50:
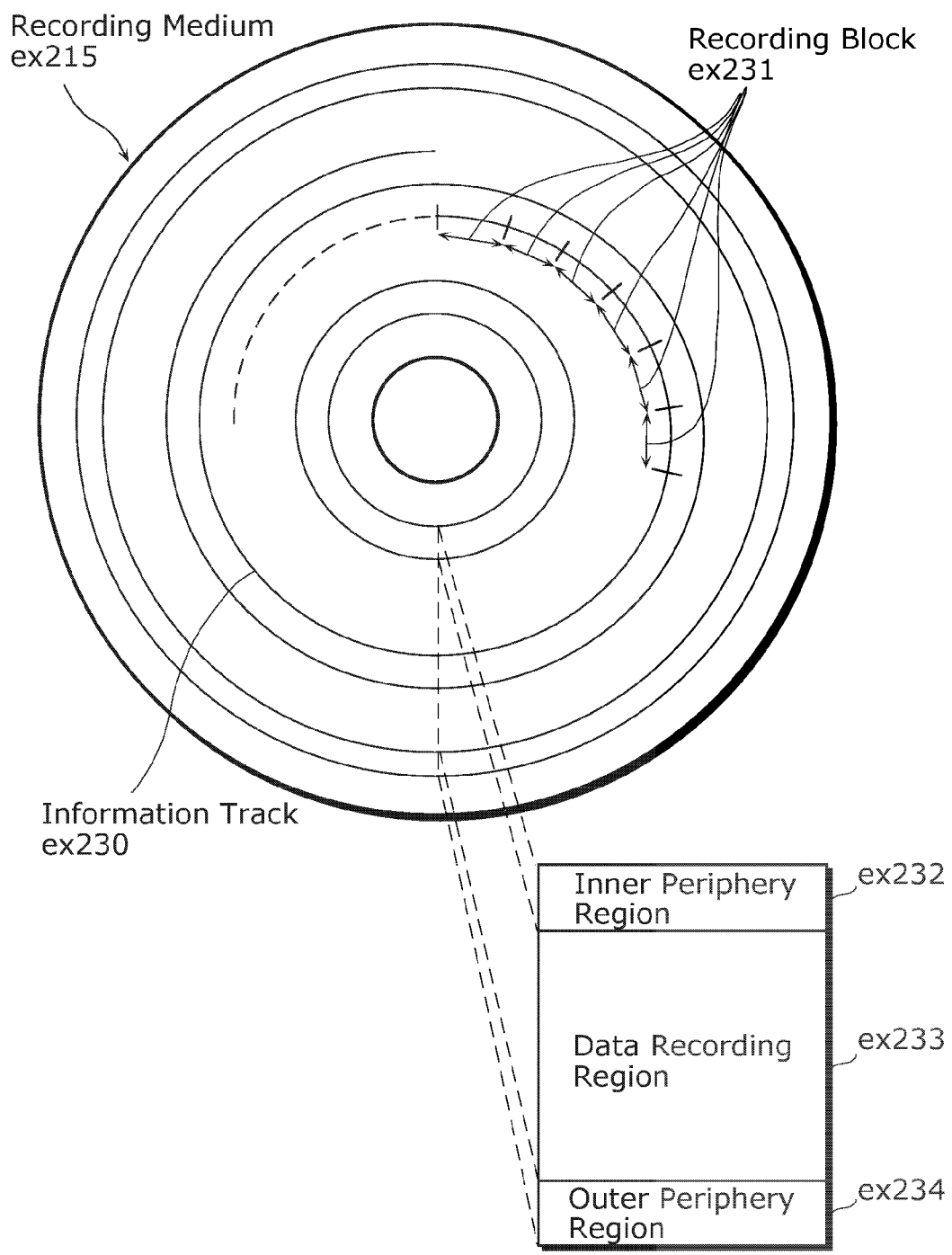
FIG. 50 is a diagram showing a structure example of the recording medium that is an optical disc according to the embodiment of the present invention.

FIG. 50 shows a schematic diagram of the recording medium ex215 that is an optical disk. On the recording surface of the recording medium ex215, guide grooves are formed in a spiral shape, and on an information track ex230, address information indicating an absolute position on the disk is previously recorded using a change of the groove shape. The address information includes information for identifying a position of a recording block ex231 that is a unit for recording data, and a devise performing recording and reproduction is capable of specifying the recording block by reproducing the information track ex230 to read the address information. Moreover, the recording medium ex215 includes a data recording region ex233, an inner periphery region ex232, and an outer periphery region ex234. The data recording region ex233 is a region on which user data is recorded. The inner periphery region ex232 and the outer periphery region ex234 which are provided in the inner periphery and the outer periphery, respectively, of the data recording region ex233 are for specific uses except the user data recording.

The information reproducing/recording unit ex400 reads/writes coded voice data and video data or coded data generated by multiplexing them, from/into such data recording region ex233 of the recording medium ex215.

Although the above has been described giving the example of a one-layer optical disk such as a DVD or a BD, the optical disk is not limited to the above but may be a mufti-layer optical disk so that data can be recorded onto other regions in addition to the surface. Furthermore, the optical disk may have a structure for multidimensional recording/reproducing, such as data recording using color lights having various different wavelengths on the same position of the disk, or recording of layers of different pieces of information from various angles.

It should also be noted that it is possible in the digital broadcasting system ex200 that the vehicle ex210 having the antenna ex205 receives data from the satellite ex202 or the like, and reproduces moving images on the display device such as the vehicle navigation system ex211 or the like in the vehicle ex210. As for the configuration of the vehicle navigation system ex211, a configuration added with a GPS receiving unit to the units as shown in FIG. 48, is conceivable. The same applies to the computer ex111, the cell phone ex114 and others. Moreover, like the television ex300, three types of implementations can be conceived for a terminal such as the above-mentioned cell phone ex114: a communication terminal equipped with both an encoder and a decoder; a sending terminal equipped with an encoder only; and a receiving terminal equipped with a decoder only.

Thus, the image coding method and the image decoding method described in the above embodiments can be used in any of the above-described devices and systems, and thereby the effects described in the above embodiments can be obtained.

It should be noted that the present invention is not limited to the above embodiments but various variations and modifications are possible in the embodiments without departing from the scope of the present invention.

Fourteenth Embodiment

Figure 51:
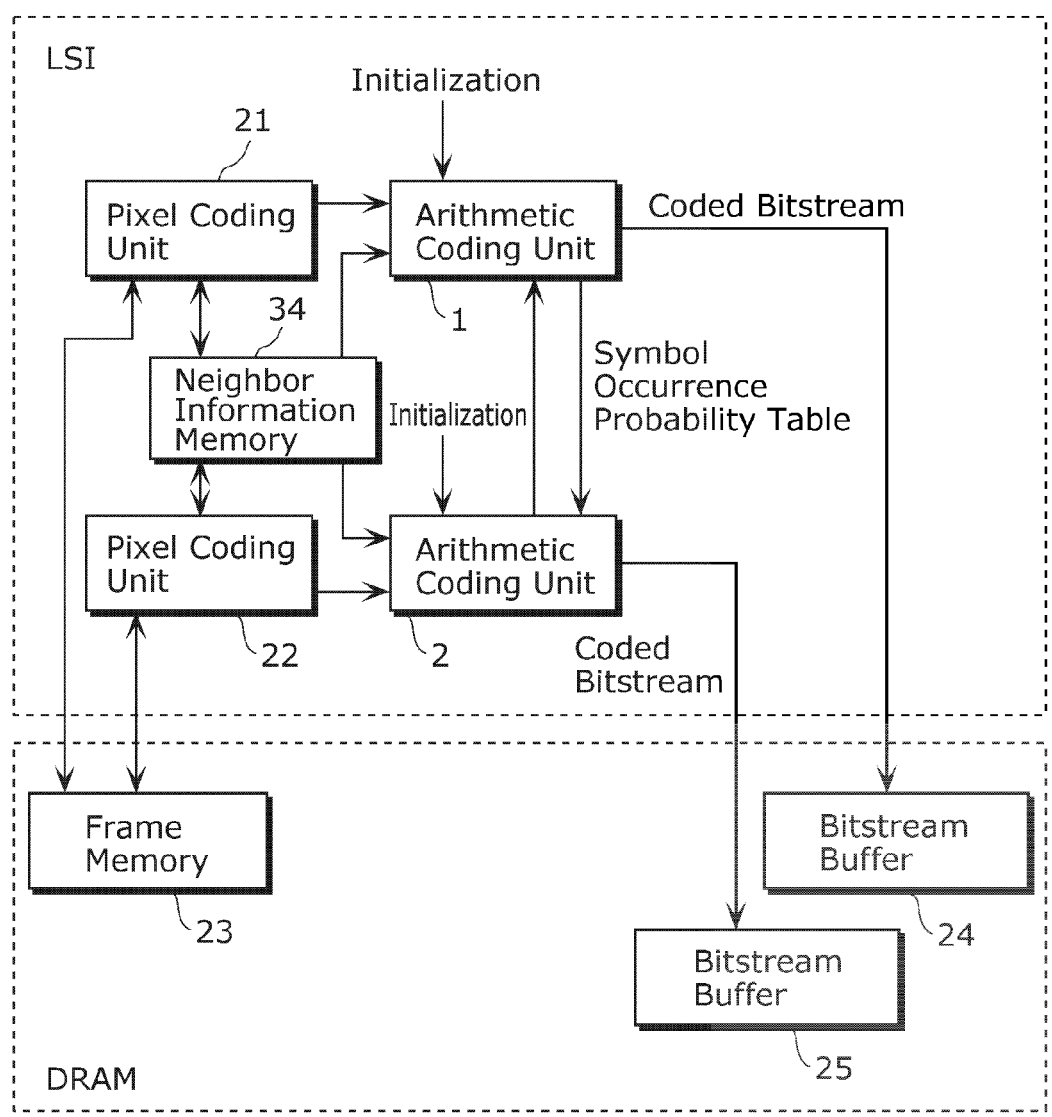
FIG. 51 is a block diagram showing a structure example of an integrated circuit that implements the image encoding method according to any one of the embodiments of the present invention.

In the fourteenth embodiment, the image coding device according to the first embodiment is typically implemented into a Large Scale Integration (LSI) which is an integrated circuit. FIG. 51 shows the fourteenth embodiment. The bitstream buffers 24 and 25 and the frame memory 23 are implemented into a DRAM and the other circuits and memories are implemented into the LSI.

These may be integrated separately, or a part or all of them may be integrated into a single chip. Here, the integrated circuit is referred to as a LSI, but the integrated circuit can be called an IC, a system LSI, a super LSI or an ultra LSI depending on their degrees of integration.

The technique of integrated circuit is not limited to the LSI, and it may be implemented as a dedicated circuit or a general-purpose processor. It is also possible to use a Field Programmable Gate Array (FPGA) that can be programmed after manufacturing the LSI, or a reconfigurable processor in which connection and setting of circuit cells inside the LSI can be reconfigured.

Furthermore, if due to the progress of semiconductor technologies or their derivations, new technologies for integrated circuits appear to be replaced with the LSIs, it is, of course, possible to use such technologies to implement the functional blocks as an integrated circuit. For example, biotechnology and the like can be applied to the above implementation.

Moreover, the semiconductor chip on which the image decoding device according to the embodiments is combined with a display for drawing images to form an image drawing device depending on various applications. The present invention can thereby be used as an information drawing means for a mobile phone, a television set, a digital video recorder, digital camcorder, a vehicle navigation device, and the like. The display in the combination may be a cathode-ray tube (CRT), a flat display such as a liquid crystal display, a plasma display panel (PDP), or an organic light emitting display (OLED), a projection display represented by a projector, or the like.

It should also be noted that the LSI according to the fourteenth embodiment may perform coding and decoding in cooperation with a bitstream buffer on which coded streams are accumulated and a Dynamic Random Access Memory (DRAM) including a frame memory on which images are accumulated. The LSI according to the fourteenth embodiment may be cooperated not with a DRAM, but with a different storage device such as an embedded DRAM (eDRAM), a Static Random Access Memory (SRAM), or a hard disk.

Fifteenth Embodiment

Figure 52:
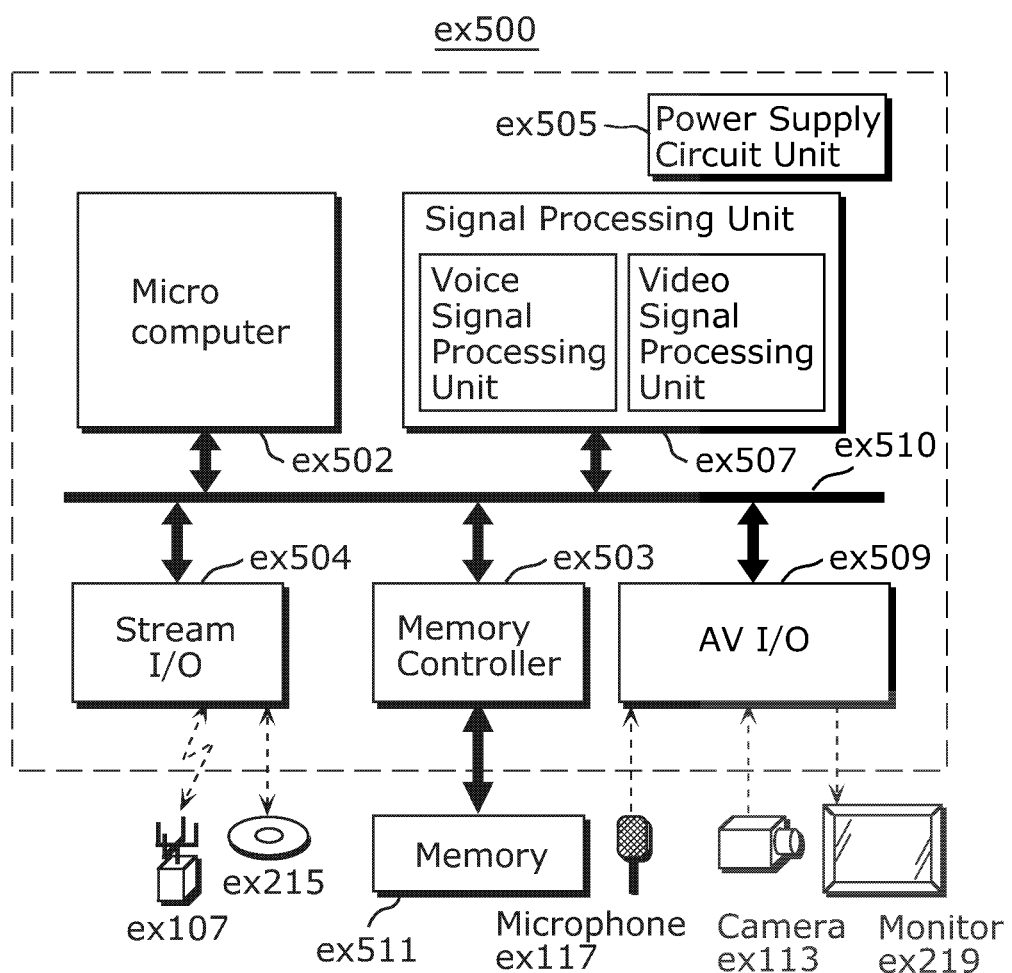
FIG. 52 is a block diagram showing a structure example of an integrated circuit that implements the image encoding method and the image decoding method according to any one of the embodiments of the present invention.

In the fifteenth embodiment, the image coding device, the image decoding device, the image coding method, and the image decoding method which have been described in the above embodiments are typically implemented into a Large Scale Integration (LSI) which is an integrated circuit. As one example, FIG. 52 shows a structure of a LSI ex500 on which they are integrated into a single chip. The LSI ex500 includes the following units ex502 to ex509 which are connected to one another via a bus ex510. When a power source is ON, a power supply circuit unit ex505 supplies power to the respective units to activate them to be capable of operating.

For example, in the case of coding, the LSI ex500 receives input audio/visual (AV) signals from an AV I/O ex509 via the microphone ex117, the camera ex113, or the like. The input AV signals are temporarily accumulated in an external memory ex511 such as a SDRAM. The accumulated data is, for example, divided into a plurality of times depending on a processing amount and a processing speed, and eventually provided to a signal processing unit ex507. The signal processing unit ex507 performs coding of voice signal and/or coding of video signal. Here, the coding of video signal is the coding described in the above embodiments. Furthermore, the signal processing unit ex507 performs multiplexing of the coded voice data and the coded video data and other processing as needed, and provides the resulting data from a stream I/O ex504 to the outside. The output bitstream is transmitted to the base station ex107, or written to the recording medium ex215.

Moreover, for example, in the case of decoding, under the control of the microcomputer ex502, the LSI ex500 temporarily accumulates, to a memory ex511 or the like, coded data that is obtained using the stream I/O ex504 via the base station ex107, or coded data that is obtained by reading it from the recording medium ex215. Under the control of the microcomputer ex502, the accumulated data is, for example, divided into a plurality of times depending on a processing amount and a processing speed, and eventually provided to the signal processing unit ex507. The signal processing unit ex507 performs decoding of voice signal and/or decoding of video signal. Here, the decoding of video signal is the decoding described in the above embodiments. It is preferable that the decoded voice signal and the decoded video signal are temporarily accumulated in the memory ex511 or the like as needed, so that they can be reproduced in synchronization with each other. The decoded output signal is outputted from the AV I/O ex509 to the monitor ex219 or the like appropriately via the memory ex511 or the like. The access to the memory ex511 is actually performed via the memory controller ex503.

Although it has been described above that the memory ex511 is outside the LSI ex500, the memory ex511 may be included in the LSI ex500. It is possible that the LSI ex500 may be integrated into a single chip, or may be integrated separately.

Here, the integrated circuit is referred to as a LSI, but the integrated circuit can be called an IC, a system LSI, a super LSI or an ultra LSI depending on their degrees of integration.

The technique of integrated circuit is not limited to the LSI, and it may be implemented as a dedicated circuit or a general-purpose processor. It is also possible to use a Field Programmable Gate Array (FPGA) that can be programmed after manufacturing the LSI, or a reconfigurable processor in which connection and setting of circuit cells inside the LSI can be reconfigured.

Furthermore, if due to the progress of semiconductor technologies or their derivations, new technologies for integrated circuits appear to be replaced with the LSIs, it is, of course, possible to use such technologies to implement the functional blocks as an integrated circuit. For example, biotechnology and the like can be applied to the above implementation.

The image coding method in the present invention can be used for various applications. For example, the present invention can be used and highly useful in high-resolution information display devices and image capturing devices, such as television sets, digital video recorders, vehicle navigation devices, mobile phones, digital cameras, digital camcorders, and the like.

The invention claimed is:

1. An image coding method of coding an image having a plurality of blocks, said image coding method comprising
    coding the blocks sequentially based on probability information indicating a data occurrence probability,
    wherein, in said coding, the probability information is updated depending on data of a first target block to be coded among the blocks, after coding the first target block and before coding a second target block to be coded next among the blocks, and
    wherein, in said coding, a third target block in the blocks to be coded among the blocks is coded based on the probability information (i) which is updated depending on the data of the first target block, the first target block being a neighboring block above the third target block and (ii) which is not updated depending on the data of the second target block, and
    wherein the third target block (i) is located on a left end of the image, (ii) is different from the second target block, and (iii) is coded after coding the first target block.

2. The image coding method according to claim 1, wherein, in said coding, the blocks are sequentially arithmetic-coded based on the probability information.

3. The image coding method according to claim 1, wherein, in said coding, the blocks are sequentially coded on a line-by-line basis in a horizontal direction from left to right, wherein, after coding a block on far right of a line, a block on far left of a next line immediately below the line is coded.

4. The image coding method according to claim 1, wherein, in said coding, the third target block is coded based on the probability information, the probability information having been updated depending on the data of the first target block immediately above the third target block.

5. The image coding method according to claim 1, wherein, in said coding, sub-blocks included in each of the blocks are sequentially coded based on the probability information,
    in said coding, the probability information is further updated depending on data of a first target sub-block to be coded among a first set of sub-blocks included in the first target block, after coding the first target sub-block and before coding a second target sub-block to be coded next among the first set of sub-blocks, and
    in said coding, a third target block is coded based on the probability information, the third target block being to be coded first among a second set of sub-blocks included in the third target block, and the probability information having been updated depending on the data of the first target sub-block that is spatially closest to the third target sub-block among the first set of sub-blocks.

6. The image coding method according to claim 1, wherein, in said coding, the probability information is further updated depending on data of a fourth target block on immediately left of the third target block among the blocks, after coding the fourth target block and before coding the third target block,
    said image coding method further comprising calculating, from first probability information and second probability information, the probability information used in the coding of the third target block, the first probability information being the probability information updated depending on the data of the first target block in said coding, and the second probability information being the probability information updated depending on the data of the fourth target block in said coding, and in said coding, the third target block is coded based on the probability information calculated in said calculating.

7. The image coding method according to claim 6, wherein, in said coding, sub-blocks included in each of the blocks are sequentially coded based on the probability information, in said coding, the probability information is further updated depending on data of a first target sub-block to be coded among a first set of sub-blocks included in the first target block, after coding the first target sub-block and before coding a second target sub-block to be coded next among the first set of sub-blocks, in said coding, the probability information is further updated depending on data of a third target sub-block to be coded among a second set of sub-blocks included in the fourth target block, after coding the third target sub-block and before coding a fourth target sub-block to be coded next among the second set of sub-blocks, in said calculating, the probability information is calculated from the first probability information and the second probability information, the probability information being to be used in coding of a fifth target sub-block to be coded first among a third set of sub-blocks included in the third target block, the first probability information being the probability information updated in said coding depending on the data of the first target sub-block that is spatially closest to the fifth target sub-block among the first set of sub-blocks, and the second probability information being the probability information updated in said coding depending on the data of the third target sub-block that is spatially closest to the fifth target sub-block among the second set of sub-blocks, and in said coding, the fifth target sub-block is coded based on the probability information calculated in said calculating.

8. The image coding method according to claim 7, wherein, in said calculating, the probability information to be used in coding of the fifth target sub-block is calculated by weighting the first probability information and the second probability information according to (a) a spatial distance from the fifth target sub-block to the first target sub-block and (b) a spatial distance from the fifth target sub-block to the third target sub-block.

9. The image coding method according to claim 1, wherein, in said coding, the third target block is coded based on the probability information updated depending on data of the first target block when predetermined condition is satisfied, and the third target block is coded based on the probability information updated depending on data of a target block immediately prior to the third target block when the predetermined condition is not satisfied.

10. An image coding device that codes an image having a plurality of blocks, said image coding device comprising:

a processor; and a memory having a program stored thereon, the program causing the processor to execute operations including coding the blocks sequentially based on probability information indicating a data occurrence probability, wherein, in the coding, the probability information is updated depending on data of a first target block to be coded among the blocks, after coding the first target block and before coding a second target block to be coded next among the blocks, and wherein, in the coding, a third target block in the blocks to be coded among the blocks is coded based on the probability information (i) which is updated depending on the data of the first target block, the first target block being neighboring block above the third target block and (ii) which is not updated depending on the data of the second target block, and wherein the third target block (i) is located on a left end of the image, (ii) is different from the second target block, and (iii) is coded after coding the first target block.

11. An integrated circuit that codes an image having a plurality of blocks, said integrated circuit comprising coding circuitry which, in operation, codes the blocks sequentially based on probability information indicating a data occurrence probability, wherein said coding circuitry updates the probability information depending on data of a first target block to be coded among the blocks, after coding the first target block and before coding a second target block to be coded next among the blocks, and wherein said coding circuitry codes a third target block in the blocks to be coded among the blocks based on the probability information (i) which is updated depending on the data of the first target block, the first target block being a neighboring block above the third target block and (ii) which is not updated depending on the data of the second target block, and wherein the third target block (i) is located on a left end of the image, (ii) is different from the second target block, and (iii) is coded after coding the first target block.

* * * * *

UNITED STATES PATENT AND TRADEMARK OFFICE
CERTIFICATE OF CORRECTION

| | |
|---|---|
| PATENT NO. | : 9,497,460 B2 |
| APPLICATION NO. | : 14/162871 |
| DATED | : November 15, 2016 |
| INVENTOR(S) | : Tanaka et al. |

It is certified that error appears in the above-identified patent and that said Letters Patent is hereby corrected as shown below:

In the Claims

In Claim 10, at Column 58, Line 25, "being neighboring block" should read --being a neighboring block--.

Signed and Sealed this
Twenty-first Day of March, 2017

Michelle K. Lee
*Director of the United States Patent and Trademark Office*